(12) United States Patent
Nakaya

(10) Patent No.: US 6,469,540 B2
(45) Date of Patent: Oct. 22, 2002

(54) RECONFIGURABLE DEVICE HAVING PROGRAMMABLE INTERCONNECT NETWORK SUITABLE FOR IMPLEMENTING DATA PATHS

(75) Inventor: Shogo Nakaya, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/880,018

(22) Filed: Jun. 14, 2001

(65) Prior Publication Data

US 2001/0052793 A1 Dec. 20, 2001

(30) Foreign Application Priority Data

Jun. 15, 2000 (JP) ........................................ 2000-184598

(51) Int. Cl.[7] .............................................. H03K 19/177
(52) U.S. Cl. ........................................... 326/41; 326/38
(58) Field of Search ..................................... 326/38–41

(56) References Cited

U.S. PATENT DOCUMENTS

| | | | |
|---|---|---|---|
| 5,218,240 A | | 6/1993 | Camarota et al. |
| 5,469,003 A | | 11/1995 | Kean |
| 5,592,106 A | | 1/1997 | Leong et al. |
| 5,631,578 A | | 5/1997 | Clinton et al. |
| 6,084,429 A | * | 7/2000 | Trimberger .................. 326/41 |
| 6,094,066 A | * | 7/2000 | Mavis ......................... 326/41 |
| 6,268,743 B1 | * | 7/2001 | Kaptanoglu .................. 326/40 |

FOREIGN PATENT DOCUMENTS

JP 11-353152 12/1999

OTHER PUBLICATIONS

AT&T Field–Programmable Gate Arrays Data Book, AT&T Microelectronics, Apr. 1995, pp. 2–15 to 2–22.

* cited by examiner

Primary Examiner—Michael Tokar
Assistant Examiner—Vibol Tan
(74) Attorney, Agent, or Firm—Sughrue Mion, PLLC

(57) ABSTRACT

A reconfigurable device includes a plurality of function cells and a programmable interconnect network which programmably connects the function cells. The programmable interconnect network includes horizontal programmable interconnect ways and vertical programmable interconnect ways. Each horizontal programmable interconnect way includes a short horizontal programmable interconnect channel and a long horizontal programmable interconnect channel, and each vertical programmable interconnect way includes a short vertical programmable interconnect channel and a long vertical programmable interconnect channel. In the horizontal programmable interconnect way, both the short horizontal programmable interconnect channel and the long horizontal programmable interconnect channel are constructed to have "shift structure", thereby "sector segmentation" and problems related to the sector segmentation are avoided. The function cells are directly connected to the short horizontal programmable interconnect channel, but are not directly connected to the long horizontal programmable interconnect channel, therefore, signal transfer of input/output signals between the function cell and the long horizontal programmable interconnect channel is conducted necessarily through the short horizontal programmable interconnect channel and a programmable switch, thereby load capacitance on the long horizontal programmable interconnect channel is reduced and thereby high-speed signal transfer is realized.

32 Claims, 26 Drawing Sheets

F I G. 25
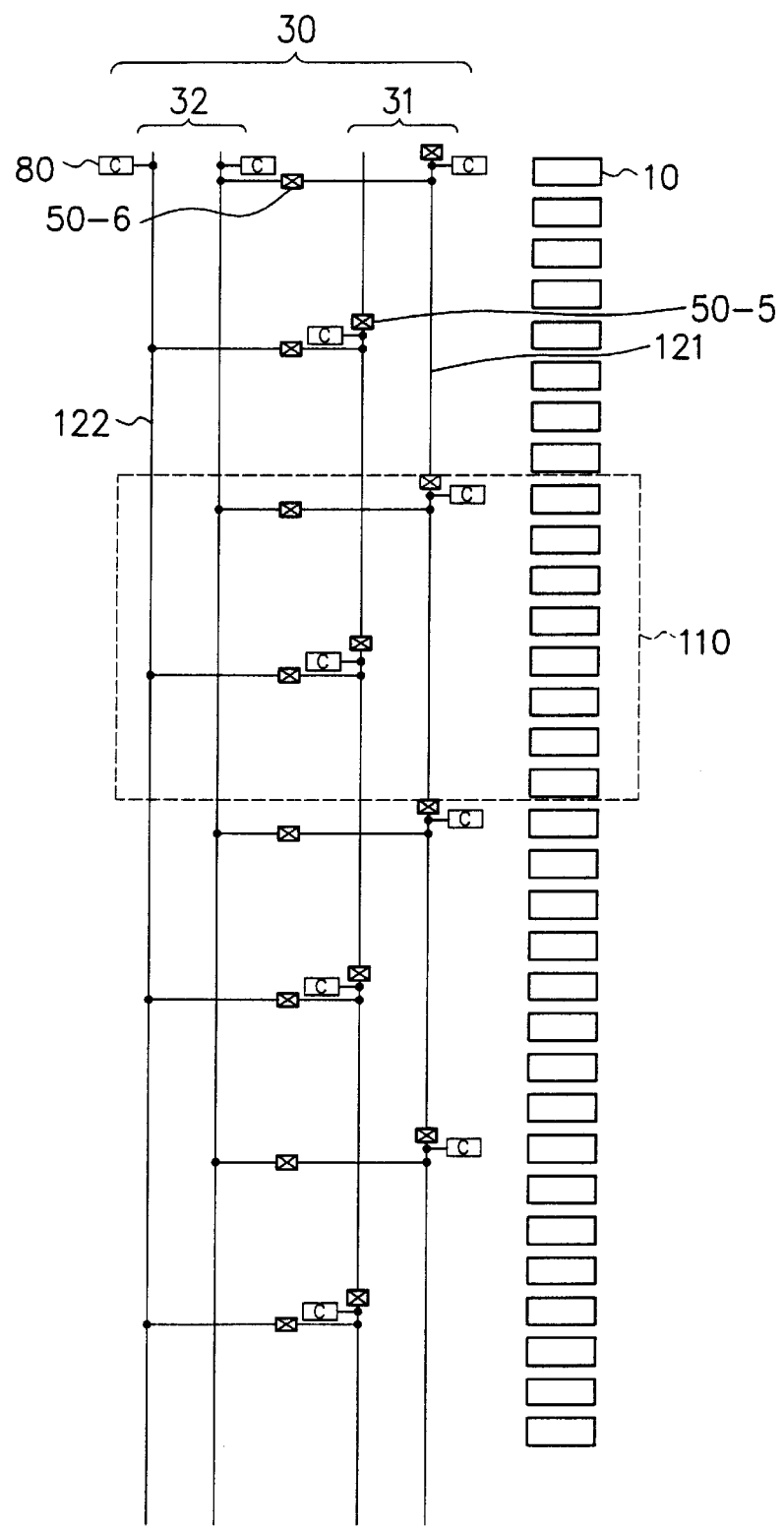

F I G. 26
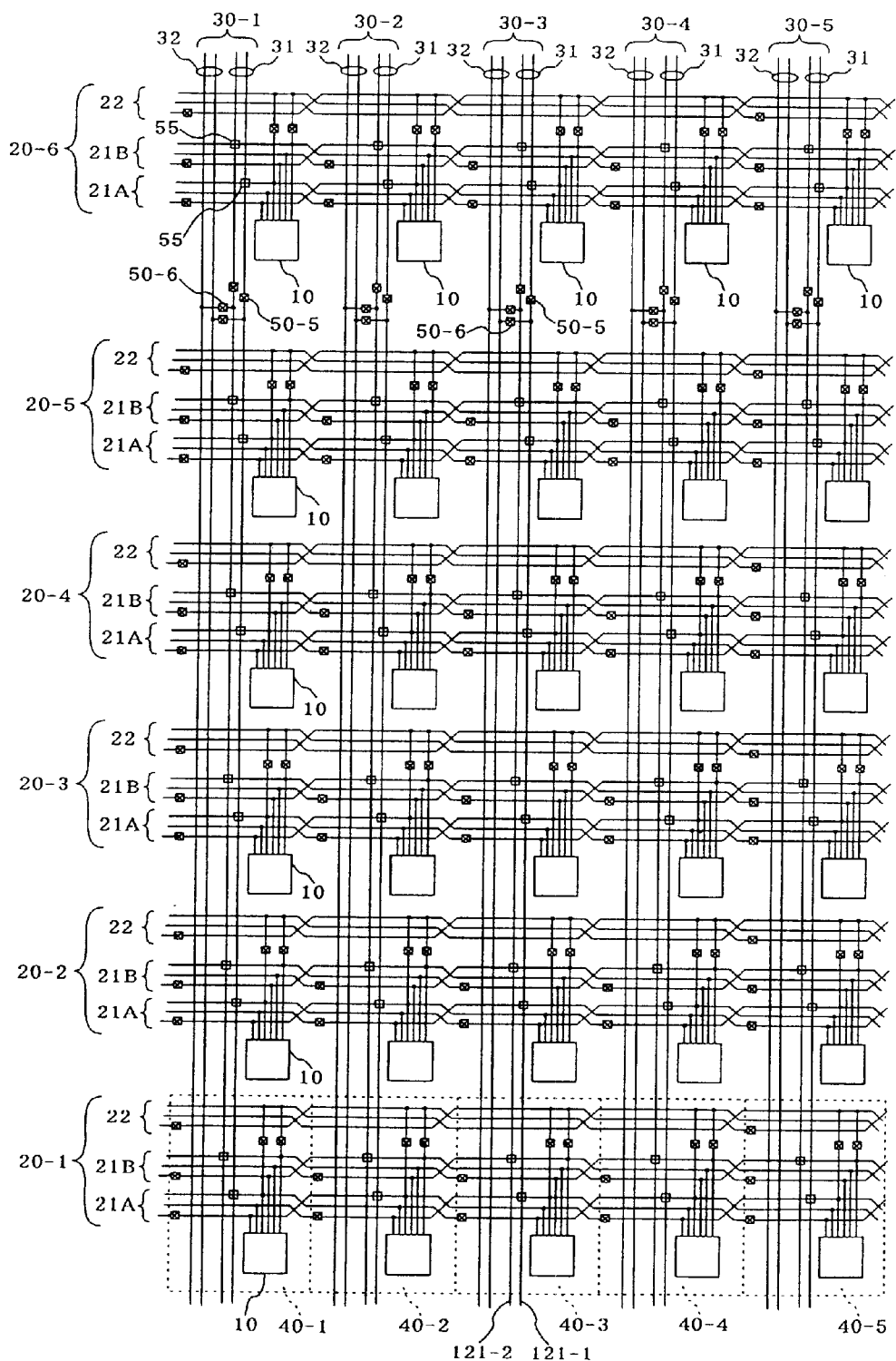

RECONFIGURABLE DEVICE HAVING PROGRAMMABLE INTERCONNECT NETWORK SUITABLE FOR IMPLEMENTING DATA PATHS

BACKGROUND OF THE INVENTION

The present invention relates to reconfigurable devices capable of implementing various functions programmably, and in particular, to programmable interconnect networks as major part of the reconfigurable devices.

DESCRIPTION OF THE RELATED ART

Reconfigurable devices such as PLD (Programmable Logic Device), FPGA (Field Programmable Gate Array), etc. which are capable of implementing various functions programmably are progressing remarkably in recent years. Such reconfigurable devices have been used for emulation in the designing of ASICs (Application Specific Integrated Circuits), as replacements for simple peripheral circuits, etc. However, by the technological innovation of these days, the reconfigurable device is now being expected to realize a "reconfigurable computers", whose hardware architecture can be reconfigured to be adapted for each application.

In general, the reconfigurable device is composed of a two-dimensional array of function cells (to each of which various logical functions can be set programmably) and a programmable interconnect network which programmably connects the function cells and the other various circuits on the device (for example, I/O circuits, memory, etc.).

For the purpose of efficient interconnection between the function cells and the other various circuits on the device, a variety of programmable interconnect networks having hierarchical structure including lines of various lengths have been devised.

[Prior Art #1]

FIG. 1 is a circuit diagram showing an example of a conventional programmable interconnect network having such a hierarchical structure (hereafter, referred to as "prior art #1") FIG. 1 shows part (a row) of a two-dimensional function cell array and part of the programmable interconnect network corresponding to the row. The programmable interconnect network of the prior art #1 includes a plurality of programmable interconnect ways 20 corresponding to the rows of the two-dimensional function cell array, however, only one programmable interconnect way 20 is shown in FIG. 1. The programmable interconnect way 20 shown in FIG. 1 includes a short programmable interconnect channel 21 which is composed of short lines and a long programmable interconnect channel 22 which is composed of long lines. The short programmable interconnect channel 21 is segmented by programmable switches 58-1 and 58-2 into short sectors 65-1, and the long programmable interconnect channel 22 is segmented by the programmable switches 58-2 into long sectors 65-2.

Each programmable switch (58-1, 58-2) is a circuit for programmably connecting/disconnecting the connection between lines which are connected thereto. Such a programmable switch (58-1, 58-2) is capable of programmably connecting/disconnecting axially aligned and adjacent lines (such as the lines 62-1 and 62-2) or lines running in different channels (such as the lines 61-1 and 62-1).

In such interconnect line structure which is segmented into sectors (short sectors 65-1, long sectors 65-2), a signal to be transferred across multiple sectors has to pass through a lot of programmable switches (58-1, 58-2). Such signal transfer across multiple sectors tends to introduce large delay in comparison with signal transfer in a sector. Further, such signal transfer delay is enhanced if the sizes of macro blocks which are implemented on the chip do not match the sector structure.

Especially when a circuit such as a "data path" (in which signals are successively transferred across nearby macro blocks and thereby a massive amount of conplicated data processing is performed consequently) is implemented on a sector type interconnect line structure such as the one shown in FIG. 1, some inter-macro-block connections are necessitated to pass through sector boundaries and thereby the aforementioned delay is caused.

Further, when a large-scale circuit is implemented on such a sector type interconnect line structure, a signal has to pass through many sector boundaries whether it is in a macro block or across macro blocks. For such reasons, high performance can not be attained in the sector type interconnect line structure.

Incidentally, the prior art #1 of FIG. 1 is only a simple example for clearly showing the essence of the problems of conventional programmable interconnect networks. Therefore, the number of lines, the sizes of sectors, the number of programmable interconnect channels, etc. shown in FIG. 1 are not essential. A typical programmable interconnect network corresponding to the prior art #1 has been disclosed in U.S. Pat. No. 5,469,003.

[Prior Art #2]

Another sector type interconnect line structure has been disclosed in U.S. Pat. No. 5,218,240 (hereafter, referred to as "prior art #2"). In the prior art #2, the short sectors 65-1 and the long sectors 65-2 which have been shown in FIG. 1 are configured as common sectors. However, the function cells 10 in the prior art #2 are not connected to the long programmable interconnect channels 22 (referred to as "express buses" in the prior art #2) and are connected to the short programmable interconnect channels 21 (referred to as "local buses" in the prior art #2) only.

Therefore, the long programmable interconnect channel 22 in the prior art #2 is designed to make access to a function cell 10 through a programmable switch 58-2 and a short programmable interconnect channel 21. By such composition, the load capacitance of the long programmable interconnect channel 22 is reduced and thereby high-speed signal transfer is realized.

However, in the interconnect line structure of the prior art #2, the interconnect network is totally segmented into sectors, without additional long interconnect line resources. Therefore, the demerits of the sector segmentation can not be compensated for at all, differently from the prior art #1 of FIG. 1 in which the demerits could be partially compensated for by use of the long sector 65-2 which bypasses the boundaries of short sectors 65-1.

[Prior Art #3]

Next, problems concerning the connection between the programmable interconnect network and the function cells 10 will be explained. FIG. 2 is a circuit diagram showing a conventional connection method (hereafter, referred to as "prior art #3") for connecting a hierarchical programmable interconnect network (not limited to sector type network) and function cells 10. Such a connection method has been disclosed in AT&T Field-Programmable Gate Arrays Data Book (April 1995). The programmable interconnect network of the prior art #3 includes a plurality of horizontal programmable interconnect ways 20 which extend in the horizontal direction and a plurality of vertical programmable interconnect ways 30 which extend in the vertical direction.

Incidentally, a horizontal programmable interconnect way 20 and a vertical programmable interconnect way 30 corresponding to a function cell 10 are shown in FIG. 2 for the sake of simplicity.

The horizontal programmable interconnect way 20 show in FIG. 2 at least includes a short horizontal programmable interconnect channel 21 and a long horizontal programmable interconnect channel 22, and the vertical programmable interconnect way 30 at least includes a short vertical programmable interconnect channel 31 and a long vertical programmable interconnect channel 32.

At the intersection 59 of the horizontal programmable interconnect way 20 and the vertical programmable interconnect way 30, an intersection programmable switch 55 is provided so as to programmably connect/disconnect the connections between the intersecting lines.

The function cell 10 shown in FIG. 2 includes an input selection switch 11, a function block 13 and an output selection switch 15. The function block 13 is provided with two or more functions and a function is programmably selected from the functions and set to the function block 13. The input selection switch 11 selects one or more signals from signals supplied from lines of the programmable interconnect network and supplies the selected signals to the function block 13 as input signals 12. The function block 13 generates an output signal 14 from the input signals 12 according to the function which has been set thereto and outputs the output signal 14 to the output selection switch 15. The output selection switch 15 outputs the output signal 14 to zero or more of the lines of the programmable interconnect network selectively.

In the prior art #3, a function cell 10 is directly connected to all the lines of the horizontal programmable interconnect way 20 and the vertical programmable interconnect way 30 associated with the function cell 10. Such structure seems to be capable of transferring signals faster than other structure employing indirect connections by use of other lines.

However, in such structure employing direct connection, each line has connections with all the function cells 10 through which the line passes, thereby large load capacitance is added to the line. Especially in long lines, the load capacitance becomes very large and thereby signal transfer is delayed much.

Further, if a large number of interconnect line resources are prepared in the programmable interconnect network for securing routability, the sizes of an input selection switch 11 (for selecting an input signal from signals supplied from the large number of lines) and an output selection switch 15 (for selecting output signals to be outputted to the large number of lines) of the function cell 10 (see FIG. 2) are necessitated to be very large and thereby serious penalty is caused both in size (area of circuit) and delay.

While the intersection programmable switches 55 in the prior art #3 of FIG. 2 are provided to limited intersection points in the intersection 59 of the horizontal programmable interconnect way 20 and the vertical programmable interconnect way 30, actually, the programmable switches 55 are generally provided to more intersection points and programmable switches between parallel lines might be provided in order to improve the routability. Therefore, many factors exists behind the increase of size (area of circuit) and delay.

On the other hand, if the number of lines connected to the function cell 10 is decreased in order to reduce the load capacitance of lines of the programmable interconnect network as a factor of increase of size and delay, accessibility of the function cell 10 to all the lines (or most lines) of the programmable interconnect network is lost.

The above direct connection method which directly connects every two points (between which connection is necessary) by use of switches involves serious problems as explained above. Incidentally, while the input selection switch 11 and the output selection switch 15 in FIG. 2 are drawn in the function cell 10 for the sake of simplicity, the essence of the above problems does not change even if the input selection switch 11 and/or the output selection switch 15 are provided outside the function cell 10 (in the areas 19 shown in FIG. 2, for example). Incidentally, the composition shown in FIG. 2 is only an example for clearly showing the essence of the above problems, therefore, the number of lines, switches, programmable interconnect channels, etc. shown in FIG. 2 are of course not essential. Further, while the horizontal programmable interconnect way 20 and the vertical programmable interconnect way 30 which are connected to the function cell 10 were placed above the function cell 10 and on the left-hand side of the function cell 10 in FIG. 2 respectively, the essence of the above problems does not change even if horizontal programmable interconnect ways 20 are provided above and below the function cell 10 and vertical programmable interconnect ways 30 are provided on both sides of the function cell 10 so as to be connected thereto as disclosed in AT&T Field-Programmable Gate Arrays Data Book (April 1995).

[Prior Art #4]

In order to resolve the above problems related to the sector segmentation and the direct connection method, an interconnect line structure shown in FIG. 3 has been proposed in U.S. Pat. No. 5,631,578 (hereafter, referred to as "prior art #4"). In the structure of FIG. 3, the sector type interconnect line structure of the Prior Art #2 (U.S. Pat. No. 5,218,240) has been improved.

The interconnect line structure shown in FIG. 3 includes a pair of programmable interconnect ways 20-1 and 20-2 which run in parallel. The first programmable interconnect way 20-1 includes a first local bus 23-1, a first express bus 24-1 and a first super bus 25-1. The second programmable interconnect way 20-2 includes a second local bus 23-2, a second express bus 24-2 and a second super bus 25-2.

Lines in the local bus (23-1, 23-2) are connected in series by first programmable switches 58-1 and second programmable switches 58-2, and each of the lines is also directly connected to a function cell 10.

Lines in the express bus (24-1, 24-2) are connected in series by first programmable switches 58-1, and each of the lines is also connected to a corresponding local bus (23-1, 23-2) by a first programmable switch 58-1.

The super bus (25-1, 25-2) is connected to lines of a corresponding local bus (23-1, 23-2) by second programmable switches 58-2, however, the super bus (25-1, 25-2) is not segmented by the second programmable switches 58-2. The express buses 24-1 and 24-2 and the super buses 25-1 and 25-2 are not directly connected to function cells 10.

The first programmable switches 58-1 and the second programmable switches 58-2 are placed alternately for segmenting and connecting the local bus (23-1, 23-2), in which horizontal positions of the two types of programmable switches 58-1 and 58-2 are switched between the first programmable interconnect way 20-1 and the second programmable interconnect way 20-2.

In such composition, the first express bus 24-1 and the second express bus 24-2 are placed so as to have their first programmable switches 58-1 at different horizontal positions, thereby a seamless line of an express bus (24-1, 24-2) is secured at any horizontal position.

Further, the express buses 24-1 and 24-2 and the super buses 25-1 and 25-2 do not have direct connections with the function cells 10, thereby load capacitance of the buses can be reduced and thereby high-speed signal transfer is made possible.

Each express/super bus (24-1, 24-2, 25-1, 25-2) is designed to make access to the function cells 10 through a programmable switch (58-1, 58-2) which is connected thereto and a local bus (23-1, 23-2).

The above technology of the prior art #4 partially relieves the problems of the sector segmentation (sector type interconnect line structure), however, the problems are not essentially resolved since the local buses 23-1 and 23-2 are still totally segmented into sectors. Usage frequency of short lines is generally higher than that of long lines, therefore, the problems related to the sector segmentation also occurs more frequently in short lines.

Especially when the aforementioned data path etc. (in which signals are successively transferred across nearby macro blocks and thereby a massive amount of complicated data processing is conducted) is implemented on such a sector type interconnect line structure, the problems of the sector segmentation occur frequently.

Therefore, the interconnect line structure of FIG. 3 is insufficient for resolving the problems caused by the sector segmentation. Incidentally, while other interconnect line resources are also shown in U.S. Pat. No. 5,631,578, essential part necessary for the explanation of the essence of problems has been shown here.

Further, in the prior art #4, interconnect line structure in the horizontal direction and that in the vertical direction are designed in the same way. Such an isotropic interconnect line structure seems to be advantageous from the viewpoint of the implementation of various circuits (which is the purpose of the reconfigurable device).

However, in a large-scale application circuit, most part of the circuit is usually occupied by data paths for successively processing multiple-bit data. Such a tendency is prominent in the field of reconfigurable computers which are expected to create a big market.

In such a multiple-bit data path, demand for signal transfer in the bit string direction or bit direction (i.e. the vertical direction in which the carry signal is transferred) is much lower than that in the data direction (horizontal direction), therefore, the aforementioned isotropic interconnect line structure causes a lot of waste when such multiple-bit data paths are implemented on the reconfigurable device.

[Prior Art #5]

Meanwhile, another interconnect line structure has been disclosed in U.S. Pat. No. 5,592,106 (hereafter, referred to as "prior art #5") in order to cope with the problems related to the sector segmentation and the direct connection method. FIG. 4 is a circuit diagram showing the interconnect line structure of the prior art #5.

In the interconnect line structure of FIG. 4, a horizontal programmable interconnect way 20 includes a local feedback channel 26, an intermediate channel 27, a half-length channel 28 and a global channel 29. The local feedback channel 26 and the intermediate channel 27 are provided to the horizontal programmable interconnect way 20 as a short-range network, and the global channel 29 and the half-length channel 28 are provided as a long-range network.

The global channel 29 is composed of lines whose lengths are the same as the total width of the two-dimensional function cell array, and the half-length channel 28 is composed of lines of half the length. The length of each line of the intermediate channel 27 is almost the same as that of the local feedback channel 26. Each long-range input selection switch 11-2 selects a signal from signals supplied from the long-range network (global channel 29, half-length channel 28) and supplies the selected signal to a corresponding line of the intermediate channel 27. Meanwhile, each short-range input selection switch 11-1 selects a signal from signals supplied from the short-range network (intermediate channel 27, local feedback channel 26) and supplies the selected signal to the input terminal 12 of the function block 13 of a corresponding function cell 10.

The output terminal 14 of the function block 13 of each function cell 10 is connected to a corresponding line of the local feedback channel 26 directly (through no programmable switch). The output terminal 14 is also selectively connected to the long-range network through an output selection switch 15.

The short-range input selection switch 11-1 and the long-range input selection switch 11-2 do not segment (disconnect) lines which are connected thereto.

In this prior art, there is no programmable switch between axially aligned and adjacent lines. Therefore, those lines are not connectable to one another.

The interconnect line structure of the prior art #5 has characteristic "shift structure". The horizontal positions of the lines of the intermediate channel 27 and the local feedback channel 26 are successively shifted with a shift width that is the same as the interval between function cells 10. In the short-range network having such shift structure, one or more seamless lines are secured at any horizontal position (even at a horizontal position where a line gap exists), therefore, the short-range network is not totally segmented into sectors. Further, the long-range network, which is not connected to the input terminals 12 of the function blocks 13 of the function cells 10 directly, is connected to the input terminals 12 through the intermediate channel 27.

In such structure, enough accessibility of the long-range network to the function cell 10 can be attained by only slight connection of each long-range input selection switch 11-2 to small part of the long-range network. Therefore, load capacitance of the long-range input selection switches 11-2 that is added to each line of the long-range network can be reduced by such structure.

However, in the interconnect line structure of the prior art #5, the half-length channel 28 is still totally segmented into sectors. Further, output terminals of the function cells 10 are connected to the long-range network directly (not through other channels). In such composition, the number of function cells 10 that are connected to a line of the long-range network has to be reduced to small in order to avoid the increase of the load capacitance due to the output of the function cells 10. Therefore, when the number of function cells 10 is set larger, the number of lines of the long-range network (long lines) is necessitated to be increased much.

However, usage frequency of long lines are generally lower than that of short lines, and thus the above structure involves a lot of waste. On the other hand, if the number of long lines of the long-range network is reduced, the number of function cells 10 connected to each long line increases, thereby the load capacitance increases and thereby long delay is caused.

Further, although not shown in FIG. 4, the prior art #5 employs anisotropic interconnect line structure in which interconnect line structure in the horizontal direction is different from that in the vertical direction. Concretely, only a global channel 29 is provided to the vertical programmable interconnect way 30, and the output terminals of the function cells 10 are directly connected to the global channel 29. However, in such composition, load capacitance on each line of the global channel 29 is necessitated to be large and thereby signal transfer speed is necessitated to be lowered.

Further, in the prior art #5, each line of the local feedback channel 26 is directly connected to the output terminal of only one function cell 10, therefore, a larger number of lines becomes necessary in the local feedback channel 26 in comparison with cases where a line of the local feedback channel 26 is shared by two or more function cells 10. The increase of the number of lines of the local feedback channel 26 causes not only an increase of circuit area of the local feedback channel 26 but also an increase of chip sizes (circuit scales) of the short-range input selection switches 11-1.

Incidentally, the structure which has been shown in FIG. 4 is only an example for clearly showing the essence of the problems, and thus interconnect line structures disclosed in the prior art #5 (U.S. Pat. No. 5,592,106) are of course not limited to the structure FIG. 4. The number of lines, switches, line lengths, etc. which have been shown in FIG. 4 as an example are of course not essential.

As described above, the conventional programmable interconnect networks of reconfigurable devices involve the following problems or drawbacks.

First, large-scale application circuits can not display their original high performance when implemented on conventional reconfigurable devices (programmable interconnect networks) having the sector type interconnect line structure. Due to the sector type interconnect line structure, restriction arises on the sizes of macro blocks of the large-scale application circuit, thereby the derivation of high performance from the large-scale application circuit becomes difficult. Further, in inter-macro-block signal transfer, signals have to pass through a large number of sector boundaries and thereby signal delay is necessitated to be large.

Second, the area on the chip that is occupied by switches (programmable switches, intersection programmable switches, input/output selection switches, etc.) is necessitated to be large. Direct connections by use of such switches are provided between the programmable interconnect network and the function cells 10 and between parts of the programmable interconnect network requiring connections, thereby a large number of switches are required and thereby circuit area occupied by the switches becomes large. Further, large load capacitance due to the many switches is added to each line, thereby long delay is caused in inter-macro-block signal transfer.

Third, conventional programmable interconnect networks tend to involve a lot of waste when a multiple-bit data processing circuit is implemented thereon, since isotropic interconnect line structure is necessitated to include a large number of unnecessary interconnect line resources in a direction of lower demand (bit direction).

Fourth, the number of necessary lines tends to increase as the line length becomes longer, since the outputs of the function cells 10 are directly supplied to long lines. Usage frequency of long lines is generally lower than that of short lines, therefore such composition involves a lot of waste.

SUMMARY OF THE INVENTION

It is therefore the primary object of the present invention to provide a reconfigurable device having a programmable interconnect network, in which enough routability is secured by use of small numbers of switches and lines.

Another object of the present invention is to provide a reconfigurable device having a programmable interconnect network, by which multiple-bit data paths can be implemented efficiently.

Another object of the present invention is to provide a reconfigurable device having a programmable interconnect network which is suitable for the implementation of high-speed data paths.

In accordance with a first aspect of the present invention, there is provided a reconfigurable device which is constructed as an integrated circuit including a plurality of function cells and a programmable interconnect network which programmably connects the function cells. The integrated circuit is constructed as a two-dimensional array of tiles which extends in a horizontal direction and a vertical direction. Each tile includes one of the function cells and part of the programmable interconnect network in the vicinity of the function cell. Each function cell includes: a function block having first input terminals, one or more first output terminals, and functions from which a function is programmably selected and set thereto, for generating an output signal from signals supplied to the first input terminals according to the function which has been set thereto and outputting the generated output signal from the one or more first output terminals; input selection switches each of which has second input terminals and a second output terminal, for programmably setting one of the second input terminals to be connected to the second output terminal; an output selection switch having a third input terminal and third output terminals, for programmably setting each of the third output terminals to be connected to the third input terminal or to be in high impedance status; and input/output lines which are connected to the second input terminals of the input selection switches and the third output terminals of the output selection switch. Each first input terminal of the function block is connected to the second output terminal of corresponding one of the input selection switches, and the third input terminal of the output selection switch is connected to the first output terminal of the function block. The programmable interconnect network includes horizontal programmable interconnect ways each of which runs in the horizontal direction in each row of the two-dimensional array respectively. The horizontal programmable interconnect way includes a short horizontal programmable interconnect channel and a long horizontal programmable interconnect channel. The short horizontal programmable interconnect channel includes M short horizontal lanes (M: natural number) each of which includes short horizontal programmable switches which are provided to every M tiles aligned in the horizontal direction and short horizontal interconnect line segments as seamless lines connecting adjacent short horizontal programmable switches. The horizontal positions of tiles containing the short horizontal programmable switches of each short horizontal lane of the short horizontal programmable interconnect channel are successively shifted between adjacent short horizontal lanes by 1 tile width. The long horizontal programmable interconnect channel includes M long horizontal lanes each of which includes long horizontal programmable switches which are provided to every N tiles (N: natural number) aligned in the horizontal direction and long horizontal interconnect line segments as seamless lines connecting adjacent long horizontal programmable switches. The horizontal positions of tiles containing the long horizontal programmable switches of each long horizontal lane of the long horizontal programmable interconnect channel are successively shifted between adjacent long horizontal lanes by P tile widths (P: natural number≧4, P=N/M). Each short horizontal interconnect line segment is connected to one of the long horizontal interconnect line segments through an inter-horizontal-channel programmable switch which is provided to each tile. Long horizontal interconnect line segments to which the inter-horizontal-channel programmable switches of arbitrary M contiguous tiles aligned in the horizontal direction are connected belong to different long horizontal lanes. Each input/output line of the function cell is directly connected to corresponding one of the short horizontal interconnect line segments running in the tile containing the function cell. Each of the programmable switches programmably connects/disconnects the connection between the line segments that are connected thereto.

In accordance with a second aspect of the present invention, in the first aspect, each column of the two-dimensional array is divided into ALUs (Arithmetic and Logic Units) each of which is composed of U contiguous tiles (U: natural number) of the column. The function cells contained in the ALU at least share an input signal that is inputted to an input selection switch or configuration data designating the functions of the function block and the input selection switch. The programmable interconnect network further includes vertical programmable interconnect ways each of which runs in the vertical direction in each column of the two-dimensional array respectively. The vertical programmable interconnect way includes a short vertical programmable interconnect channel and a long vertical programmable interconnect channel. The short vertical programmable interconnect channel includes W short vertical lanes (W: natural number<M) each of which includes short vertical programmable switches which are provided to every V tiles (V: integral multiple of U) aligned in the vertical direction and short vertical interconnect line segments as seamless lines connecting adjacent short vertical programmable switches. At least one of the W short horizontal lanes of the short vertical programmable interconnect channel is composed of short vertical interconnect line segments each of which seamlessly stretches from the uppermost tile to the lowermost tile of an ALU. The long vertical programmable interconnect channel includes L long vertical lanes (L: natural number $\leq$ W) each of which is composed of long vertical interconnect line segments whose lengths are at least 4 times as long as the short vertical interconnect line segment. Each short vertical interconnect line segment is connected to one of the long vertical interconnect line segment through an inter-vertical-channel programmable switch. Each short vertical interconnect line segment is connected to one of the short horizontal interconnect line segments intersecting the short vertical interconnect line segment in each row of the two-dimensional array through an intersection programmable switch.

In accordance with a third aspect of the present invention, in the first aspect, the natural numbers M and P are set to be relatively prime.

In accordance with a fourth aspect of the present invention, in the second aspect, the natural numbers M and P are set to be relatively prime.

In accordance with a fifth aspect of the present invention, there is provided a reconfigurable device which is constructed as an integrated circuit including a plurality of function cells and a programmable interconnect network which programmably connects the function cells. The integrated circuit is constructed as a two-dimensional array of tiles which extends in a horizontal direction and a vertical direction. Each tile includes one of the function cells and part of the programmable interconnect network in the vicinity of the function cell. Each function cell includes: a function block having first input terminals, one or more first output terminals, and functions from which a function is programmably selected and set thereto, for generating an output signal from signals supplied to the first input terminals according to the function which has been set thereto and outputting the generated output signal from the one or more first output terminals; input selection switches each of which has second input terminals and a second output terminal, for programmably setting one of the second input terminals to be connected to the second output terminal; an output selection switch having a third input terminal and third output terminals, for programmably setting each of the third output terminals to be connected to the third input terminal or to be in high impedance status; and input/output lines which are connected to the second input terminals of the input selection switches and the third output terminals of the output selection switch. Each first input terminal of the function block is connected to the second output terminal of corresponding one of the input selection switches, and the third input terminal of the output selection switch is connected to the first output terminal of the function block. The programmable interconnect network has two or more parallelly running horizontal programmable interconnect ways in each row of the two-dimensional array. Each of the horizontal programmable interconnect ways includes a short horizontal programmable interconnect channel and a long horizontal programmable interconnect channel. The short horizontal programmable interconnect channel includes M short horizontal lanes (M: natural number) each of which includes short horizontal programmable switches which are provided to every M tiles aligned in the horizontal direction and short horizontal interconnect line segments as seamless lines connecting adjacent short horizontal programmable switches. The horizontal positions of tiles containing the short horizontal programmable switches of each short horizontal lane of the short horizontal programmable interconnect channel are successively shifted between adjacent short horizontal lanes by 1 tile width. The long horizontal programmable interconnect channel includes M long horizontal lanes each of which includes long horizontal programmable switches which are provided to every N tiles (N: natural number) aligned in the horizontal direction and long horizontal interconnect line segments as seamless lines connecting adjacent long horizontal programmable switches. The horizontal positions of tiles containing the long horizontal programmable switches of each long horizontal lane of the long horizontal programmable interconnect channel are successively shifted between adjacent long horizontal lanes by P tile widths (P: natural number $\geq$ 4, P=N/M). In each horizontal programmable interconnect way, each short horizontal interconnect line segment is connected to one of the long horizontal interconnect line segments of the horizontal programmable interconnect way through an inter-horizontal-channel programmable switch which is provided to each tile, and long horizontal interconnect line segments to which the inter-horizontal-channel programmable switches of arbitrary M contiguous tiles aligned in the horizontal direction are connected belong to different long horizontal lanes. Each input/output line of the function cell is directly connected to corresponding one of the short horizontal interconnect line segments running in the tile containing the function cell. Each of the programmable switches programmably connects/disconnects the connection between the line segments that are connected thereto.

In accordance with a sixth aspect of the present invention, in the fifth aspect, each column of the two-dimensional array is divided into ALUs (Arithmetic and Logic Units) each of which is composed of U contiguous tiles (U: natural number) of the column. The function cells contained in the ALU at least share an input signal that is inputted to an input selection switch or configuration data designating the functions of the function block and the input selection switch. The programmable interconnect network further includes vertical programmable interconnect ways each of which runs in the vertical direction in each column of the two-dimensional array respectively. The vertical programmable interconnect way includes a short vertical programmable interconnect channel and a long vertical programmable interconnect channel. The short vertical programmable interconnect channel includes W short vertical lanes (W: natural number<M) each of which includes short vertical programmable switches which are provided to every V tiles (V: integral multiple of U) aligned in the vertical direction and short vertical interconnect line segments as seamless lines connecting adjacent short vertical programmable switches. At least one of the W short horizontal lanes of the short vertical programmable interconnect channel is composed of short vertical interconnect line segments each of which seamlessly stretches from the uppermost tile to the lowermost tile of an ALU. The long vertical programmable interconnect channel includes L long vertical lanes (L: natural number $\leq$W) each of which is composed of long vertical interconnect line segments whose lengths are at least 4 times as long as the short vertical interconnect line segment. Each short vertical interconnect line segment is connected to one of the long vertical interconnect line segment through an inter-vertical-channel programmable switch. Each short vertical interconnect line segment is connected to one of the short horizontal interconnect line segments intersecting the short vertical interconnect line segment in each row of the two-dimensional array through an intersection programmable switch. Intersection programmable switches that are contained in the same tile is connected to different short horizontal interconnect line segments.

In accordance with a seventh aspect of the present invention, in the fifth aspect, the natural numbers M and P are set to be relatively prime.

In accordance with an eighth aspect of the present invention, in the sixth aspect, the natural numbers M and P are set to be relatively prime.

In accordance with a ninth aspect of the present invention, in the fifth aspect, the horizontal positions of the long horizontal programmable switches in each horizontal programmable interconnect way are shifted between at least two of the two or more horizontal programmable interconnect ways parallelly running in each row of the two-dimensional array by a tile width or more.

In accordance with a tenth aspect of the present invention, in the sixth aspect, the horizontal positions of the long horizontal programmable switches in each horizontal programmable interconnect Away are shifted between at least two of the two or more horizontal programmable interconnect ways parallelly running in each row of the two-dimensional array by a tile width or more.

In accordance with an eleventh aspect of the present invention, in the ninth aspect, the natural numbers M and P are set to be relatively prime.

In accordance with a twelfth aspect of the present invention, in the tenth aspect, the natural numbers M and P are set to be relatively prime.

In accordance with a thirteenth aspect of the present invention, in the fifth aspect, the horizontal positions of the long horizontal programmable switches in each horizontal programmable interconnect way are successively shifted between adjacent ones of the two or more horizontal programmable interconnect ways parallelly running in each row of the two-dimensional array by a tile width or more.

In accordance with a fourteenth aspect of the present invention, in the sixth aspect, the horizontal positions of the long horizontal programmable switches in each horizontal programmable interconnect way are successively shifted between adjacent ones of the two or more horizontal programmable interconnect ways parallelly running in each row of the two-dimensional array by a tile width or more.

In accordance with a fifteenth aspect of the present invention, in the thirteenth aspect, the natural numbers M and P are set to be relatively prime.

In accordance with a sixteenth aspect of the present invention, in the fourteenth aspect, the natural numbers M and P are set to be relatively prime.

In accordance with a seventeenth aspect of the present invention, there is provided a reconfigurable device which is constructed as an integrated circuit including a plurality of function cells and a programmable interconnect network which programmably connects the function cells. The integrated circuit is constructed as a two-dimensional array of tiles which extends in a horizontal direction and a vertical direction. Each tile includes one of the function cells and part of the programmable interconnect network in the vicinity of the function cell. Each function cell includes: a function block having first input terminals, one or more first output terminals, and functions from which a function is programmably selected and set thereto, for generating an output signal from signals supplied to the first input terminals according to the function which has been set thereto and outputting the generated output signal from the one or more first output terminals; input selection switches each of which has second input terminals and a second output terminal, for programmably setting one of the second input terminals to be connected to the second output terminal; an output selection switch having a third input terminal and third output terminals, for programmably setting each of the third output terminals to be connected to the third input terminal or to be in high impedance status; and input/output lines which are connected to the second input terminals of the input selection switches and the third output terminals of the output selection switch. Each first input terminal of the function block is connected to the second output terminal of corresponding one of the input selection switches, and the third input terminal of the output selection switch is connected to the first output terminal of the function block. The programmable interconnect network has two or more parallelly running horizontal programmable interconnect ways in each row of the two-dimensional array. Each of the horizontal programmable interconnect ways includes a short horizontal programmable interconnect channel, and each of part of the horizontal programmable interconnect ways further includes a long horizontal programmable interconnect channel. The short horizontal programmable interconnect channel includes M short horizontal lanes (M: natural number) each of which includes short horizontal programmable switches which are provided to every M tiles aligned in the horizontal direction and short horizontal interconnect line segments as seamless lines connecting adjacent short horizontal programmable switches. The horizontal positions of tiles containing the short horizontal programmable switches of each short horizontal lane of the short horizontal programmable interconnect channel are successively shifted between adjacent short horizontal lanes by 1 tile width. The long horizontal programmable interconnect channel includes M long horizontal lanes each of which includes long horizontal programmable switches which are provided to every N tiles (N: natural number) aligned in the horizontal direction and long horizontal interconnect line segments as seamless lines connecting adjacent long horizontal programmable switches. The horizontal positions of tiles containing the long horizontal programmable switches of each long horizontal lane of the long horizontal programmable interconnect channel are successively shifted between adjacent long horizontal lanes by P tile widths (P: natural number$\geq 4$, P=N/M). In each horizontal programmable interconnect way that includes a long horizontal programmable interconnect channel, each short horizontal interconnect line segment is connected to one of the long horizontal interconnect line segments of the horizontal programmable interconnect way through an inter-horizontal-channel programmable switch which is provided to each tile, and long horizontal interconnect line segments to which the inter-horizontal-channel programmable switches of arbitrary M contiguous tiles aligned in the horizontal direction are connected belong to different long horizontal lanes. Each input/output line of the function cell is directly connected to corresponding one of the short horizontal interconnect line segments running in the tile containing the function cell. Each of the programmable switches programmably connects/disconnects the connection between the line segments that are connected thereto.

In accordance with an eighteenth aspect of the present invention, in the seventeenth aspect, each column of the two-dimensional array is divided into ALUs (Arithmetic and Logic Units) each of which is composed of U contiguous tiles (U: natural number) of the column. The function cells contained in the ALU at least share an input signal that is inputted to an input selection switch or configuration data designating the functions of the function block and the input selection switch. The programmable interconnect network further includes vertical programmable interconnect ways each of which runs in the vertical direction in each column of the two-dimensional array respectively. The vertical programmable interconnect way includes a short vertical programmable interconnect channel and a long vertical programmable interconnect channel. The short vertical programmable interconnect channel includes W short vertical lanes (W: natural number<M) each of which includes short vertical programmable switches which are provided to every V tiles (V: integral multiple of U) aligned in the vertical direction and short vertical interconnect line segments as seamless lines connecting adjacent short vertical programmable switches. At least one of the W short horizontal lanes of the short vertical programmable interconnect channel is composed of short vertical interconnect line segments each of which seamlessly stretches from the uppermost tile to the lowermost tile of an ALU. The long vertical programmable interconnect channel includes L long vertical lanes (L: natural number$\leq$W) each of which is composed of long vertical interconnect line segments whose lengths are at least 4 times as long as the short vertical interconnect line segment. Each short vertical interconnect line segment is connected to one of the long vertical interconnect line segment through an inter-vertical-channel programmable switch. Each short vertical interconnect line segment is connected to one of the short horizontal interconnect line segments intersecting the short vertical interconnect line segment in each row of the two-dimensional array through an intersection programmable switch. Intersection programmable switches that are contained in the same tile is connected to different short horizontal interconnect line segments.

In accordance with a nineteenth aspect of the present invention, in the seventeenth aspect, the natural numbers M and P are set to be relatively prime.

In accordance with a twentieth aspect of the present invention, in the eighteenth aspect, the natural numbers M and P are set to be relatively prime.

In accordance with a twenty-first aspect of the present invention, in the seventeenth aspect, in at least one horizontal programmable interconnect way that includes no long horizontal programmable interconnect channel, each short horizontal interconnect line segment is connected to a long horizontal interconnect line segment of a horizontal programmable interconnect way that includes a long horizontal programmable interconnect channel through an inter-horizontal-channel programmable switch which is provided to each tile, and long horizontal interconnect line segments to which the inter-horizontal-channel programmable switches of arbitrary M contiguous tiles aligned in the horizontal direction are connected belong to different long horizontal lanes.

In accordance with a twenty-second aspect of the present invention, in the eighteenth aspect, in at least one horizontal programmable interconnect way that includes no long horizontal programmable interconnect channel, each short horizontal interconnect line segment is connected to a long horizontal interconnect line segment of a horizontal programmable interconnect way that includes a long horizontal programmable interconnect channel through an inter-horizontal-channel programmable switch which is provided to each tile, and long horizontal interconnect line segments to which the inter-horizontal-channel programmable switches of arbitrary M contiguous tiles aligned in the horizontal direction are connected belong to different long horizontal lanes.

In accordance with a twenty-third aspect of the present invention, in the twenty-first aspect, the natural numbers M and P are set to be relatively prime.

In accordance with a twenty-fourth aspect of the present invention, in the twenty-second aspect, the natural numbers M and P are set to be relatively prime.

In accordance with a twenty-fifth aspect of the present invention, there is provided a reconfigurable device which is constructed as an integrated circuit including a plurality of function cells and a programmable interconnect network which programmably connects the function cells. The integrated circuit is constructed as a two-dimensional array of tiles which extends in a horizontal direction and a vertical direction. Each tile includes one of the function cells and part of the programmable interconnect network in the vicinity of the function cell. Each function cell includes: a function block having first input terminals, one or more first output terminals, and functions from which a function is programmably selected and set thereto, for generating an output signal from signals supplied to the first input terminals according to the function which has been set thereto and outputting the generated output signal from the one or more first output terminals; input selection switches each of which has second input terminals and a second output terminal, for programmably setting one of the second input terminals to be connected to the second output terminal; an output selection switch having a third input terminal and third output terminals, for programmably setting each of the third output terminals to be connected to the third input terminal or to be in high impedance status; and input/output lines which are connected to the second input terminals of the input selection switches and the third output terminals of the output selection switch. Each first input terminal of the function block is connected to the second output terminal of corresponding one of the input selection switches, and the third input terminal of the output selection switch is connected to the first output terminal of the function block. The programmable interconnect network has J parallelly running horizontal programmable interconnect ways (J: natural number) in each row of the two-dimensional array. Each of the J horizontal programmable interconnect ways includes a short horizontal programmable interconnect channel. Each of K horizontal programmable interconnect ways (K: natural number≦J) selected out of the J horizontal programmable interconnect ways further includes a long horizontal programmable interconnect channel. In each j-th horizontal programmable interconnect way (j: natural number≦J) included in the J horizontal programmable interconnect ways, the short horizontal programmable interconnect channel includes Mj short horizontal lanes (Mj: natural number) each of which includes short horizontal programmable switches which are provided to every Mj tiles aligned in the horizontal direction and short horizontal interconnect line segments as seamless lines connecting adjacent short horizontal programmable switches, and the horizontal positions of tiles containing the short horizontal programmable switches of each short horizontal lane are successively shifted between adjacent short horizontal lanes by 1 tile width. In each k-th horizontal programmable interconnect way (k: natural number≦K) included in the K horizontal programmable interconnect ways, the long horizontal programmable interconnect channel includes Mk long horizontal lanes (Mk: natural number) each of which includes long horizontal programmable switches which are provided to every Nk tiles (Nk: natural number) aligned in the horizontal direction and long horizontal interconnect line segments as seamless lines connecting adjacent long horizontal programmable switches, and the horizontal positions of tiles containing the long horizontal programmable switches of each long horizontal lane of the long horizontal programmable interconnect channel are successively shifted between adjacent long horizontal lanes by Pk tile widths (Pk: natural number≧4, Pk=Nk/Mk). At least two selected from the natural numbers Pk (k≦K) are set to be different from each other, or at least two selected from the natural numbers Mk (k≦K) are set to be different from each other. In each k-th horizontal programmable interconnect way (k≦K) included in the K horizontal programmable interconnect ways, each short horizontal interconnect line segment is connected to one of the long horizontal interconnect line segments of the k-th horizontal programmable interconnect way through an inter-horizontal-channel programmable switch which is provided to each tile, and long horizontal interconnect line segments to which the inter-horizontal-channel programmable switches of arbitrary Mk contiguous tiles aligned in the horizontal direction are connected belong to different long horizontal lanes. Each input/output line of the function cell is directly connected to corresponding one of the short horizontal interconnect line segments running in the tile containing the function cell. Each of the programmable switches programmably connects/disconnects the connection between the line segments that are connected thereto.

In accordance with a twenty-sixth aspect of the present invention, in the twenty-fifth aspect, each column of the two-dimensional array is divided into ALUs (Arithmetic and Logic Units) each of which is composed of U contiguous tiles (U: natural number) of the column. The function cells contained in the ALU at least share an input signal that is inputted to an input selection switch or configuration data designating the functions of the function block and the input selection switch. The programmable interconnect network further includes vertical programmable interconnect ways each of which runs in the vertical direction in each column of the two-dimensional array respectively. The vertical programmable interconnect way includes a short vertical programmable interconnect channel and a long vertical programmable interconnect channel. The short vertical programmable interconnect channel includes W short vertical lanes (W: natural number<Min (Mk)) each of which includes short vertical programmable switches which are provided to every V tiles (V: integral multiple of U) aligned in the vertical direction and short vertical interconnect line segments as seamless lines connecting adjacent short vertical programmable switches. At least one of the W short horizontal lanes of the short vertical programmable interconnect channel is composed of short vertical interconnect line segments each of which seamlessly stretches from the uppermost tile to the lowermost tile of an ALU. The long vertical programmable interconnect channel includes L long vertical lanes (L: natural number≦W) each of which is composed of long vertical interconnect line segments whose lengths are at least 4 times as long as the short vertical interconnect line segment. Each short vertical interconnect line segment is connected to one of the long vertical interconnect line segments through an inter-vertical-channel programmable switch. Each short vertical interconnect line segment is connected to one of the short horizontal interconnect line segments intersecting the short vertical interconnect line segment in each row of the two-dimensional array through an intersection programmable switch. Intersection programmable switches that are contained in the same tile is connected to different short horizontal interconnect line segments.

In accordance with a twenty-seventh aspect of the present invention, in the twenty-fifth aspect, the natural numbers Mk and Pk are set to be relatively prime in at least one horizontal programmable interconnect way included in the K horizontal programmable interconnect ways.

In accordance with a twenty-eighth aspect of the present invention, in the twenty-sixth aspect, the natural numbers Mk and Pk are set to be relatively prime in at least one horizontal programmable interconnect way included in the K horizontal programmable interconnect ways.

In accordance with a twenty-ninth aspect of the present invention, in the twenty-fifth aspect, in at least one horizontal programmable interconnect way that is not included in the K horizontal programmable interconnect ways, each short horizontal interconnect line segment is connected to a long horizontal interconnect line segment of a k-th horizontal programmable interconnect way that is included in the K horizontal programmable interconnect ways through an inter-horizontal-channel programmable switch, and long horizontal interconnect line segments to which the inter-horizontal-channel programmable switches of arbitrary Mk contiguous tiles aligned in the horizontal direction are connected belong to different long horizontal lanes.

In accordance with a thirtieth aspect of the present invention, in the twenty-sixth aspect, in at least one horizontal programmable interconnect way that is not included in the K horizontal programmable interconnect ways, each short horizontal interconnect line segment is connected to a long horizontal interconnect line segment of a k-th horizontal programmable interconnect way that is included in the K horizontal programmable interconnect ways through an inter-horizontal-channel programmable switch, and long horizontal interconnect line segments to which the inter-horizontal-channel programmable switches of arbitrary Mk contiguous tiles aligned in the horizontal direction are connected belong to different long horizontal lanes.

In accordance with a thirty-first aspect of the present invention, in the twenty-ninth aspect, the natural numbers Mk and Pk are set to be relatively prime in at least one horizontal programmable interconnect way included in the K horizontal programmable interconnect ways.

In accordance with a thirty-second aspect of the present invention, in the thirtieth aspect, the natural numbers Mk and Pk are set to be relatively prime in at least one horizontal programmable interconnect way included in the K horizontal programmable interconnect ways.

BRIEF DESCRIPTION OF THE DRAWINGS

The objects and features of the present invention will become more apparent from the consideration of the following detailed description taken in conjunction with the accompanying drawings, in which:

FIG. 25 is a circuit diagram showing the second example of the VPIW in accordance with the embodiment of the present invention;

FIG. 26 is a circuit diagram showing a two-dimensional array including a plurality of HPIWs 20 and VPIWs 30 in accordance with the embodiment of the present invention.

DESCRIPTION OF THE PREFERRED EMBODIMENTS

Figure 1:
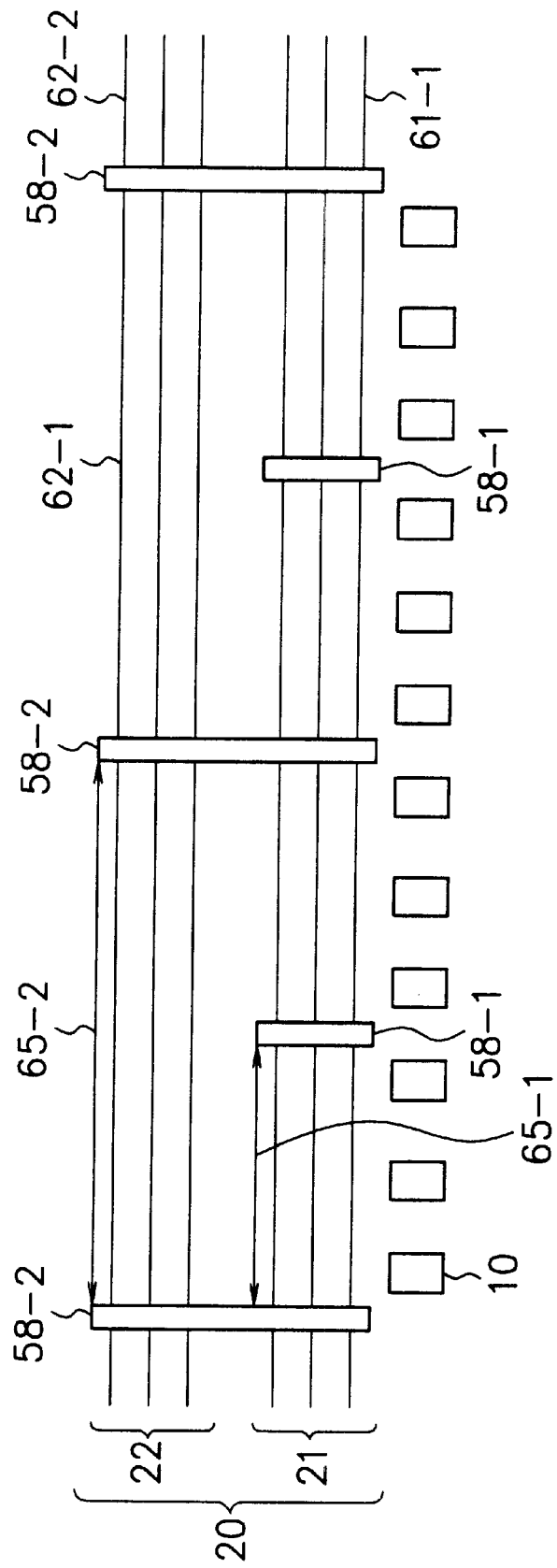
FIG. 1 is a circuit diagram showing an example of a conventional programmable interconnect network having a hierarchical structure (prior art #1)

Referring now to the drawings, a description will be given in detail of a preferred embodiment in accordance with the present invention.

Features of the Reconfigurable Device of the Embodiment

Before starting the description on details of the reconfigurable device in accordance with the embodiment of the present invention, features of the reconfigurable device of the embodiment will be described first.

The reconfigurable device of the following embodiment is constructed as an integrated circuit including a plurality of function cells and a programmable interconnect network which programmably connects the function cells. The programmable interconnect network of the embodiment includes horizontal programmable interconnect ways which run in the horizontal direction and vertical programmable interconnect ways which run in the vertical direction. Each horizontal programmable interconnect way includes a short horizontal programmable interconnect channel and a long horizontal programmable interconnect channel. Each vertical programmable interconnect way includes a short vertical programmable interconnect channel and a long vertical programmable interconnect channel.

In the horizontal programmable interconnect way, both the short horizontal programmable interconnect channel and the long horizontal programmable interconnect channel are constructed to have "shift structure", that is, horizontal positions of lines (line segments which are connected by programmable switches) are successively shifted between adjacent lanes of the channel, thereby the "sector segmentation" of the prior art and the problems related to the sector segmentation are avoided. The function cells are directly connected to the short horizontal programmable interconnect channel, but are not directly connected to the long horizontal programmable interconnect channel, therefore, signal transfer of input signals and output signals between the function cell and the long horizontal programmable interconnect channel is conducted necessarily through the short horizontal programmable interconnect channel and a programmable switch which connects the short horizontal programmable interconnect channel and the long horizontal programmable interconnect channel. By such structure, load capacitance on the long horizontal programmable interconnect channel can be reduced and thereby high-speed signal transfer is realized.

In the vertical programmable interconnect way, the long vertical programmable interconnect channel is connected with the short vertical programmable interconnect channel by programmable switches. The short vertical programmable interconnect channel is connected with the short horizontal programmable interconnect channels of the horizontal programmable interconnect ways through programmable switches. By use of the connection, the short vertical programmable interconnect channel is allowed to make access to the function cells.

By employing such interconnect line structure, access of each function cell to all the programmable interconnect channels is made possible and routing between all types of programmable interconnect channels is realized by use of a small number of switches.

The vertical programmable interconnect ways are oriented in the "bit string direction" (or "bit direction") in the multiple-bit data processing, and the number of lines running in the vertical direction (bit direction) is set smaller than that of lines running in the horizontal direction, thereby waste of lines (the number of unused lines) when multiple-bit data paths are implemented on the reconfigurable device can be reduced.

Further, both in the horizontal direction and the vertical direction, the number of lines of the long programmable interconnect channel is set smaller than or equal to that of lines of the short programmable interconnect channel, thereby waste of long lines (whose usage frequency is lower than short lines) is reduced. Access to the long programmable interconnect channel is made necessarily through the short programmable interconnect channel as mentioned above, therefore, the above reduction of waste of long lines is realized securing enough accessibility of the function cells to the long programmable interconnect channel and preventing excessive load on the long programmable interconnect channel.

Programmable Interconnect Network

Figure 5:
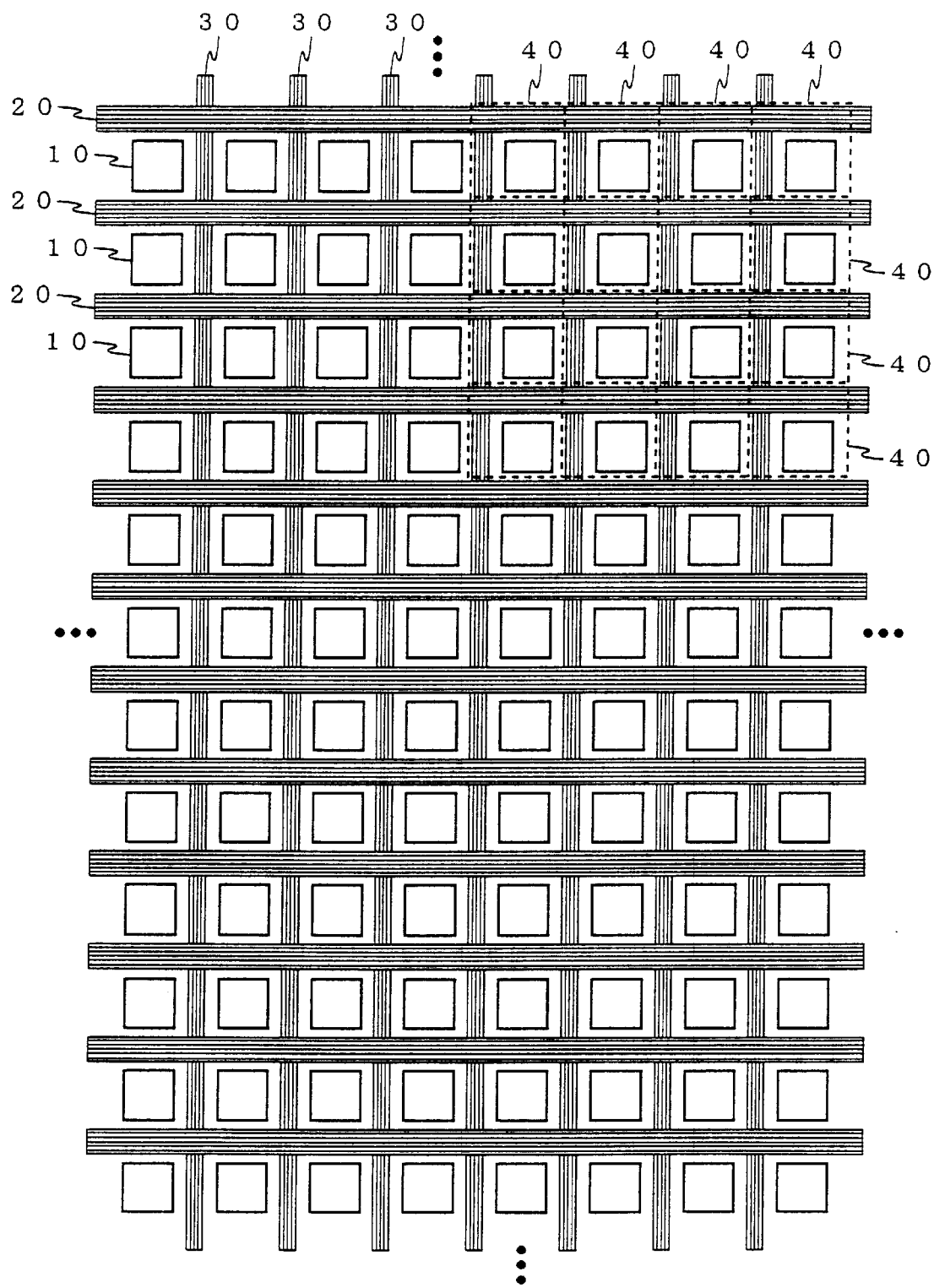
FIG. 5 is a circuit diagram briefly showing a reconfigurable device in accordance with an embodiment of the present invention.

FIG. 5 is a circuit diagram briefly showing a reconfigurable device in accordance with an embodiment of the present invention. The reconfigurable device 100 shown in FIG. 5 includes a plurality of function cells 10, horizontal programmable interconnect ways (HPIWs) 20 and vertical programmable interconnect ways (VPIWs) 30. The function cells 10 are arranged in the shape of a two-dimensional array. Each HPIW 20, which is provided corresponding to each row of the two-dimensional function cell array, extends in the horizontal direction. Each VPIW 30, which is provided corresponding to each column of the two-dimensional function cell array, extends in the vertical direction.

The function cell 10 is a logic circuit to which various logical functions can be set programmably. The function cell 10 receives an input signal, generates an output signal corresponding to the input signal according to the logical function which has been set thereto, and outputs the output signal.

The programmable interconnect network, which is composed of the HPIWs 20 (in each row) and the VPIWs 30 (in each column), programmably connects input terminals and output terminals of the function cells 10 and various circuits (I/O circuit, RAM, etc.) which are placed on the same device.

The reconfigurable device shown in FIG. 5 can be divided into structural units (hereafter, referred to as "tiles 40") each of which is composed of a function cell 10 and part of the programmable interconnect network associated with the function cell 10, and the reconfigurable device can be regarded as an assembly of the tiles 40 which are laid closely in the shape of a two-dimensional array. In FIG. 5, some of the tiles 40 are shown by dotted squares. Incidentally, only major parts of the reconfigurable device that are related to the features of the present invention are shown in FIG. 5. The connection between the programmable interconnect network and the function cells 10, the connection between the HPIWs 20 and VPIWs 30, etc. are not shown in FIG. 5 for the sake of simplicity. Such detailed composition will be explained later.

Horizontal Programmable Interconnect Way (HPIW) 20

[HPIW 20: Example #1]

Figure 6:
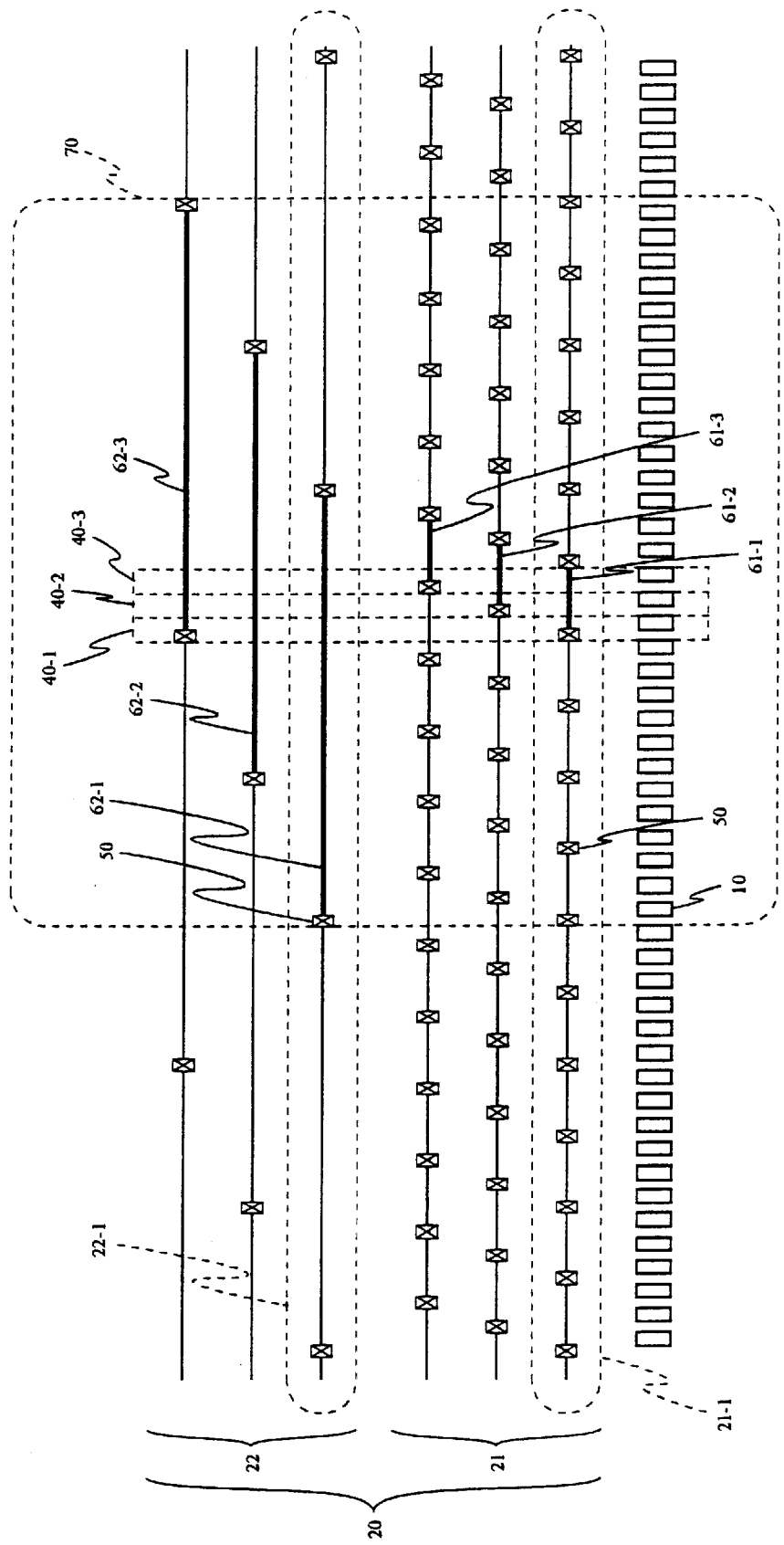
FIG. 6 is a circuit diagram showing the first example of an HPIW (Horizontal Programmable Interconnect Way) in accordance with the embodiment of the present invention.

FIG. 6 is a circuit diagram showing the first example of the HPIW 20 in accordance with the embodiment of the present invention. In FIG. 6, function cells 10 (in a row of the two-dimensional array shown in FIG. 5) and an HPIW 20 corresponding to the row are shown. For the sake of easy understanding, the VPIWs 30, connections between the HPIW 20 and the function cells 10, connections in the HPIW 20, etc. are not shown in FIG. 6.

The HPIW 20 shown in FIG. 6 at least includes a short horizontal programmable interconnect channel 21 and a long horizontal programmable interconnect channel 22, and each horizontal programmable interconnect channel (21, 22) includes one or more lanes. The "lane" means a series connection of interconnect line segments which are connected by programmable switches 50.

The reference numbers 40-1, 40-2 and 40-3 shown in FIG. 6 denote the aforementioned tiles 40. The whole of the circuit of FIG. 6 can be regarded as a one-dimensional chain of the tiles 40 ( . . . , 40-1, 40-2, 40-3, . . . ) which are arranged in the horizontal direction.

The length of each interconnect line segment is substantially an integral multiple of the width of the tile 40. In the following explanation, the "horizontal programmable interconnect channel" will be abbreviated as "HPIC", and the "interconnect line segment" will be abbreviated as "ILS".

The reference number "21-1" shown in FIG. 6 denotes a first lane of the short HPIC 21. The first lane 21-1 of the short HPIC 21 is composed of a series connection of ILS's 61-1 (length: 3 tile widths) which are connected by the programmable switches 50.

The short HPIC 21 shown in FIG. 6 is composed of three lanes having the same composition. In the short HPIC 21, the horizontal position of an ILS 61-2 of the second lane is shifted to the right by a tile width relative to an ILS 61-1 of the first lane (lower nearest neighbor lane), and the horizontal position of an ILS 61-3 of the third lane is shifted to the right by a tile width relative to the ILS 61-2 of the second lane (lower nearest neighbor lane).

The reference number "22-1" shown in FIG. 6 denotes a first lane of the long HPIC 22. The first lane 22-1 of the long HPIC 22 is composed of a series connection of ILS's 62-1 (length: 18 tile widths) which are connected by the programmable switches 50.

The long HPIC 22 shown in FIG. 6 is composed of three lanes having the same composition. In the long HPIC 22, the horizontal position of an ILS 62-2 of the second lane is shifted to the right by 6 tile widths relative to an ILS 62-1 of the first lane (lower nearest neighbor lane), and the horizontal position of an ILS 62-3 of the third lane is shifted to the right by 6 tile widths relative to the ILS 62-2 of the second lane (lower nearest neighbor lane). For easy understanding, a group of corresponding ILS's (61-1, 61-2, 61-3) in the short HPIC 21 and a group of corresponding ILS's (62-1, 62-2, 62-3) in the long HPIC 22 are shown by thick lines in FIG. 6.

In such a programmable interconnect channel composed of lanes of the same composition, the aforementioned structure in which the (horizontal) positions of the interconnect line segments (ILS's) in each lane are successively shifted between adjacent lanes by a fixed multiple of the tile width will hereafter be referred to as "shift structure". When the shift width is P tile widths, the shift structure will be called "P-tile shift structure".

In the following description, the ILS (interconnect line segment) of the short HPIC (Programmable Interconnect Channel) 21 will be abbreviated as "short HPILS", and the ILS of the long HPIC 22 will be abbreviated as "long HPILS". The length of the ILS (segment length) will be expressed in terms of the number of tiles which the ILS passes through.

Programmable Switch 50

[Programmable Switch 50: Example #1]

In the following, the programmable switches 50 which are employed in the reconfigurable device of this embodiment will be explained. The programmable switch 50 is composed of a switching circuit whose connection status between its input/output terminals can be set programmably.

Figure 7:
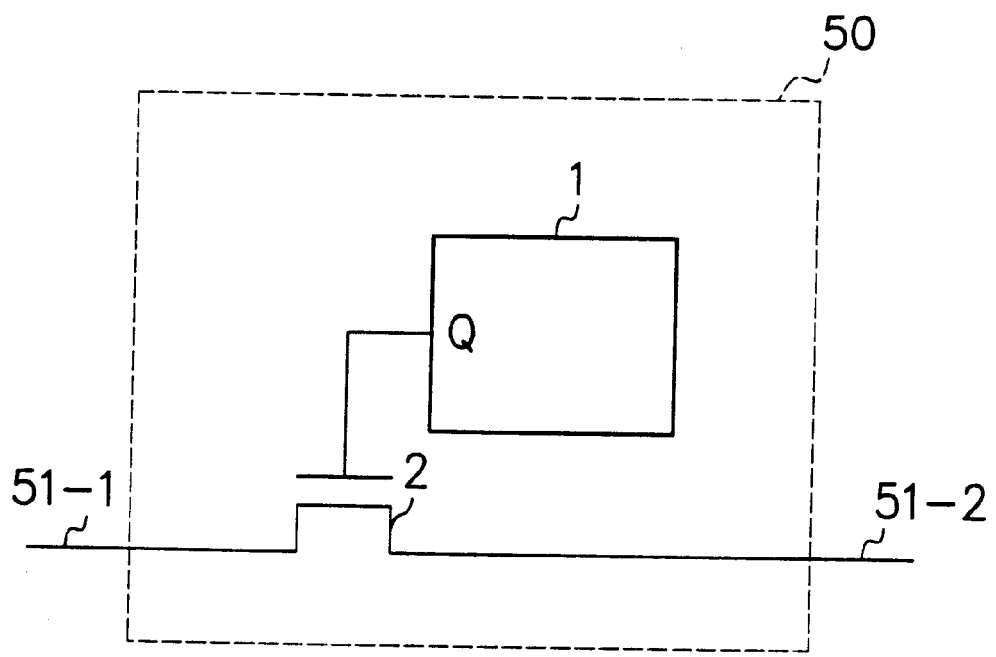
FIG. 7 is a circuit diagram showing the first example of a programmable switch which is used in the embodiment.

FIG. 7 is a circuit diagram showing the first example of the programmable switch 50 which is used in this embodiment. The programmable switch 50 shown in FIG. 7 includes a 1-bit memory cell 1 and an N-MOS transistor 2 whose gate is connected to the data output terminal Q of the 1-bit memory cell 1. The source and drain of the N-MOS transistor 2 are used as the bidirectional terminals 51-1 and 51-2 of the programmable switch 50.

In the composition shown in FIG. 7, the connection status between the bidirectional terminals 51-1 and 51-2 of the programmable switch 50 becomes ON or OFF depending on whether a value held by the 1-bit memory cell 1 is 1 (high logic level) or 0 (low logic level). Such a programmable switch 50 can be mounted in a small area of a substrate (chip). However, the programmable switch 50 of FIG. 7 has the demerit of being incapable of transmitting the high logic level signals perfectly.

[Programmable Switch 50: Example #2]

Figure 8:
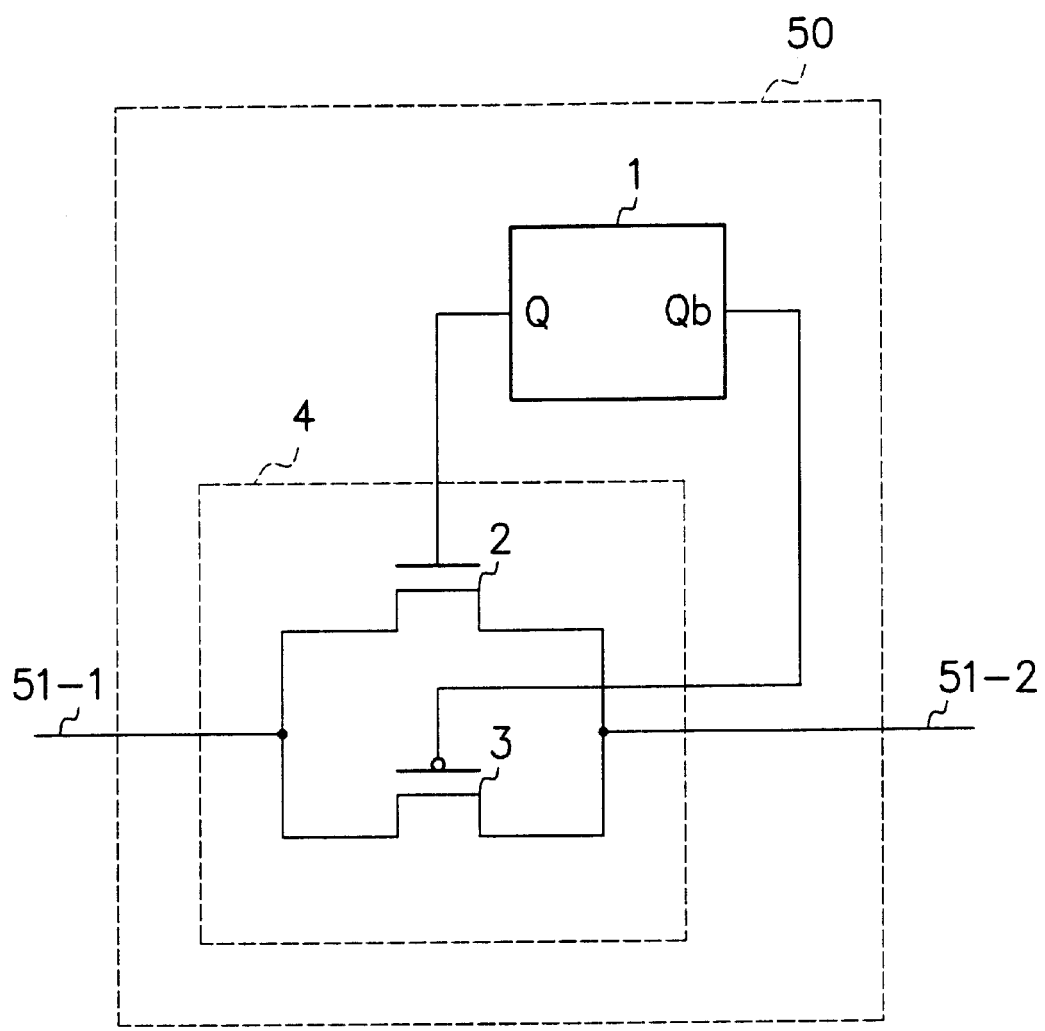
FIG. 8 is a circuit diagram showing the second example of the programmable switch which is used in the embodiment.

FIG. 8 is a circuit diagram showing the second example of the programmable switch 50 which is used in this embodiment. The programmable switch 50 shown in FIG. 8 includes a 1-bit memory cell 1 and a transmission gate 4 which is composed of an N-MOS transistor 2 and a P-MOS transistor 3. The data output terminal Q of the 1-bit memory cell 1 is connected to the gate of the N-MOS transistor 2 of the transmission gate 4, and the inverse data output terminal Qb of the 1-bit memory cell 1 is connected to the gate of the P-MOS transistor 3 of the transmission gate 4.

A source/drain terminal of the N-MOS transistor 2 and a source/drain terminal of the P-MOS transistor 3 are connected together to be used as a bidirectional terminal 51-1 of the programmable switch 50, and the other source/drain terminal of the N-MOS transistor 2 and the other source/drain terminal of the P-MOS transistor 3 are connected together to be used as the other bidirectional terminal 51-2 of the programmable switch 50.

The connection status between the bidirectional terminals 51-1 and 51-2 of the programmable switch 50 becomes ON or OFF depending on whether a value held by the 1-bit memory cell 1 is 1 (high logic level) or 0 (low logic level). The programmable switch 50 of FIG. 8 is a little larger than the programmable switch 50 of FIG. 7, however, the programmable switch 50 of FIG. 8 has the merit of being capable of transmitting both the high logic level signals and the low logic level signals perfectly.

[Programmable Switch 50: Example #3]

Figure 9:
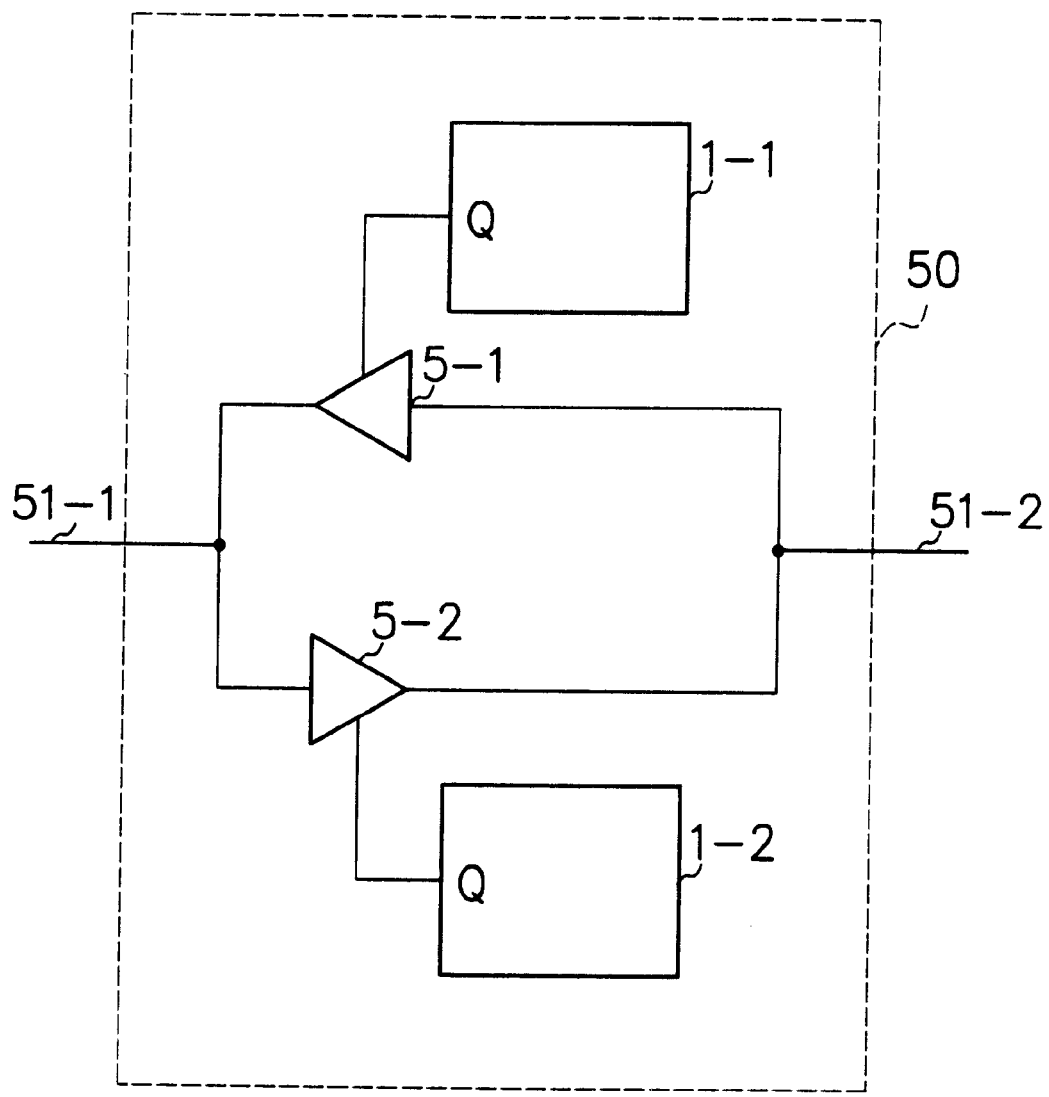
FIG. 9 is a circuit diagram showing the third example of the programmable switch which is used in the embodiment.

FIG. 9 is a circuit diagram showing the third example of the programmable switch 50 which is used in this embodiment. The programmable switch 50 shown in FIG. 9 includes a first 1-bit memory cell 1-1, a second 1-bit memory cell 1-2, a first tristate buffer 5-1 and a second tristate buffer 5-2. The data output terminal Q of the first 1-bit memory cell 1-1 is connected to the control terminal of the first tristate buffer 5-1, and the data output terminal Q of the second 1-bit memory cell 1-2 is connected to the control terminal of the second tristate buffer 5-2.

The output terminal of the first tristate buffer 5-1 and the input terminal of the second tristate buffer 5-2 are connected together to be use as a bidirectional terminal 51-1 of the programmable switch 50, and the input terminal of the first tristate buffer 5-1 and the output terminal of the second tristate buffer 5-2 are connected together to be use as the other bidirectional terminal 51-2 of the programmable switch 50.

Signals are transmitted from the bidirectional terminal 51-2 to the bidirectional terminal 51-1 when values held by the 1-bit memory cells 1-1 and 1-2 are (1, 0), and signals are transmitted from the bidirectional terminal 51-1 to the bidirectional terminal 51-2 when the values held by the 1-bit memory cells 1-1 and 1-2 are (0, 1). The connection status between the bidirectional terminals 51-1 and 51-2 becomes OFF when the values held by the 1-bit memory cells 1-1 and 1-2 are (0, 0).

The programmable switch 50 of FIG. 9 needs a larger space on the chip. However, the programmable switch 50 of FIG. 9 is an active device having a buffer function (signal regeneration function), whereas the programmable switches 50 of the examples #1 and #2 are passive devices without the buffer function. Therefore, the programmable switch 50 of the example #3 is suitable for connecting lines having large load capacitance.

[Programmable Switch 50: Another Example]

As another example of the programmable switch 50, a fuse or anti-fuse (whose connection status can be set only once by the user) can also be used.

Area 70 of FIG. 6

Figure 10:
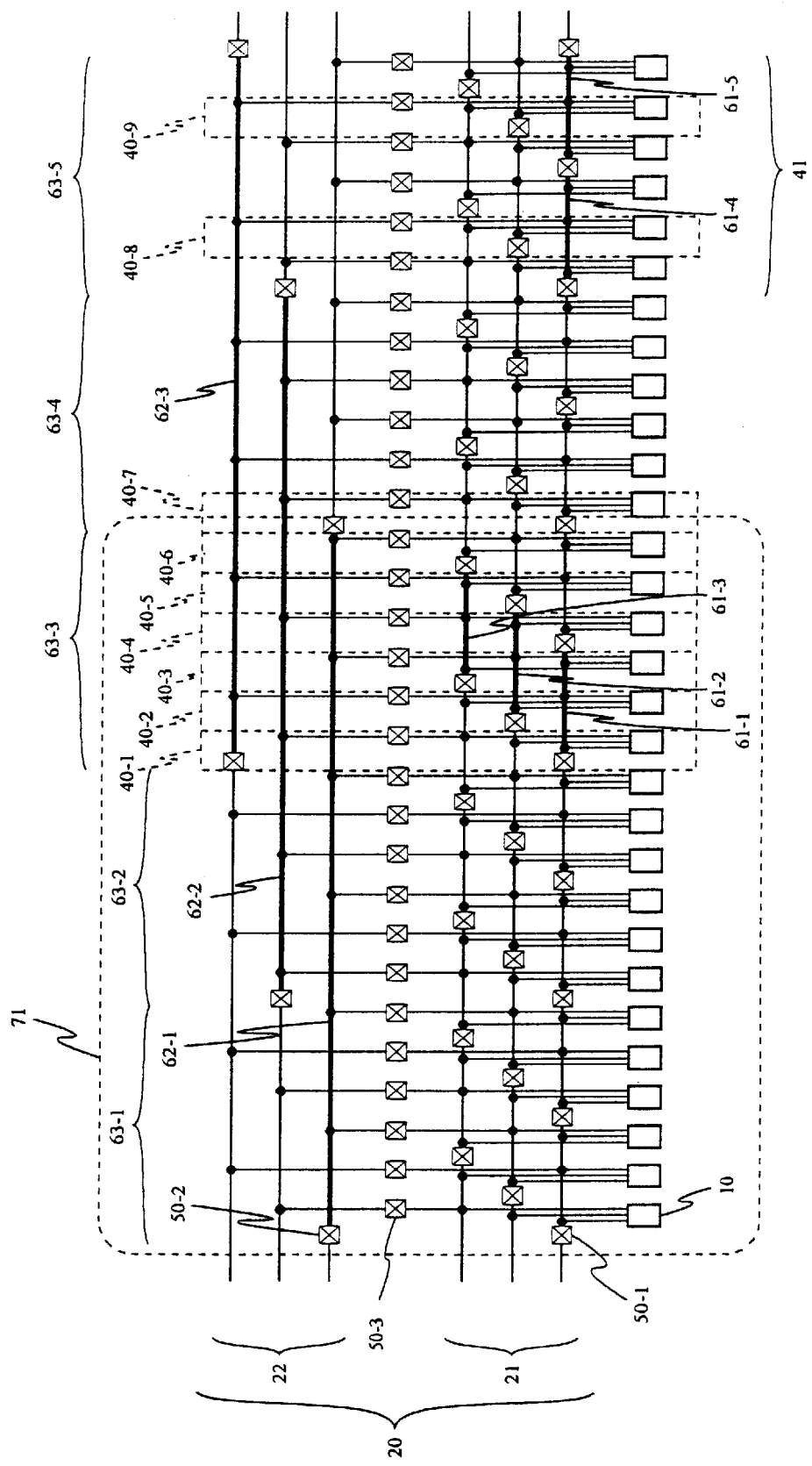
FIG. 10 is a circuit diagram depicting an area 70 shown in FIG. 6 in detail.

In the following, the area 70 which is surrounded by a dotted square in FIG. 6 will be explained in detail referring to FIG. 10. FIG. 10 is a circuit diagram depicting the area 70 in detail.

Referring to FIG. 10, each tile (40-1~40-9, for example) includes a function cell 10. Three short HPILS's and three long HPILS's run in each tile. In each tile, each short HPILS is directly connected to the function cell 10. Each short HPILS is connected to a corresponding long HPILS by an inter-HPIC programmable switch 50-3. The connection between a short HPILS and a long HPILS will hereafter be called "inter-HPIC connection".

Every tile includes a programmable switch 50-1 of the short HPIC 21. However, not every tile includes a programmable switch 50-2 of the long HPIC 22. For example, each of the tiles 40-1 and 40-7 includes a programmable switch 50-2, however, no programmable switch 50-2 is included in the tiles 40-2~40-6.

Function Cell 10

Figure 11:
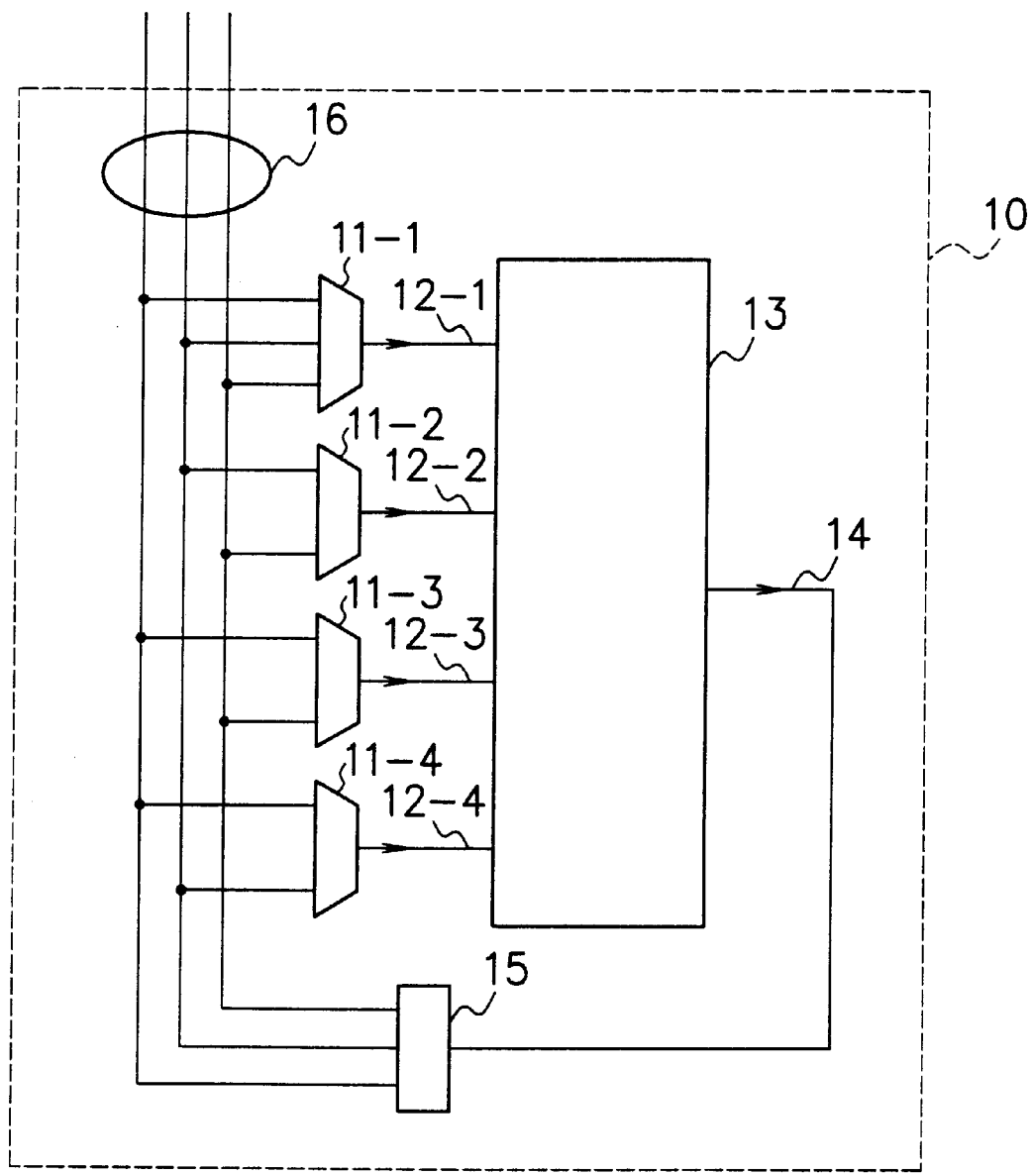
FIG. 11 is a circuit diagram showing an example of the composition of a function cell of the reconfigurable device of FIG. 5.

FIG. 11 is a circuit diagram showing an example of the composition of the function cell 10. The function cell 10 shown in FIG. 11 includes input/output lines 16, input selection switches 11-i (i=1, 2, 3, 4), a function block 13, and an output selection switch 15. The input/output lines 16 are directly connected to the short HPIC 21. Each input selection switch 11-i selects a signal out of signals supplied from the input/output lines 16 and obtains an input signal 12-i (i=1, 2, 3, 4) for the function block 13. The function block 13 generates an output signal 14 from the input signals 12-i according to a function which has preliminarily been set thereto. The output selection switch 15 selectively outputs the output signal 14 of the function block 13 to the input/output lines 16.

Incidentally, the composition shown in FIG. 11 (the number of the input/output lines 16, the number of the input selection switches 11-i, the numbers of the input terminals and output terminals of the function block 13, the connections between the parts, etc.) is only an example, and thus the composition can be changed appropriately depending on design requirements. However, each input selection switch 11-i necessarily has two or more input terminals, and the output selection switch 15 necessarily has two or more output terminals. The input selection switches 11-i, the function block 13 and the output selection switch 15 are designed so that their operation (input selection operation, function, output selection operation) can be reconfigured programmably.

Features of the Composition of FIG. 10

Figure 4:
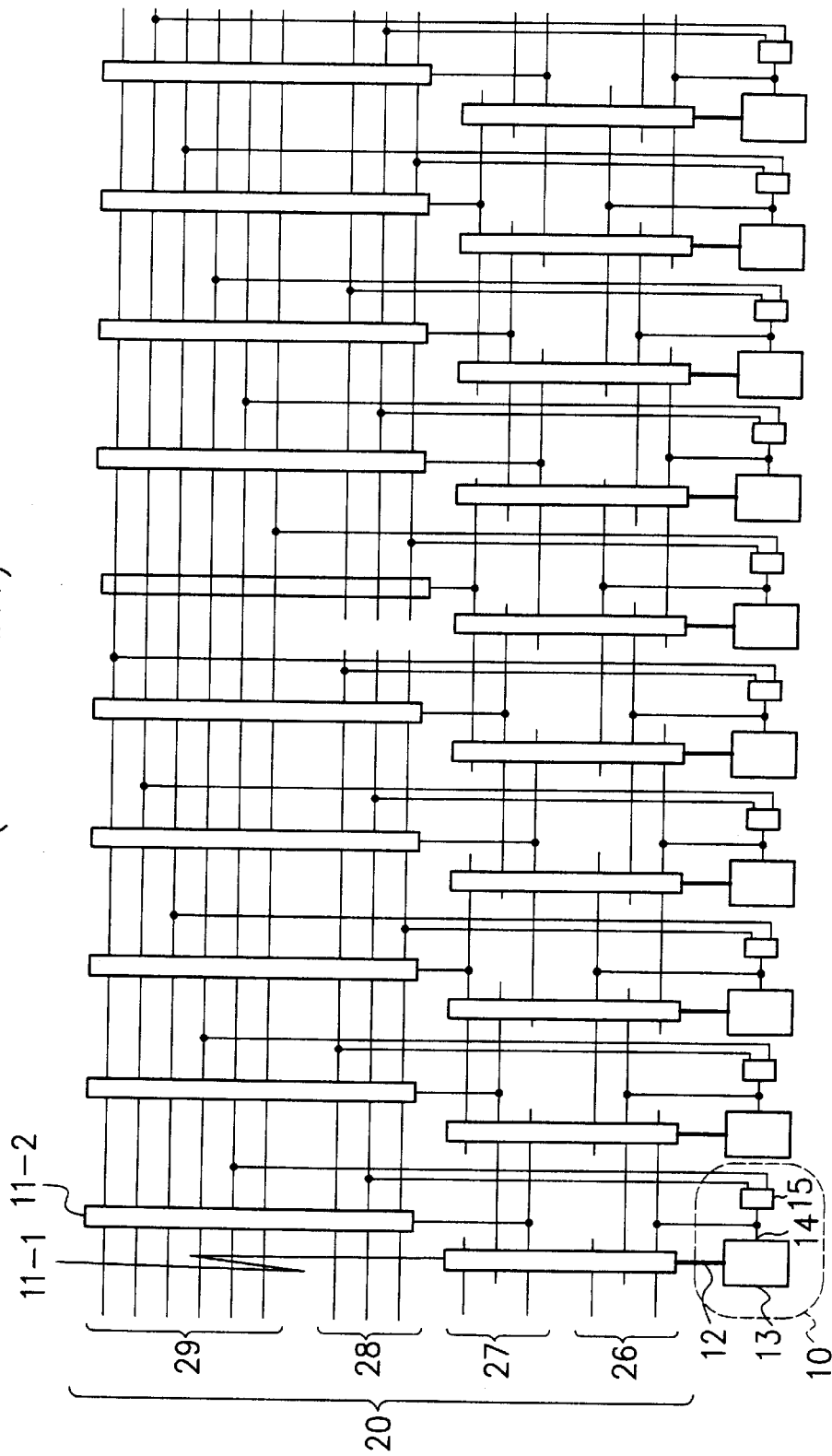
FIG. 4 is a circuit diagram showing another conventional hierarchical programmable interconnect network (prior art #5)

In the programmable interconnect network shown in FIG. 10, each short HPILS is generally connected to two or more function cells 10, and thus each short HPILS is connected to two or more output selection switches 15. Therefore, two or more output signals selected by two or more function cells 10 can be outputted to a line, differently from the case of the local feedback channel 26 of the prior art #5 of FIG. 4 where only one function cell 10 is connected to a line. By such composition, the number of lines in the short HPIC 21 of this embodiment can be reduced in comparison with the conventional local feedback channel 26.

Each function cell 10 is directly connected to two nearest neighbor function cells 10 and two next nearest neighbor function cells 10 through the short HPIC 21 (not through a programmable switch 50). For example, the function cell 10 of the tile 40-3 shown in FIG. 10 is capable of directly communicating signals with the (left-hand, right-hand) nearest neighbor function cells 10 of the tiles 40-2 and 40-4 through the ILS 61-2, with the right-hand nearest neighbor function cell 10 of the tile 40-4 and the right-hand next nearest neighbor function cell 10 of the tile 40-5 through the ILS 61-3, and with the left-hand nearest neighbor function cell 10 of the tile 40-2 and the left-hand next nearest neighbor function cell 10 of the tile 40-1 through the ILS 61-1.

Each short HPILS is connected to function cells 10 of all the tiles that it runs through. The load capacitance of the short HPILS whose segment length is short is low, and thus high-speed signal transfer is possible. For example, each short HPILS in FIG. 10 is connected to three function cells 10 only. Signal transfer for a distance longer than the segment length is also possible by connecting two or more short HPILS's by use of the programmable switches 50-1 of the short HPIC 21.

In the inter-function-cell signal transfer by use of the short HPIC 21, signal transfer through one short HPILS (via no programmable switch) is the fastest (minimum delay). In this embodiment, such connection through only one short HPILS will be referred to as "minimum connection between function cells 10 in the short HPIC 21" or simply as "short minimum connection". A short HPILS that is directly connected to a function cell 10 will be called "nearest short HPILS of the function cell 10". On the other hand, a function cell 10 that is directly connected to a short HPILS will be called "nearest function cell 10 of the short HPILS.

In the example of FIG. 10, each function cell 10 has three nearest short HPILS's, therefore, each function cell 10 has the aforementioned short minimum connection with two nearest neighbor function cells 10 and two next nearest neighbor function cells 10 through its three nearest short HPILS's.

Line Resistance of Short Lines

Generally, the line resistance of short lines is very small and thus can be neglected. Therefore, the signal delay in a short line, which is exclusively determined by load capacitance that is connected thereto, is independent of the signal transfer distance. Therefore, signal delay in a short line can be regarded as approximately constant at any point in the line, and thus signal delay in the nearest short HPILS will hereafter be regarded as constant (the same) at each point in the nearest short HPILS.

In the above example, every function cell 10 can be connected to the two (left-hand, right-hand) nearest neighbor function cells 10 and the two (left-hand, right-hand) next nearest neighbor function cells 10 by the short minimum connection through the three nearest short HPILS's. Such interconnect line structure in which equivalent interconnect line resources are assigned to each function cell 10 and the function cells 10 have equivalent minimum connection ranges through the interconnect line resources will hereafter be referred to as "homogeneous" interconnect line structure.

1-Tile Shift Structure

The homogeneity of the short HPIC 21 of the embodiment originates in the aforementioned 1-tile shift structure. The programmable interconnect channel in the 1-tile shift structure is not segmented into sectors as in the conventional sector type interconnect line structure. In other words, the programmable switches of the lanes of the programmable interconnect channel (short HPIC 21) are not placed at the same horizontal position. Therefore, even if a connection (programmable switch 50-1) between short HPILS's in a lane existed at a certain horizontal position, other lanes of the short HPIC 21 are continuous and seamless at the horizontal position with no connection (programmable switch 50-1).

By use of such composition in which most signals are transferred by use of the minimum connection, high performance can be attained even in circuits of very large scales. Further, the homogeneity caused by the 1-tile shift structure eliminates the limitations in the sizes and arrangement of the macro blocks. The homogeneity is advantageous for the implementation of a "data path" which successively transfers data through nearby function cells and thereby conducts a massive amount of data processing.

Incidentally, in such a programmable interconnect network, the usage frequency of a line generally tends to become higher as the length of the line becomes shorter. Further, the number of long lines should be reduced and short lines should be used as often as possible for attaining high performance. The aforementioned 1-tile shift structure, in which the number of nearest short HPILS's connecting two tiles becomes larger as the distance between the two tiles becomes shorter, is suitable for satisfying the above conditions. For example, in the case of FIG. 10, the number of nearest short HPILS's that stretch from a tile to a (left-hand or right-hand) nearest neighbor tile is two, whereas the number of nearest short HPILS's that stretch from the tile to a (left-hand or right-hand) next nearest neighbor tile is one. In the case of the tile 40-3 shown in FIG. 10 for example, two nearest short HPILS's 61-2 and 61-3 stretch to the right-hand nearest neighbor tile 40-4, two nearest short HPILS's 61-1 and 61-2 stretch to the left-hand nearest neighbor tile 40-2, one nearest short HPILS 61-3 stretches to the right-hand next nearest neighbor tile 40-5, and one nearest short HPILS 61-1 stretches to the left-hand next nearest neighbor tile 40-1.

As mentioned before, the short HPIC 21 is designed so that all of the three ILS's in a tile will be directly connected to a function cell 10. On the other hand, in the long HPIC 22, only one ILS of a lane selected from the three lanes is connected to a short HPILS in the tile through an inter-HPIC programmable switch 50-3. In spite of such composition, each function cell 10 is capable of making access to any lane of the long HPIC 22 with the same delay by use of a nearest short HPILS.

Taking the tile 40-3 shown in FIG. 10 as an example, all the short HPILS's 61-1, 61-2 and 61-3 are directly connected to the function cell 10 in the tile 40-3, whereas only one long HPILS selected from the three long HPILS's 62-1, 62-2 and 62-3 passing through the tile 40-3 is connected to a short HPILS (61-2) by the inter-HPIC connection. Therefore, the function cell 10 of the tile 40-3 is connected to only one long HPILS 62-1 through the short HPILS 61-2 having the inter-HPIC connection. Other long HPILS's 62-1 and 62-3 do not have connection means in the tile 40-3 to the function cell 10 of the tile 40-3.

However, the function cell 10 of the tile 40-3 can make access to the long HPILS's 62-3 and 62-2, since the function cell 10 has nearest short HPILS's 61-1 and 61-3 which have the inter-HPIC connection with the long HPILS's 62-3 and 62-2 in adjacent tiles 40-2 and 40-4 respectively.

Therefore, the function cell 10 of the tile 40-3 is capable of making access to all the lanes of the long HPIC 22 through the nearest short HPILS's 61-1, 61-2 and 61-3 and the inter-HPIC programmable switches 50-3. Further, delay occurring in the connection path from the function cell 10 to each long lane (lane of the long HPIC 22) becomes constant (the same). As mentioned before, delay at each point in the nearest short HPILS is substantially the same, and thus the delay occurring in the connection path from the function cell 10 to each long lane (through the nearest short HPILS) becomes constant whether the connection path is totally in the tile 40-3 or the connection path passes through an adjacent tile.

Such connection of a function cell 10 to a long HPILS through its nearest short HPILS and an inter-HPIC programmable switches 50-3 only will hereafter be called "minimum connection between the function cell 10 and a long HPILS". A long HPILS that can be connected to a function cell 10 by the minimum connection will be called "nearest long HPILS of the function cell 10". On the other hand, a function cell 10 that can be connected to a long HPILS by the minimum connection will be called "nearest function cell 10 of the long HPILS". Further, when two function cells 10 are connected to the same long HPILS by the minimum connection and signal transfer between the function cells 10 is possible, the connection will be referred to as "minimum connection by the long HPILS between the function cells 10" or simply as "long minimum connection".

Summary of the Composition of FIG. 10

As explained above, every function cell 10 has the nearest long HPILS's which are connected to all the lanes of the long HPIC 22 with the same delay. The nearest long HPILS's of a function cell 10 are composed of three lines: a line that stretches mainly to the left-hand side of the function cell 10, a line that stretches mainly to the right-hand side of the function cell 10, and a line that stretches to both sides of the function cell 10. In the case of the tile 40-3 shown in FIG. 10, the nearest long HPILS 62-3 is the aforementioned line that stretches mainly to the right-hand side of the function cell 10, which stretches from a tile -2 to a tile +15 (relative to the tile 40-3). The nearest long HPILS 62-1 is the aforementioned line that stretches mainly to the left-hand side of the function cell 10, which stretches from a tile -14 to a tile +3. The nearest long HPILS 62-2 is the aforementioned line that stretches to both sides of the function cell 10, which stretches from a tile -8 to a tile +9. The function cell 10 of the tile 40-3 can make access to the three nearest long HPILS's with the same delay.

Each long HPILS shown in FIG. 10 has the inter-HPIC connection in every three tiles only. For example, the long HPILS 62-3 shown in FIG. 10 has the inter-HPIC connection with tiles 40-8 and 40-9 (see FIG. 10) but not with tiles adjacent to the tiles 40-8 and 40-9.

However, the long HPILS 62-3 can make access to the function cells 10 of the tiles adjacent to the tiles 40-8 and 40-9 by the minimum connection through the inter-HPIC connection of the tiles 40-8 and 40-9 and short HPILS's 61-4 and 61-5 which are connected thereto. Therefore, all the function cells 10 in the zone 41 shown in FIG. 10 are the nearest function cells of the long HPILS 62-3, and thus any function cell 10 that can make access to the long HPILS 62-3 by the minimum connection (the function cell 10 of the tile 40-3, for example) can make access to all the function cells 10 in the zone 41 shown in FIG. 10 by the long minimum connection.

As seen from the above example, even though each long HPILS has the inter-HPIC connection in every three tiles only, the long HPILS can provide the long minimum connection between the consecutively aligned function cells 10 by utilizing the short HPILS's which are connected to the inter-HPIC connection. In this example, signal transfer of longer distance is also possible (if not limited to the long minimum connection) by connecting two or more long HPILS's by use of the programmable switches 50-2 of the long HPIC 22. Incidentally, the ILS's 61-1, 61-2, 61-3, 61-4, 61-5, 62-1, 62-2 and 62-3 which have been referred to in the above explanation are shown in FIG. 10 by thick lines for the sake of easy reference and understanding.

Incidentally, in this embodiment, a "long minimum connection range" (that is, a range to which a function cell 10 can make access by use of the long minimum connection (seen from the function cell 10 or relative to the function cell 10)) is not necessarily constant, but varies depending on the function cell 10. The tiles 40-1~40-6 shown in FIG. 10 have common nearest long HPILS's 62-1, 62-2 and 62-3 and do not have any other nearest long HPILS's, therefore, the function cells 10 of the tiles 40-1~40-6 are necessitated to have the same range (absolute positions) of function cells 10 to which they can make access by use of the long minimum connection.

The fact means that the (relative) long minimum connection range seen from a tile (40-1~40-6) varies depending on the tile. For example, the long minimum connection range of the tile 40-3 seen from the tile 40-3 is tile −13 tile +15 (relative to the tile 40-3), whereas the long minimum connection range of the tile 40-4 seen from the tile 40-4 is tile −14 tile +14 (relative to the tile 40-4).

Incidentally, while the function cell 10 of the tile 40-7 shown in FIG. 10 also has the same nearest long HPILS's 62-1, 62-2 and 62-3, the long HPILS 62-1 does not pass through the tile 40-7. There are cases where a nearest long HPILS of a tile does not pass through the tile.

As explained above, the function cells 10 of the reconfigurable device of this embodiment do not necessarily have perfectly equivalent long-range interconnect line structure, however, even though the slight variation of the long minimum connection range exists, each function cell 10 necessarily has three nearest long HPILS's that are assigned thereto: a long HPILS that stretches mainly to the left-hand side of the function cell 10; a long HPILS that stretches mainly to the right-hand side of the function cell 10; and a long HPILS that stretches to both sides of the function cell 10.

The variation of the long minimum connection range among the function cells 10, which is small enough in comparison with the size of the long minimum connection range, is substantially insignificant. Such interconnect line structure in which almost equivalent interconnect line resources are assigned to each function cell 10 will hereafter be referred to as "quasi-homogeneous" interconnect line structure.

In order to obtain the perfect homogeneity as in the short HPIC 21, the aforementioned 1-tile shift structure becomes necessary. When the segment length in the long HPILS is N tile widths, the long HPIC 22 needs N lanes for realizing the 1-tile shift structure. Therefore, a large number of lanes (18 lanes in the example of FIG. 10) become necessary for obtaining the perfect homogeneity of the long HPIC 22. However, demand for long lines is generally lower than that of short lines, and thus the perfectly homogeneous interconnect line structure (in which the number of lanes becomes larger as the segment length of the long HPILS becomes longer) causes a lot of waste. For such reasons, the long HPIC 22 in this embodiment is designed to have the P-tile shift structure (P>1 (P=6 in the example of FIG. 10)) and thereby the number of necessary lanes of the long HPIC 22 is reduced to 3 (which is the same as the number of lanes of the short HPIC 21).

Such structure of the long HPIC 22 employed in this embodiment, which guarantees the quasi-homogeneity while losing the perfect homogeneity, involves substantially no problem for the implementation of application circuits.

The demerit of lack of perfect homogeneity of the long HPIC 22 is small as mentioned above, whereas the merit of miniaturization effect obtained by the line resource reduction in the long HPIC 22 is very large.

Nearest Long HPILS

The long HPIC 22 of the P-tile shift structure has another strong point. The number of nearest long HPILS's of a function cell 10 becomes larger as they gets nearer to the function cell 10 (that is, the number of nearest long HPILS's of the function cell 10 that are very close to the function cell 10 is larger than the number of those not very close to the function cell 10). Such a feature matches the general tendency that shorter lines are used more frequently. In the following, an explanation on the nearest long HPILS's will be given referring to an example.

Here, an interval between two programmable switches 50-2 (not required to be in the same lane) in the long HPIC 22 will be called a "unit interval" of the long HPIC 22. Examples of such unit intervals (63-1, 63-2, 63-3, 63-4 and 63-5) are shown in FIG. 10. In the case of the unit interval 63-3 containing the tiles 40-1~40-6 that share the nearest long HPILS's 62-1, 62-2 and 62-3, three nearest long HPILS's run in the unit interval 63-3, two nearest long HPILS's stretch to each of the nearest neighbor unit intervals 63-2 and 63-4, and one nearest long HPILS stretches to each of the next nearest neighbor unit intervals 63-1 and 63-5.

As explained in the above example, the number of nearest long HPILS's of a function cell 10 becomes larger as they gets nearer to the function cell 10 (or, the number of nearest long HPILS's of a tile 40 becomes larger as they gets nearer to the tile 40). Incidentally, the tile 40-7 at the boundary between two unit intervals has a nearest long HPILS (62-1) that does not run in the unit interval (63-4) to which the tile 40-7 belongs. However, also in such cases, the tendency that "the number of nearest long HPILS's of a tile 40 becomes larger as they gets nearer to the tile 40" remains.

Signal Transfer Delay in Long Minimum Connection

Figure 2:
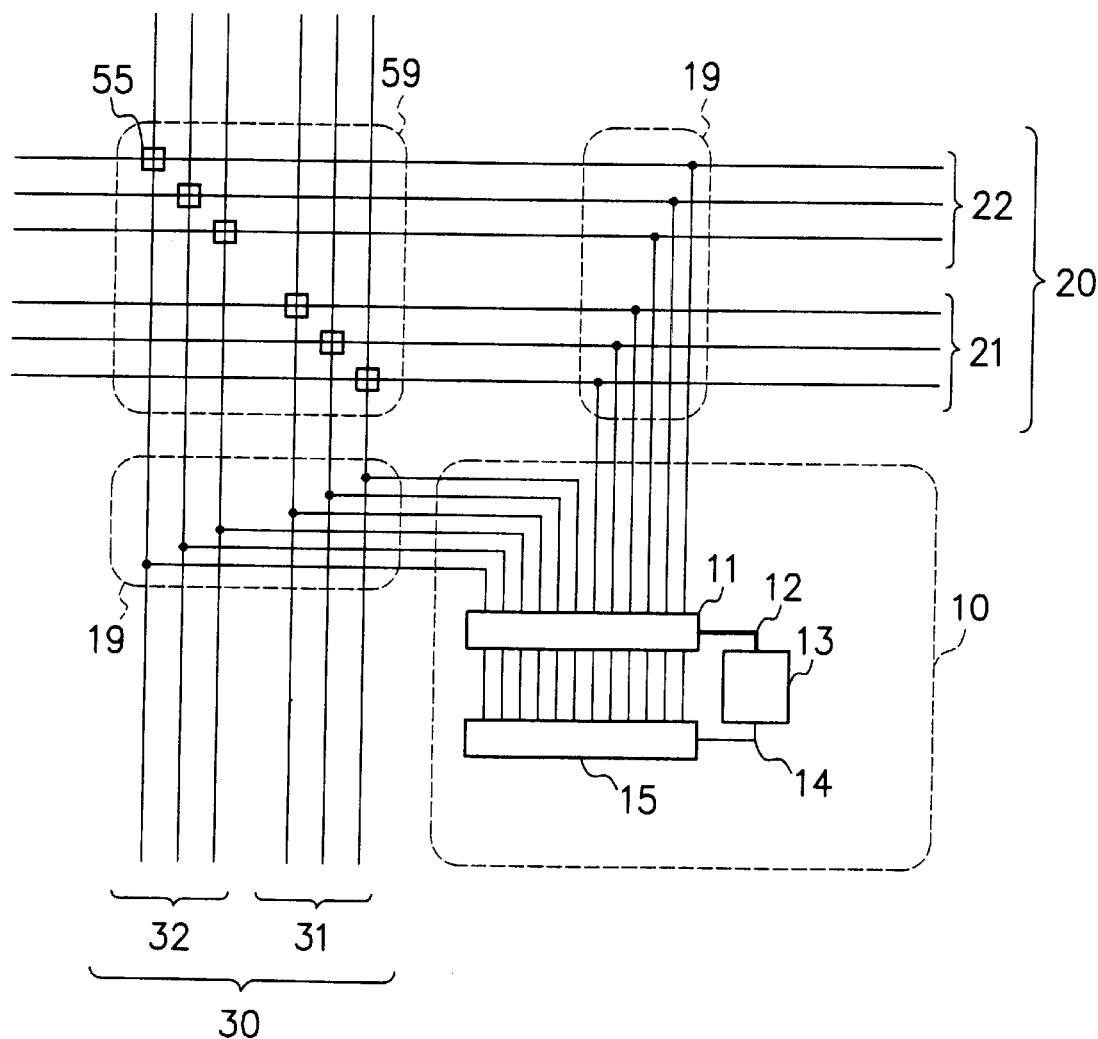
FIG. 2 is a circuit diagram showing a conventional connection method for connecting a hierarchical programmable interconnect network and function cells (prior art #3)
Figure 3:
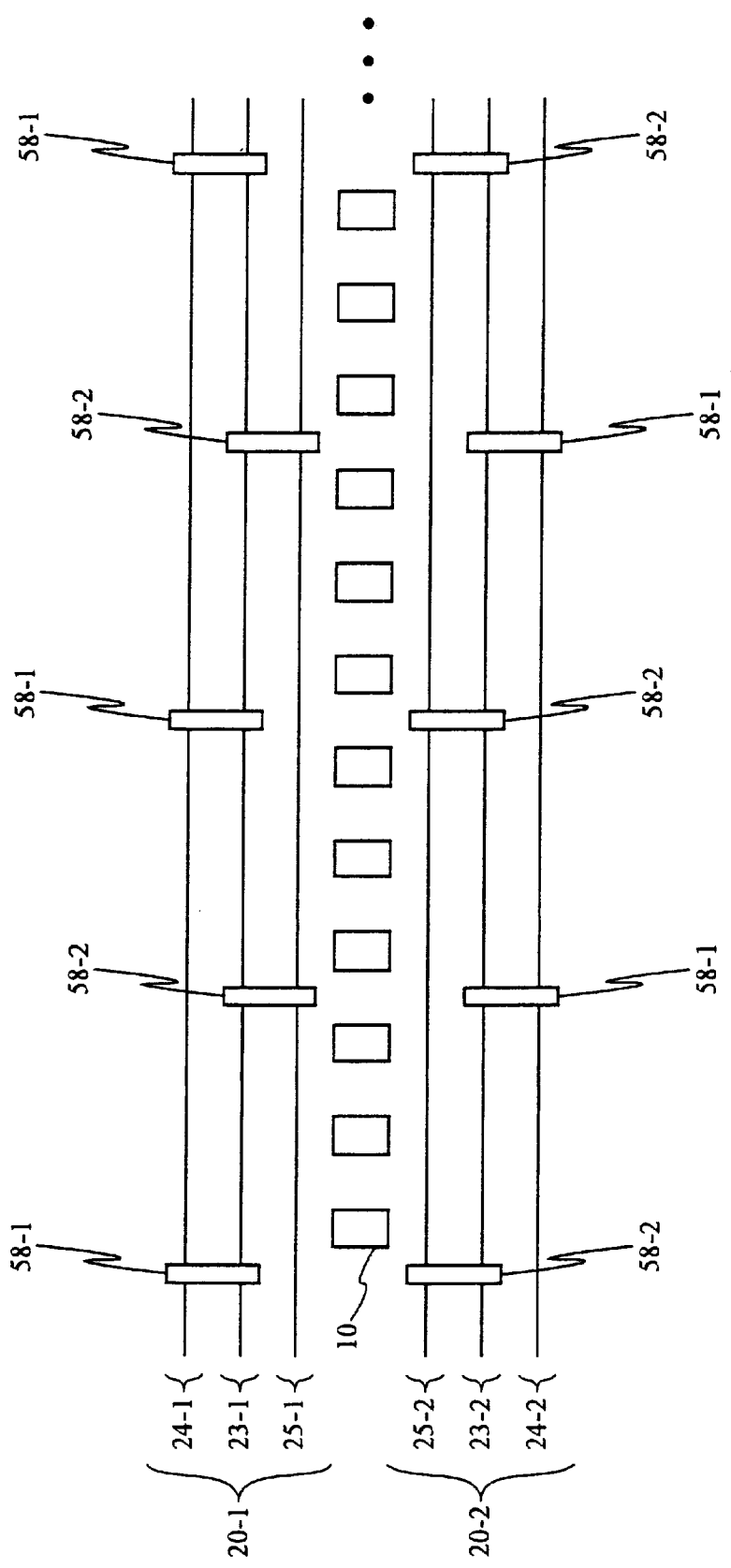
FIG. 3 is a circuit diagram showing another conventional hierarchical programmable interconnect network (prior art #4)

In the following, an explanation will be given on signal transfer delay in the long minimum connection. In the case of the long minimum connection of this embodiment, when a signal is transferred between two function cells 10, each function cell 10 (on the signal output side and on the signal input side) is connected to its nearest long HPILS via its nearest short HPILS and an inter-HPIC programmable switch 50-3 that is connected to the nearest short HPILS. Such connection seems to involve larger signal transfer delay in comparison with the conventional connection (prior art #3 shown in FIG. 2, for example) where each function cell 10 is directly connected to a long HPILS.

However, in order to design the circuit of the prior art #3 so that every function cell (in a tile through which a long HPILS passes) can make direct access to the long HPILS, connection between a function cell and a long HPILS has to be provided to all such tiles, thereby very large load capacitance due to many connections is added to each long HPILS, and thereby long signal transfer delay is caused.

On the other hand, in the interconnect line structure of this embodiment, each long HPILS has the inter-HPIC connection on every three tiles only. Therefore, the load capacitance on the long HPILS becomes ⅓ in comparison with the case where the long HPILS has the inter-HPIC connection in every tile, and thereby high-speed signal transfer is realized in the interconnect line structure of the embodiment. Further, the interconnect line structure of the embodiment has high connectability in that connection between a long HPILS and a function cell 10 is possible in substantially all the tiles through which the long HPILS passes. Incidentally, slight difference can occur between the span of a long HPILS and the long minimum connection range by use of the long HPILS since the long HPILS is connected to a function cell 10 through a short HPILS. However, the difference (one tile width at most) is practically insignificant.

Hereafter, delay in the long HPILS of the prior art, delay in the long HPILS of this embodiment, and delay in the short HPILS of this embodiment will be expressed as "X", "x" and "y", respectively.

The difference between the load capacitance on the long HPILS of the prior art and the load capacitance on the long HPILS of this embodiment increases proportionally to the segment length, therefore, X–x increases as the segment length becomes longer. This means that delay 2y+x in the long minimum connection of the embodiment becomes smaller than the delay X in the prior art when the segment length of the long HPILS becomes long enough. When the segment length gets longer, the reduction of the load capacitance by the embodiment (the increase of X–x) becomes more significant than the delay 2y caused by the two short HPILS's (on the signal output side and the signal input side) of the long minimum connection of the embodiment. Incidentally, delay in the inter-HPIC programmable switch 50-3 on the signal output side will be regarded to be included in the delay x (regarding the inter-HPIC programmable switch 50-3 as driving the long HPILS), and delay in the inter-HPIC programmable switch 50-3 on the signal input side is regarded to be included in the delay y (regarding the inter-HPIC programmable switch 50-3 as driving the short HPILS).

Further, in the prior art, lines to be connected to input/output terminals of each function block have to be selected from two types of interconnect line resources (that is, short HPILS's and long HPILS's), therefore, the input selection switches and the output selection switches in the prior art are necessitated to have large circuit scales. On the other hand, each function cell 10 in the embodiment is connected to short HPILS's only, therefore, the input selection switches and the output selection switches can be implemented in considerably smaller circuit scales. Such compact input/output selection switches are advantageous not only for miniaturization of the reconfigurable device but also for the reduction of delay.

Incidentally, the delay reduction effect of the embodiment (in which long-range signal transfer becomes faster in comparison with the prior art) is obtained when the long HPILS is longer enough than the short HPILS.

When various types of HPICs of different segment lengths are used and the difference is relatively small (2:1, for example) as in conventional FPGAs (Field Programmable Gate Arrays), the input/output selection switches are necessitated to be large and the number of necessary programmable switches for connecting the lines also becomes large, and thus signal transfer speed can not be improved much against expectations. Such structure needs a very large space on the chip while the obtained effect is small. Therefore, it is preferable and effective that a few (2, for example) types of HPICs are used and the difference of the segment length between the HPICs are large.

As mentioned before, the delay in the long minimum connection of the embodiment is 2y+x. Meanwhile, a relationship 3y<2y+x holds since the delay x of the long HPILS is generally larger than the delay y of the short HPILS (y<x). The above relationship means that the delay 2y+x in the long minimum connection is larger than delay in a series connection of three short HPILS's.

Therefore, in order to let the signal transfer speed of the long minimum connection of this embodiment be faster than that of a long-range connection composed of a series connection of some short HPILS's, the segment length of the long HPILS is required to be at least four times as long as that of the short HPILS.

While the above explanation has been given referring to an example (in which the number of lanes of the short HPIC 21 and the number of lanes of the long HPIC 22 are both 3 and the segment lengths of the short HPILS and the long HPILS are 3 tile widths and 18 tile widths respectively), the design of the reconfigurable device of the embodiment can be modified in various ways within the scope and spirit of the present invention.

The HPIW 20 shown in FIG. 10 has the follows general composition: The short HPIC 21 includes M lanes in the 1-tile shift structure. In each lane of the short HPIC 21, short HPILS's whose segment lengths are M tile widths are connected in series by the programmable switches 50-1. The function cell 10 of each tile is directly connected to M short HPILS's that run in the tile. The long HPIC 22 includes M lanes in the P-tile shift structure. In each lane of the long HPIC 22, long HPILS's whose segment lengths are N tile widths are connected in series by the programmable switches 50-2. The natural numbers M, N and P satisfy relationships: N=P·M and P≧4.

Each short HPILS is connected to a long HPILS through an inter-HPIC programmable switch 50-3. Any unit that is composed of M consecutive tiles has an inter-HPIC connection with every lane of the long HPIC 22. By such structure including a very small number of programmable switches and compact input/output selection switches, each function cell 10 is allowed to make access to all the interconnect line resources of the HPIW 20 and high-speed signal transfer is realized.

Further, the homogeneity of the short HPIC 21 and the quasi-homogeneity of the long HPIC 22 enables the implementation of a large-scale data path that passes substantially no connections (switches) between lines. By letting each function cell 10 (whether on the signal output side or on the signal input side) make access to the long HPIC 22 necessarily through the short HPIC 21, the number of lanes of the long HPIC 22 (whose usage frequency is low) can be decreased and the load capacitance on the long HPIC 22 can be reduced much.

Elimination of Complexity

Incidentally, in the example of FIG. 10 (see tiles 40-1, 40-2 and 40-3, for example), internal structure of a tile (positions of connection points between the function cell 10 and short HPILS's, position of a connection point between the inter-HPIC programmable switch 50-3 and a short HPILS, position of a connection point between the inter-HPIC programmable switch 50-3 and a long HPILS, position of the programmable switch 50-1, etc.) differs among the tiles 40.

Figure 12:
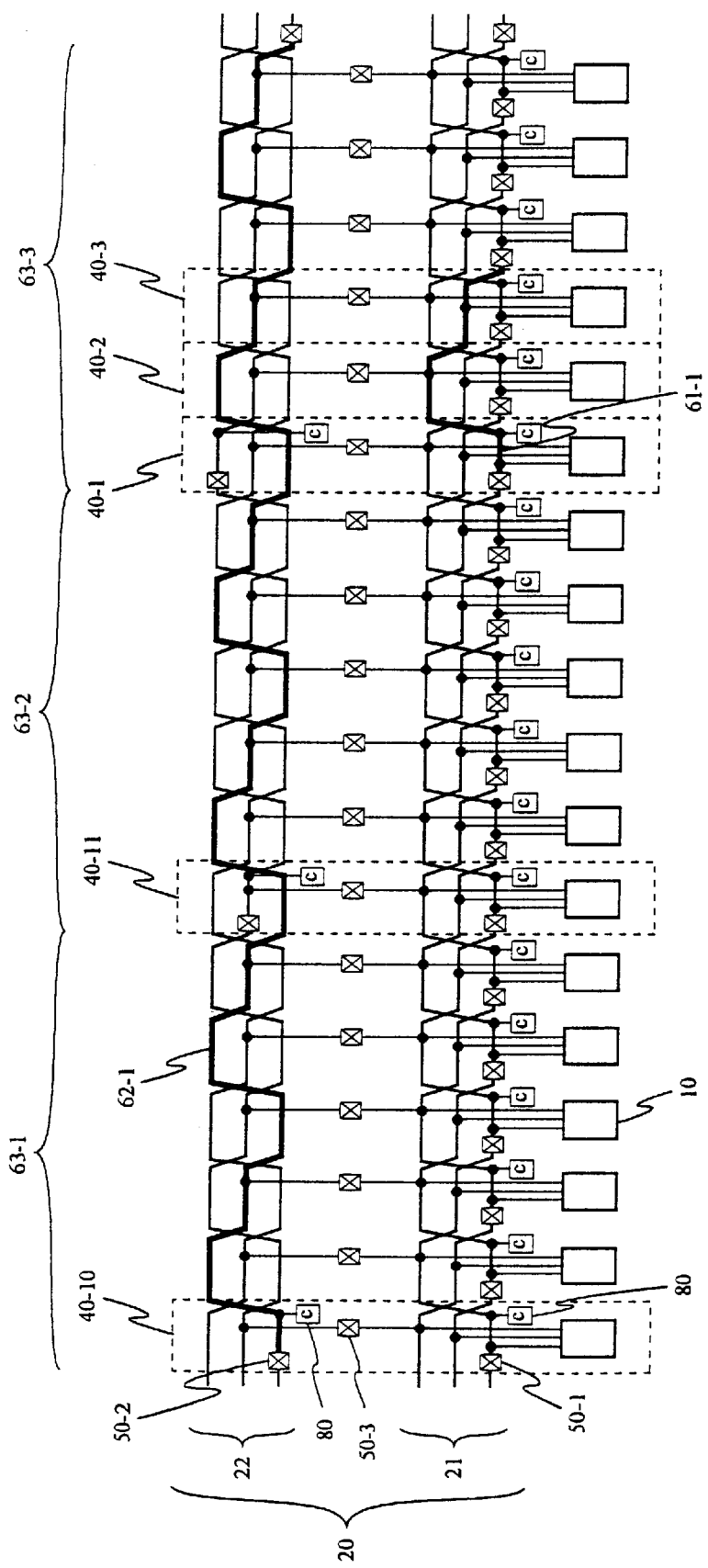
FIG. 12 is a circuit diagram showing a circuit which is obtained by conducting "rotation" to an area 71 shown in FIG. 10.

The apparent complexity can be eliminated by use of the following replacement which is called "rotation". FIG. 12 is a circuit diagram showing a circuit which is obtained by conducting the replacement to the area 71 shown in FIG. 10. In the example shown in FIG. 12, when the lowermost HPILS in an HPIC (short HPIC 21 or long HPIC 22) stretches from a tile to a right-hand adjacent tile, the HPILS moves to the top of the HPIC and becomes the uppermost HPILS. The movement of the HPILS's in the short HPIC 21 and the long HPIC 22 will hereafter be called "rotation", and such representation as shown in FIG. 12 will hereafter be called "rotation representation". By use of the rotation representation, internal structure of each tile (positions of the connection points, positions of programmable switches, etc.) can be uniformalized.

The rotation representation is beneficial not only for making a drawing but also for LSI designing, since the rotation representation clearly demonstrates that the circuit can be composed (implemented as an LSI) only by repeating and arranging the same hard macros. However, even in the rotation representation, slight irregularity occurs in the long HPIC 22 periodically. For example, the tiles 40-10, 40-11 and 40-21 shown in FIG. 12 include programmable switches 50-2 of the long HPIC 22, whereas other tiles include no programmable switches 50-2. Such irregularity occurs due to the quasi-homogeneity of the long HPIC 22 of the embodiment. Incidentally, for easy understanding of the aforementioned "movement", a short HPILS 61-1 and a long HPILS 62-1 are shown by thick lines in FIG. 12.

FIG. 12 is also showing new parts (constant logic level supply switches 80) which have not been shown in FIG. 10. The constant logic level supply switch 80 is capable of outputting signals of constant logic levels (high logic level signal or low logic level signal). The constant logic level supply switch 80 is also capable of changing its output terminal into high impedance status. The function of the constant logic level supply switch 80 can be selected and set programmably.

Generally, one or more programmable interconnect lines of a reconfigurable device can remain totally unused depending on the circuit that is implemented on the reconfigurable device. However, the existence of a line of undefined logic level (to which an output signal is supplied from nowhere) is not allowed in such a logic circuit. Therefore, in order to fix the logic levels of the unused programmable interconnect lines, every programmable interconnect line (short HPILS, long HPILS) shown in FIG. 12 is provided with a constant logic level supply switch 80.

The constant logic level supply switch 80 is programmably set to output a constant logic level when the programmable interconnect line (short HPILS, long HPILS) that is connected to its output terminal is unused. When the programmable interconnect line is used, the constant logic level supply switch 80 is programmably set to be in the high impedance status.

Constant Logic Level Supply Switch 80
[Constant Logic Level Supply Switch 80: Example #1]

Figure 13:
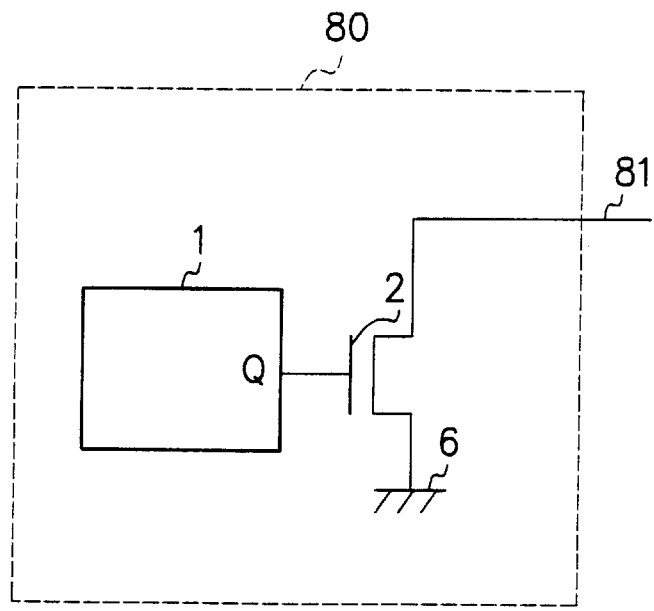
FIG. 13 is a circuit diagram showing the first example of a constant logic level supply switch of the reconfigurable device of FIG. 5.

FIG. 13 is a circuit diagram showing the first example of the constant logic level supply switch 80. The first example shown in FIG. 13 includes a 1-bit memory cell 1 and an N-MOS transistor 2. The data output terminal Q of the 1-bit memory cell 1 is connected to the gate of the N-MOS transistor 2. The source of the N-MOS transistor 2 is connected to a ground 6. The drain of the N-MOS transistor 2 is connected to the output terminal 81 of the constant logic level supply switch 80.

In the composition shown in FIG. 13, when the output terminal Q of the 1-bit memory cell 1 is HIGH, the low logic level is outputted from the output terminal 81 of the constant logic level supply switch 80. When the output terminal Q of the 1-bit memory cell 1 is LOW, the output terminal 81 of the constant logic level supply switch 80 becomes high impedance. In short, the first example shown in FIG. 13 is a constant logic level supply switch that outputs the low logic level as the constant logic level.
[Constant Logic Level Supply Switch 80: Example #2]

Figure 14:
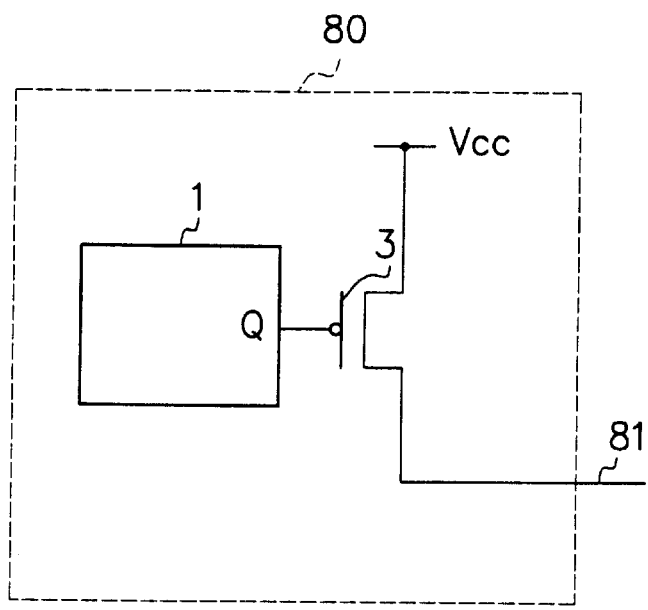
FIG. 14 is a circuit diagram showing the second example of the constant logic level supply switch.

FIG. 14 is a circuit diagram showing the second example of the constant logic level supply switch 80. The second example shown in FIG. 13 includes a 1-bit memory cell 1 and a P-MOS transistor 3. The data output terminal Q of the 1-bit memory cell 1 is connected to the gate of the P-MOS transistor 3. Power supply voltage Vcc is supplied to the source of the P-MOS transistor 3. The drain of the P-MOS transistor 3 is connected to the output terminal 81 of the constant logic level supply switch 80.

In the composition shown in FIG. 14, when the output terminal Q of the 1-bit memory cell 1 is LOW, the high logic level is outputted from the output terminal 81 of the constant logic level supply switch 80. When the output terminal Q of the 1-bit memory cell 1 is HIGH, the output terminal 81 of the constant logic level supply switch 80 becomes high impedance. In short, the second example shown in FIG. 14 is a constant logic level supply switch that outputs the high logic level as the constant logic level.

Referring again to the programmable interconnect network of FIG. 12, each of the tiles 40-10, 40-11 and 40-1 includes a programmable switch 50-2 of the long HPIC 22, however, the line to which the programmable switch 50-2 is connected varies among the tiles (lowermost in the tile 40-10, middle in the tile 40-11, and uppermost in the tile 40-1). In such cases where there are various types of tiles (in which the position of the programmable switch 50-2 is diverse), many hard macros become necessary for the implementation as an LSI and takes time and effort. However, the above variations in the tile structure are not caused by the quasi-homogeneity of the long HPIC 22 of the embodiment.

Other Examples of HPIW 20
[HPIW 20: Example #2]

Figure 15:
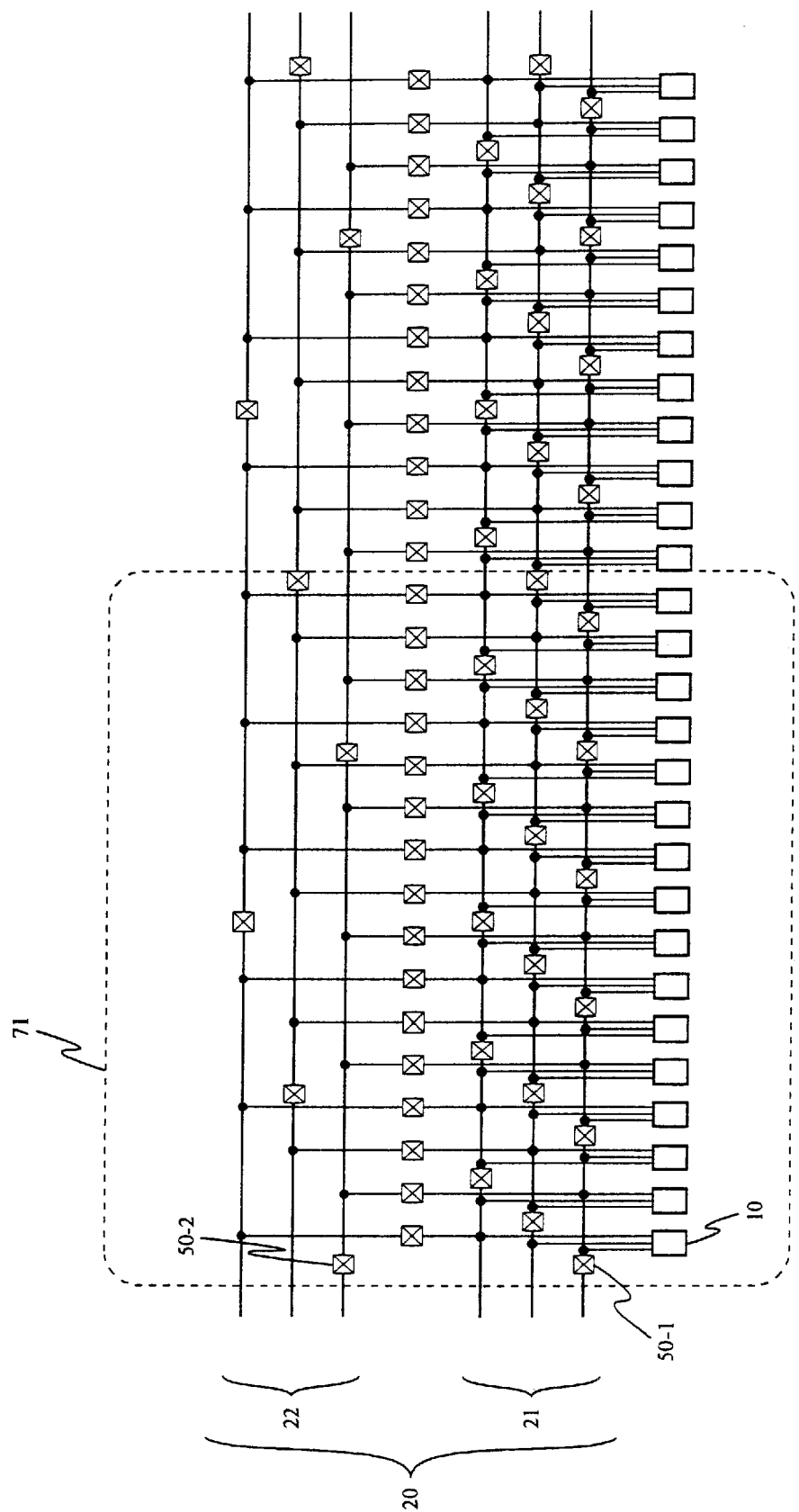
FIG. 15 is a circuit diagram showing the second example of the HPIW in accordance with the embodiment of the present invention.

In the following, another example of the HPIW 20 which can be employed in the reconfigurable device of the embodiment will be explained referring to FIG. 15. FIG. 15 is a circuit diagram showing the second example of the HPIW 20. In the HPIW 20 shown in FIG. 15, the shift width P in the long HPIC 22 is set to 4 tile widths, and the segment length N of the long HPILS is set to 12 tile widths.

Figure 16:
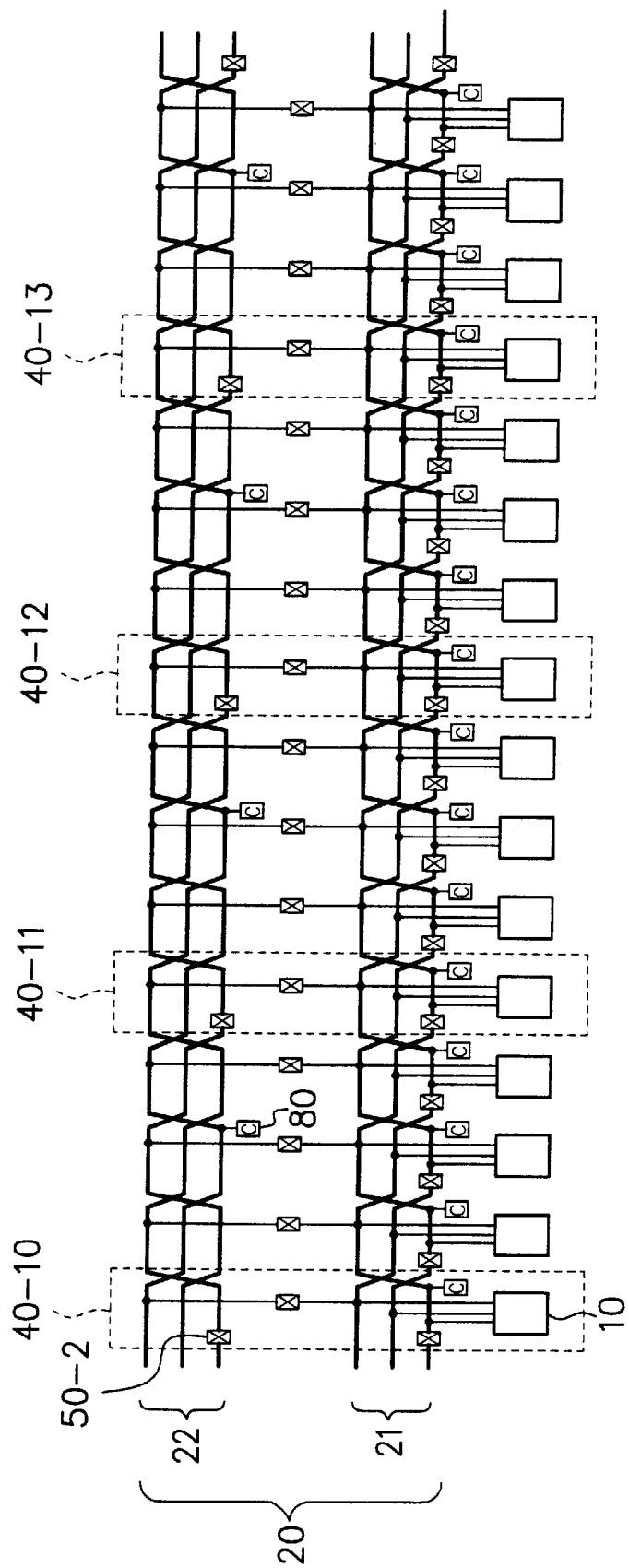
FIG. 16 is a circuit diagram depicting the area 71 shown in FIG. 15 in "rotation representation"

FIG. 16 is a circuit diagram depicting the area 71 shown in FIG. 15 in the rotation representation. As clearly shown in FIG. 16, in each of the tiles 40-10, 40-11, 40-12 and 40-13 containing the programmable switches 50-2 of the long HPIC 22, the programmable switch 50-2 is connected to the lowermost line without exception.

Summary of Examples #1 and #2 of HPIW 20

As shown in FIG. 16, even though the long HPIC 22 is designed to have the P-tile shift structure (P>1), the structure of the tiles containing the programmable switches 50-2 of the long HPIC 22 can be uniformalized.

The above uniformity (lowermost, for example) of the line to which the programmable switch 50-2 is connected can be attained if and only if M (the number of lanes of the long HPIC 22) and P (the shift width in the long HPIC 22) are relatively prime.

Incidentally, while the constant logic level supply switches 80 which have been shown in FIG. 12 are contained in tiles that contain the programmable switches 50-2, the constant logic level supply switches 80 can also be placed differently. Each ILS has to be provided with a constant logic level supply switch 80, however, the position of the constant logic level supply switch 80 is not important. Therefore, the constant logic level supply switches 80 and the programmable switches 50-2 are placed in different tiles in FIG. 16.

The constant logic level supply switches 80 in the long HPIC 22 are generally placed periodically (in every P tiles)

similarly to the programmable switches 50-2. In such composition, the same discussion as that about the programmable switches 50-2 holds about the tiles containing the constant logic level supply switches 80, that is, the necessary and sufficient condition for the aforementioned "uniformity" of the tiles containing the constant logic level supply switches 80 of the long HPIC 22 (in the sense that the constant logic level supply switch 80 of the long HPIC 22 can be connected to the same line in every tile containing the constant logic level supply switch 80) is the relative primeness between M (the number of lanes of the long HPIC 22) and P (the shift width in the long HPIC 22).

[HPIW 20: Example #3]

Figure 17:
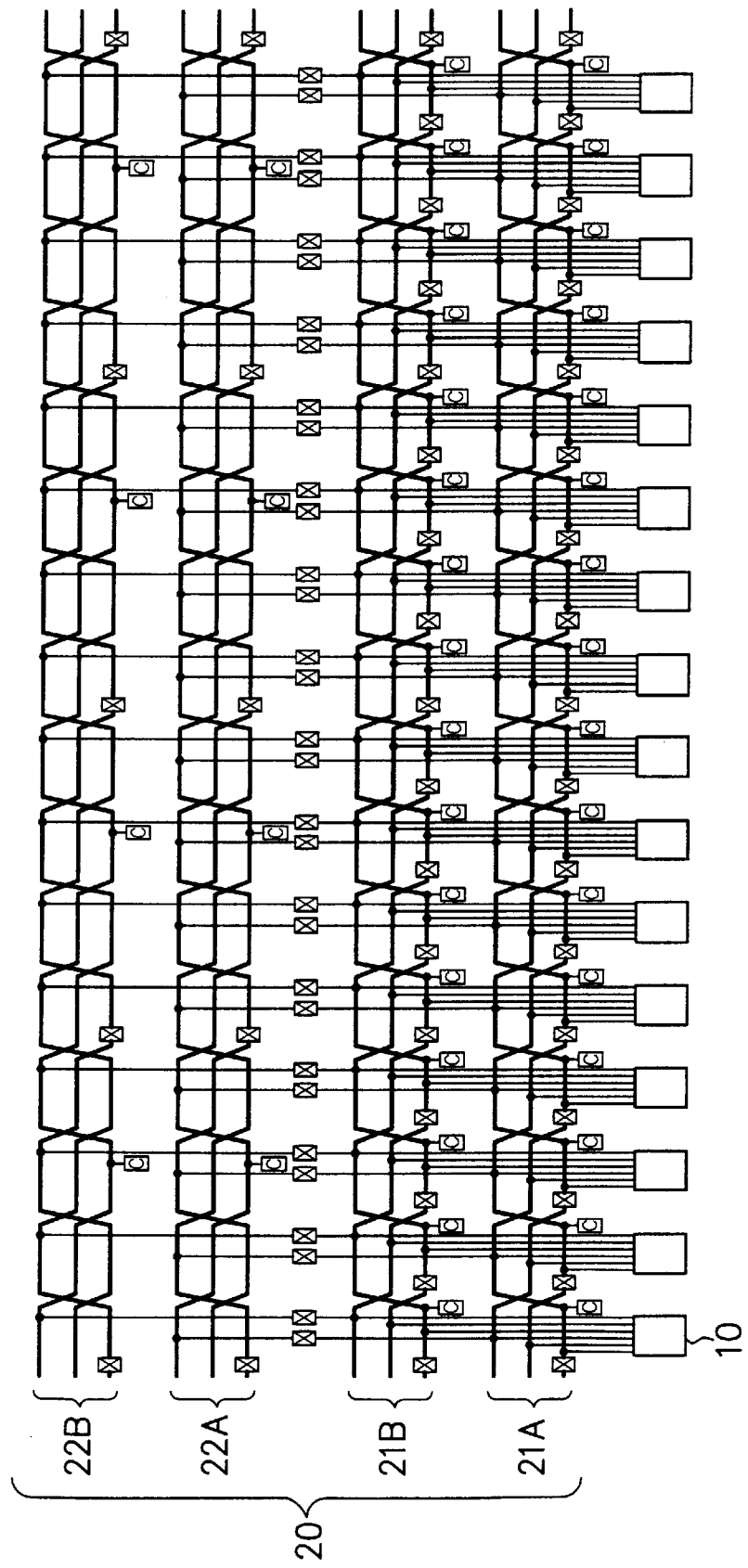
FIG. 17 is a circuit diagram showing the third example of the HPIW in accordance with the embodiment of the present invention.

In the following, the third example of the HPIW 20 which can be employed in the reconfigurable device of the embodiment will be explained referring to FIG. 17. FIG. 17 is a circuit diagram showing the third example of the HPIW 20. The HPIW 20 of the third example is composed of two or more HPIWs 20 of the example #1 (or #2) which are arranged in parallel. Hereafter, each HPIW included in the HPIW 20 of the third example shown in FIG. 17 will be referred to as "sub-HPIW". The function cells 10 shown in FIG. 17 are connected to all the sub HPIWs.

The HPIW 20 shown in FIG. 17 includes a first sub-HPIW and a second sub-HPIW. The first sub-HPIW includes a first short HPIC 21A, a first long HPIC 22A, and a first inter-HPIC connection for connecting the first short HPIC 21A and the first long HPIC 22A. The second sub-HPIW includes a second short HPIC 21B, a second long HPIC 22B, and a second inter-HPIC connection for connecting the second short HPIC 21B and the second long HPIC 22B. Each function cell 10 is directly connected to the first short HPIC 21A and the second short HPIC 21B.

While two sub-HPIWs are provided to the HPIW 20 of FIG. 17, the number of sub-HPIWs in the HPIW 20 can of course be changed depending on design requirements. Such HPIWs 20 of different composition can also be constructed similarly to the HPIW 20 of FIG. 17. By the HPIW 20 of the third example, the interconnect line resources can be increased several-fold, therefore, routability can be improved in comparison with the first example.

[HPIW 20: Example #4]

Figure 18:
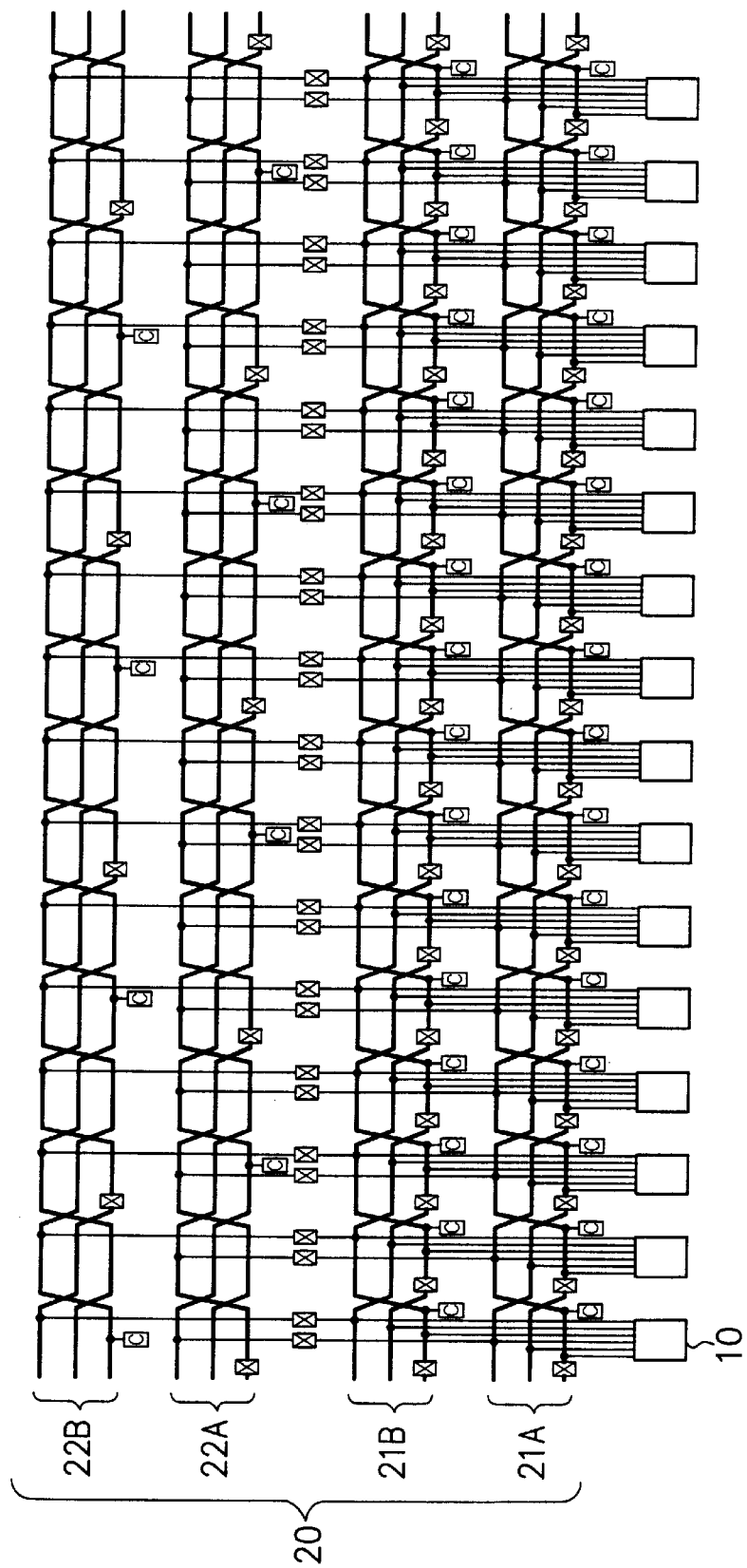
FIG. 18 is a circuit diagram showing the fourth example of the HPIW in accordance with the embodiment of the present invention.

In the following, the fourth example of the HPIW 20 which can be employed in the reconfigurable device of the embodiment will be explained referring to FIG. 18. FIG. 18 is a circuit diagram showing the fourth example of the HPIW 20. In the HPIW 20 of the fourth example, the horizontal positions of the first long HPIC 22A and the second long HPIC 22B in the above example #3 are shifted from each other.

The HPIW 20 shown in FIG. 18 includes a first sub-HPIW and a second sub-HPIW similarly to the HPIW 20 of the example #3. The first sub-HPIW includes a first short HPIC 21A, a first long HPIC 22A, and a first inter-HPIC connection for connecting the first short HPIC 21A and the first long HPIC 22A. The second sub-HPIW includes a second short HPIC 21B, a second long HPIC 22B, and a second inter-HPIC connection for connecting the second short HPIC 21B and the second long HPIC 22B. Each function cell 10 is directly connected to the first short HPIC 21A and the second short HPIC 21B. The second long HPIC 22B is shifted to the right for two tile widths relative to the first long HPIC 22A.

As mentioned before, the long HPIC 22 can not be perfectly homogeneous for each function cell 10. If the two or more long HPICs (22A, 22B) are placed at the same horizontal position as in the third example, connections (programmable switches 50-2) in the long HPICs are also placed at the same horizontal positions, by which the above inhomogeneity is not eliminated. On the other hand, if the two or more long HPICs (22A, 22B) are shifted from each other in the horizontal direction as in the fourth example, connections (programmable switches 50-2) in the long HPICs can be dispersed to different horizontal positions and thereby higher homogeneity can be obtained.

When L long HPICs having the P-tile shift structure are arranged in parallel, the homogeneity generally becomes the highest when the horizontal shift width between adjacent two long HPICs is set to P/L tile widths.

[HPIW 20: Example #5]

Figure 19:
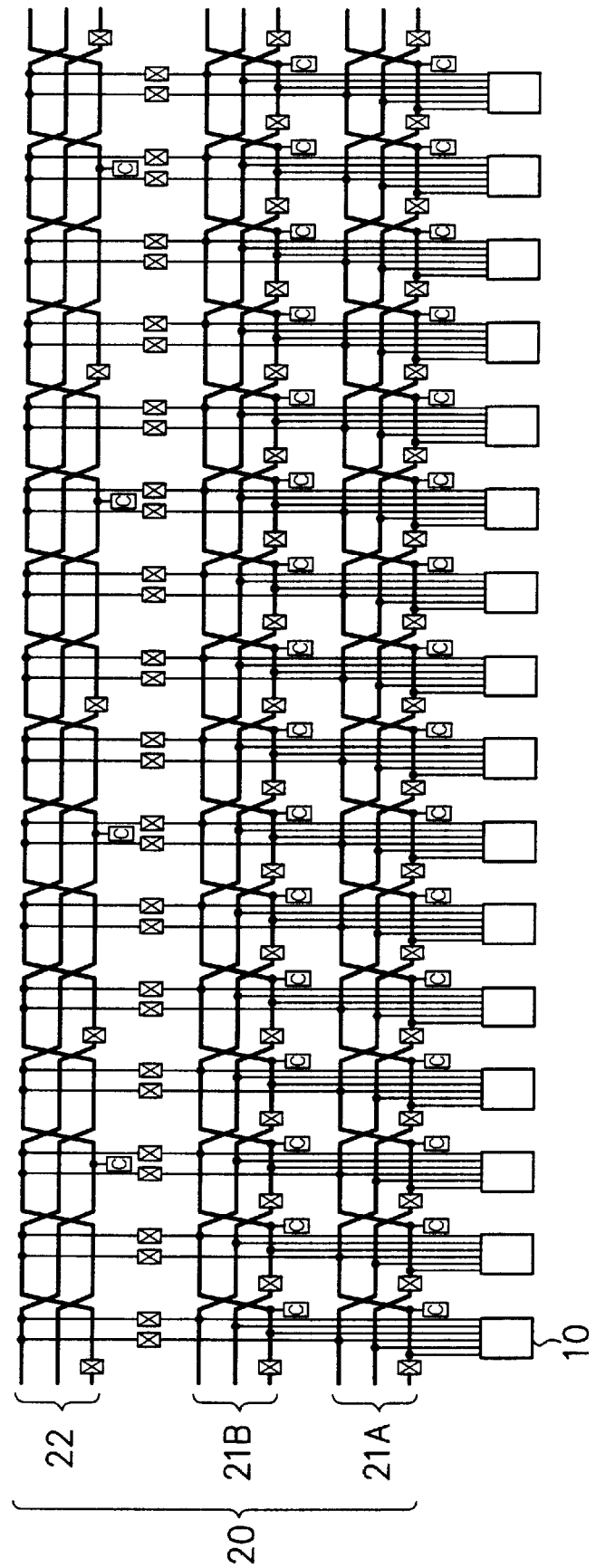
FIG. 19 is a circuit diagram showing the fifth example of the HPIW in accordance with the embodiment of the present invention.

In the following, the fifth example of the HPIW 20 which can be employed in the reconfigurable device of the embodiment will be explained referring to FIG. 19. FIG. 19 is a circuit diagram showing the fifth example of the HPIW 20. In the HPIW 20 of the fifth example, the number of the long HPICs are set smaller than that of the short HPICs.

The HPIW 20 shown in FIG. 19 includes a first short HPIC 21A, a second short HPIC 21B and a long HPIC 22. Each short HPIC (21A, 21B) is connected to the long HPIC 22 through inter-HPIC connections. Each function cell 10 is directly connected to the first short HPIC 21A and the second short HPIC 21B.

As mentioned before, the usage frequency of a long HPIC is generally lower than that of a short HPIC, therefore, only the number of short HPICs is increased in the fifth example shown in FIG. 19, thereby increase of almost needless line resources can be avoided.

[HPIW 20: Example #6]

Figure 20:
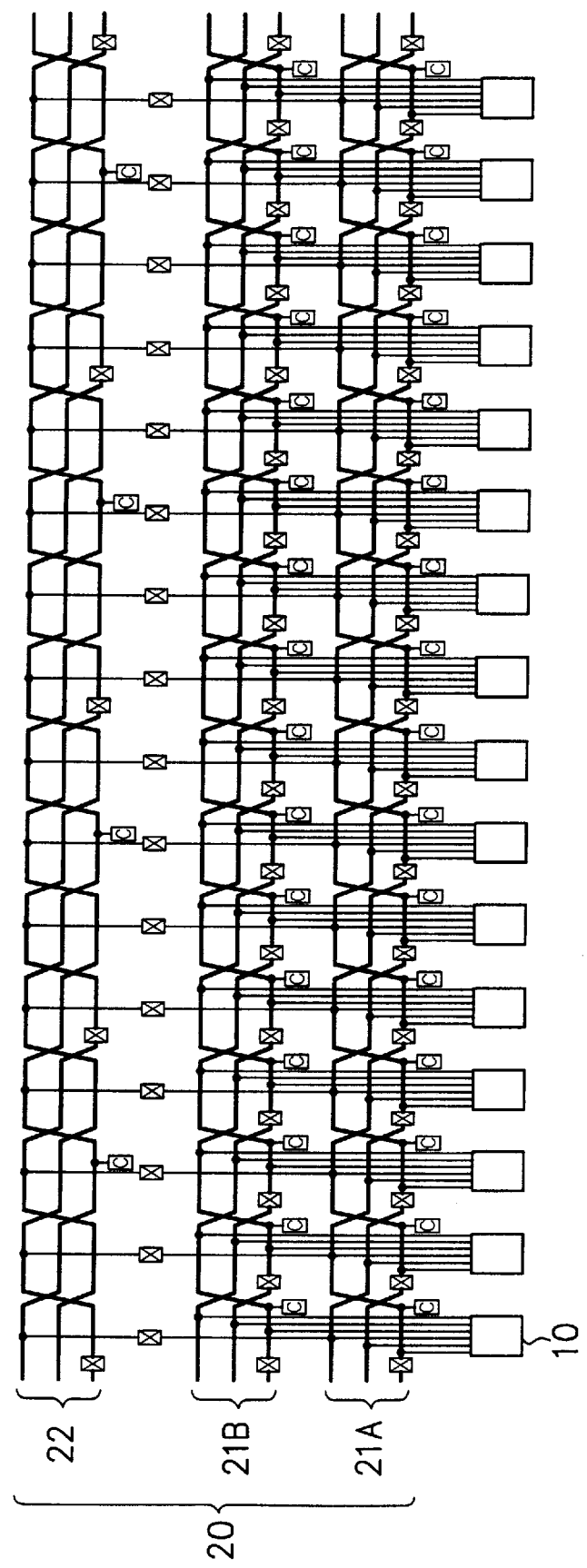
FIG. 20 is a circuit diagram showing the sixth example of the HPIW in accordance with the embodiment of the present invention.

In the following, the sixth example of the HPIW 20 which can be employed in the reconfigurable device of the embodiment will be explained referring to FIG. 20. FIG. 20 is a circuit diagram showing the sixth example of the HPIW 20. In the HPIW 20 of the sixth example, at least one of the two or more short HPICs of the HPIW 20 of the example #5 shown in FIG. 19 is designed not to have the inter-HPIC connection to the long HPIC 22.

The HPIW 20 shown in FIG. 20 includes a first short HPIC 21A, a second short HPIC 21B and a long HPIC 22. Each function cell 10 is directly connected to the first short HPIC 21A and the second short HPIC 21B. The first short HPIC 21A is connected to the long HPIC 22 through the inter-HPIC connections, whereas the second short HPIC 21B is not connected to the long HPIC 22.

Since the inter-HPIC connections are not provided between the second short HPIC 21B and the long HPIC 22, load capacitance on the second short HPIC 21B and load capacitance on the long HPIC 22 can be reduced in comparison with the example #5 of FIG. 19, thereby signal transfer speed can be increased. Further, the circuit size can be reduced due to the decrease of the number of the inter-HPIC programmable switches 50-3 used for the inter-HPIC connection.

[HPIW 20: Example #7]

Figure 21:
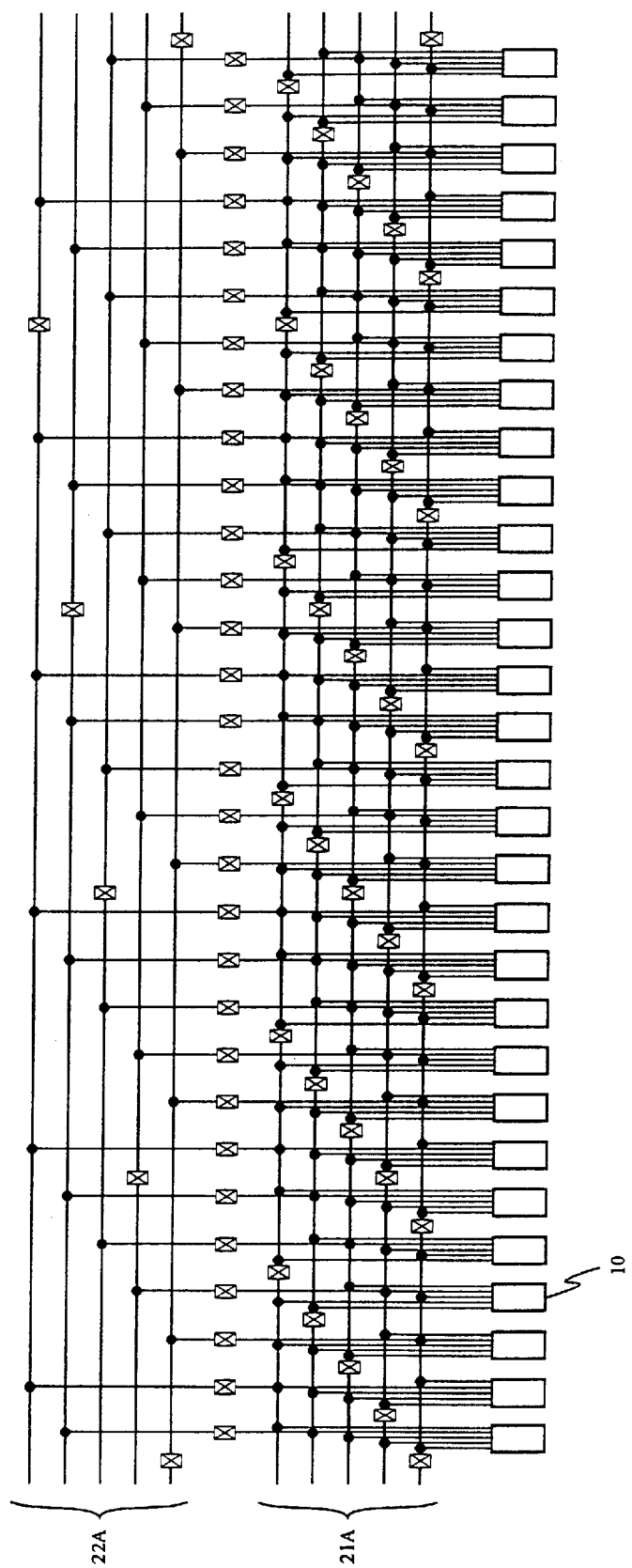
FIG. 21 is a circuit diagram showing a first sub-HPIW which is included in the seventh example of the HPIW in accordance with the embodiment of the present invention.

In the following, the seventh example of the HPIW 20 which can be employed in the reconfigurable device of the embodiment will be explained referring to FIG. 21. The HPIW 20 of the seventh example is designed to have two or more sub-HPIWs of different structure. FIG. 21 is a circuit diagram showing a first sub-HPIW which is included in the HPIW 20 of the seventh example.

The first sub-HPIW shown in FIG. 21 includes a first short HPIC 21A, a first long HPIC 22A, and an inter-HPIC connection for connecting the first short HPIC 21A and the first long HPIC 22A. The first short HPIC 21A includes five lanes in the 1-tile shift structure. The segment length in the first short HPIC 21A is 5 tile widths. The first long HPIC 22A includes five lanes in the 6-tile shift structure. The segment length in the first long HPIC 22A is 60 tile widths. The first short HPIC 21A and the first long HPIC 22A are connected together by inter-HPIC connections (one inter-HPIC programmable switch 50-3 per tile).

Figure 22:
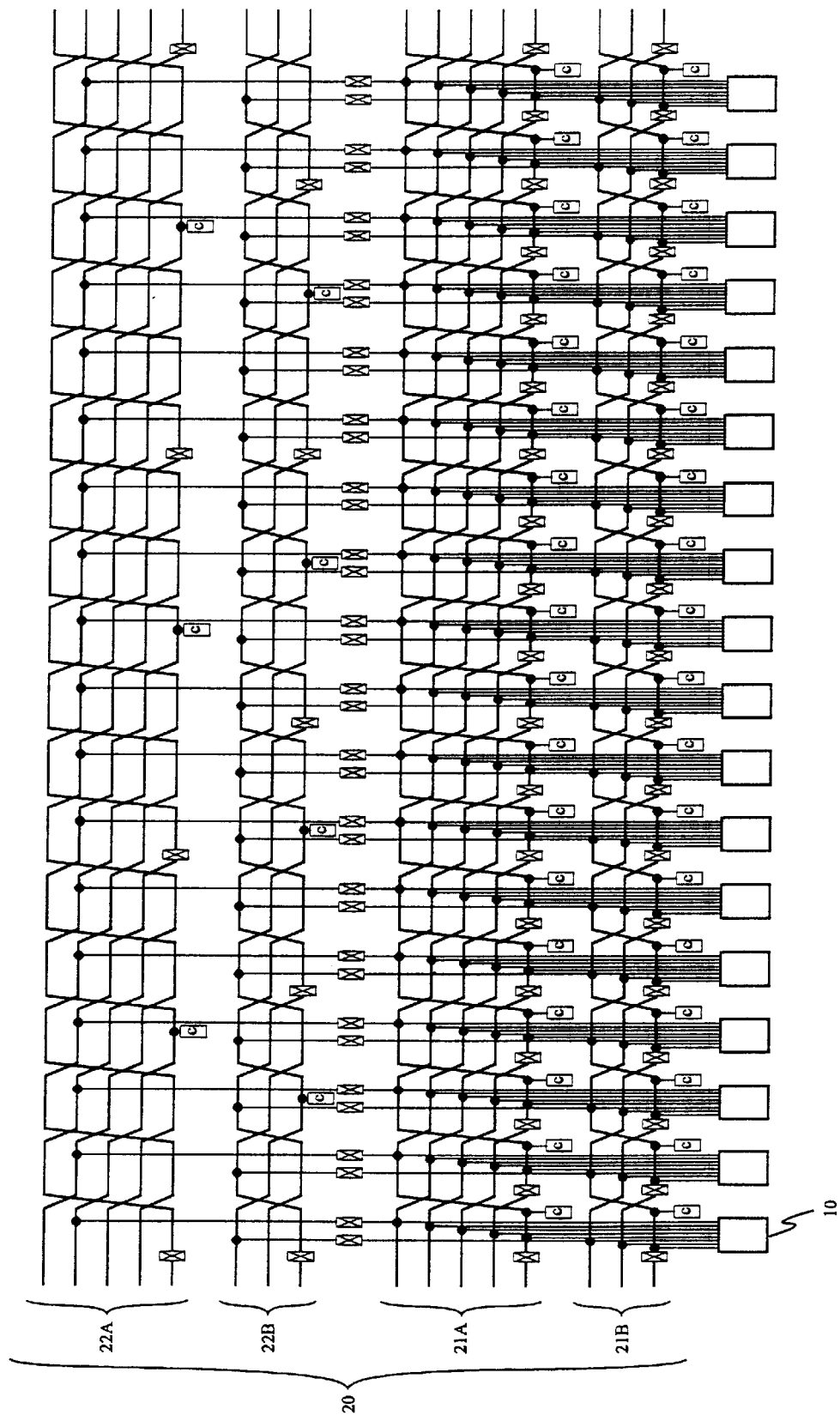
FIG. 22 is a circuit diagram showing the seventh example of the HPIW in the rotation representation.

FIG. 22 is a circuit diagram showing the seventh example of the HPIW 20 in the rotation representation. The HPIW 20 shown in FIG. 22 includes the first sub-HPIW (including the first short HPIC 21A, the first long HPIC 22A and the inter-HPIC connection between them) which has been shown in FIG. 21 and a second sub-HPIW (including a second short HPIC 21B, a second long HPIC 22B and an inter-HPIC connection between them) having the same structure as the example #2 which has been shown in FIG. 16.

In the composition shown in FIG. 22, each function cell 10 is directly connected to the first short HPIC 21A and the second short HPIC 21B. The seventh example of the HPIW 20 shown in FIG. 22 includes two or more sub-HPIWs of different segment lengths, thereby provision of interconnect line resources of diversified lengths is made possible. Therefore, the HPIW 20 of the seventh example enables the implementation of more diverse application circuits in comparison with the previous examples.

While the examples #3~#7 of the HPIW 20 have been explained above referring to figures, the composition of the examples can of course be modified according to design requirements etc. Especially, the number of sub-HPIWs, the segment length of the short HPIC, the shift width P in the long HPIC, etc. are not limited to those in the above examples and can be changed appropriately.

ALU (Arithmetic and Logic Unit)

Generally, in a large-scale circuit, data paths (for processing data of multiple bits) tend to occupy a larger area than random logic circuits. The area ratio of the data paths in the large-scale circuit becomes especially high when computer application is mapped on the large-scale circuit as in the case of reconfigurable computing. In such multiple-bit data processing, the number of bits of data to be handled is almost limited to integral multiples of a typical bit number (8, for example).

Figure 23:
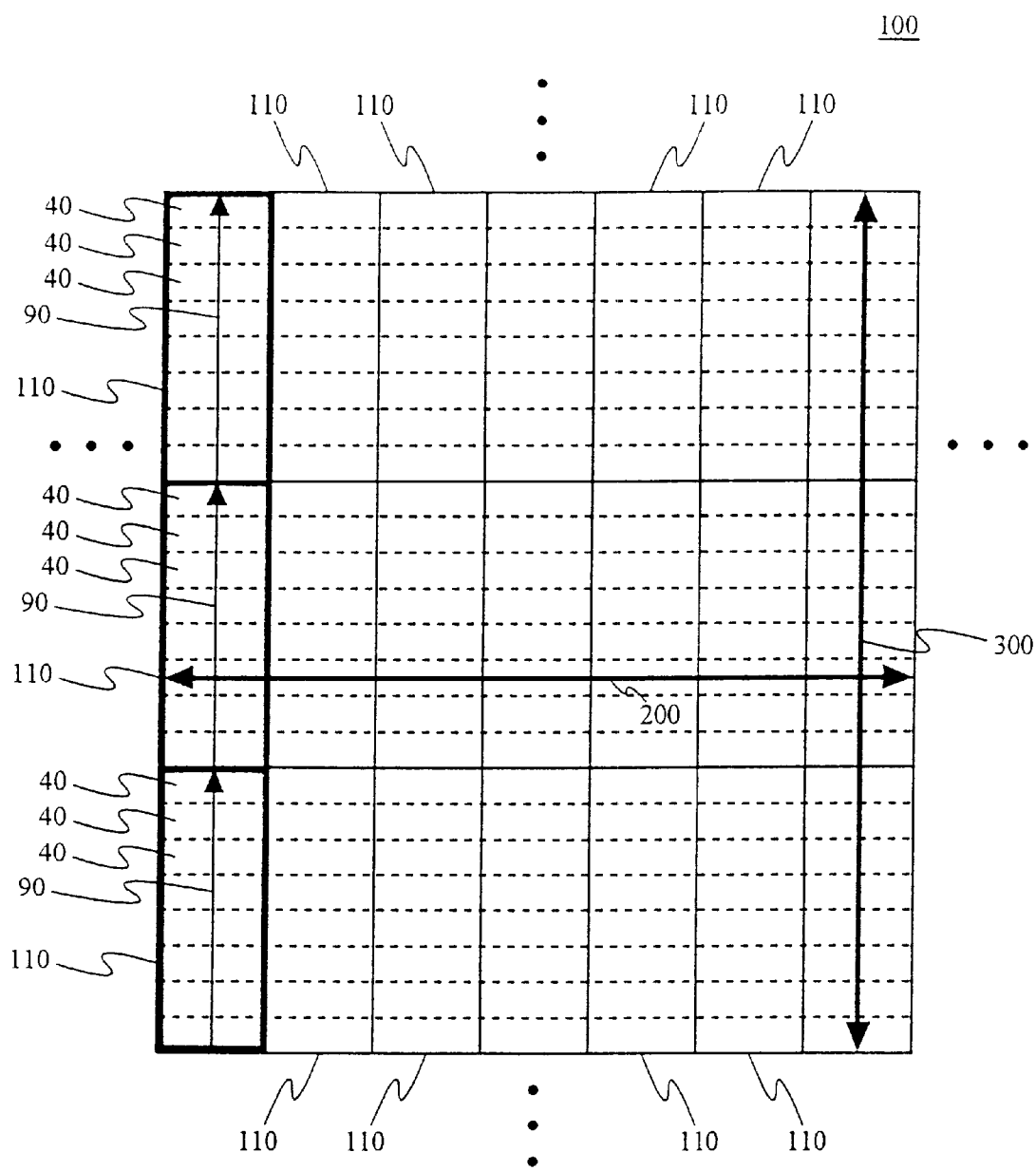
FIG. 23 is a schematic diagram showing the relationship among "tiles", "signal processing units" and the reconfigurable device.

In order to implement such a circuit (including data paths) by a reconfigurable device efficiently, it is preferable and effective that a data path is constructed as a combination of signal processing units 110 which are shown in FIG. 23. FIG. 23 is a schematic diagram showing the relationship among tiles 40, the signal processing units 110 and the reconfigurable device 100. Referring to FIG. 23, out of the two-dimensional array of the tiles 40 of the reconfigurable device 100 (Only part of the reconfigurable device 100 is shown in FIG. 23.), each block which is composed of T (T: aforementioned "typical bit number") contiguous tiles 40 is regarded as the signal processing unit 110. In the example of FIG. 23, a signal processing unit 110 is composed of 8 tiles. A circuit including data paths can be implemented efficiently by constructing each data path as a combination of such signal processing units 110.

Hereafter, such a signal processing unit 110 will be called "ALU (Arithmetic and Logic Unit) 110". In FIG. 23, ALUs 110 in the leftmost column are shown by thick lines for easy understanding.

Each ALU 110 shown in FIG. 23 is composed of 8 contiguous tiles 40 which are aligned vertically. The vertical direction (shown by an arrow 300 in FIG. 23) in which the tiles 40 of an ALU 110 are aligned will be referred to as "bit direction", and the horizontal direction (shown by an arrow 200 in FIG. 23) perpendicular to the bit direction will be referred to as "data direction".

The ALU 110 shown in FIG. 23 is designed as a block in which part of input signals and/or configuration memory are shared among function cells 10 therein, therefore, the ALU 110 of this embodiment is constructed more compactly in comparison with cases where the function cells 10 are totally independent of each other.

In each ALU 110, a carry signal 90 is transferred from the lowermost tile 40 to the uppermost tile 40. Concrete examples of such ALUs have been disclosed in Japanese Patent Application Laid-Open No.HEI11-353152 (referred to as "prior art #6"). The ALU 110 shown in FIG. 23 extends in the bit direction, therefore, when data transfer between adjacent ALUs 110 is executed, data transfer in the bit direction (vertical direction) costs more than data transfer in the data direction (horizontal direction) both in size and delay.

In order to resolve the problem and configure an efficient data path, data transfer in the bit direction has to be reduced as much as possible.

In the programmable interconnect network shown in FIG. 5, demand for the VPIW 30 running in the bit direction is generally lower than that for the HPIW 20 running in the data direction, therefore, enough transmission efficiency can be secured by use of limited interconnect line resources. In data transfer in the data direction (in which data processing is generally conducted by successively transferring data through nearby computing elements), high homogeneity is required.

The HPIWs 20 in accordance with the embodiment of the present invention can suitably be employed for meeting such requirements. However, in the bit direction, signal processing is usually executed in units of ALUs. Therefore, a suitable VPIW 30 is required for the employment of the HPIW 20 of the present invention.

Vertical Programmable Interconnect Way (VPIW) 30

[VPIW 30: Example #1]

Figure 24:
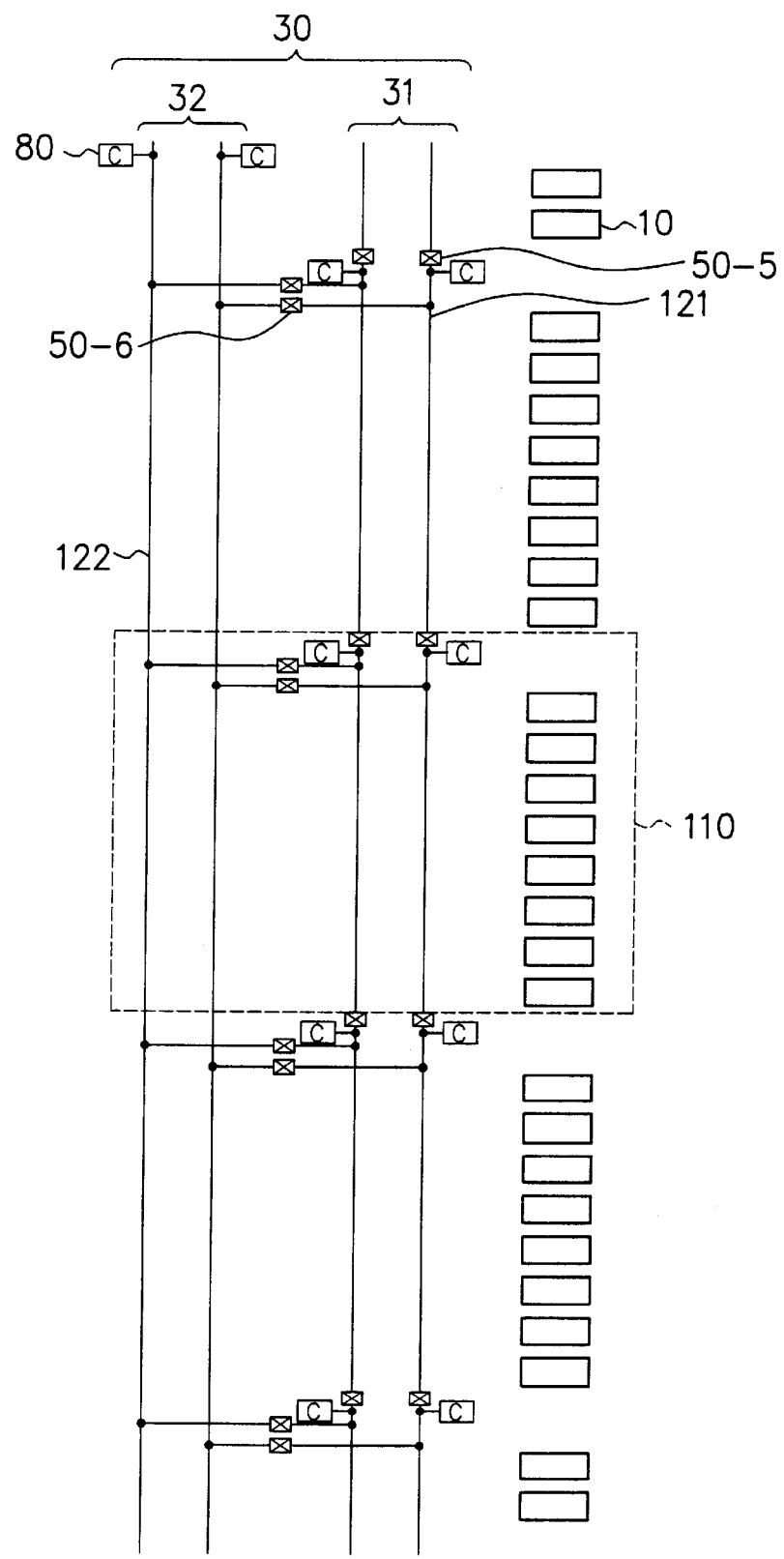
FIG. 24 is a circuit diagram showing the first example of a VPIW (Vertical Programmable Interconnect Way) in accordance with the embodiment of the present invention.

FIG. 24 is a circuit diagram showing the first example of the VPIW 30 in accordance with the embodiment of the present invention. The VPIW 30 shown in FIG. 24 is designed to meet the above requirements. In FIG. 24, function cells 10 (in a column of the two-dimensional array shown in FIG. 5) and a VPIW 30 corresponding to the column are shown. For the sake of easy understanding, the HPIWs 20, connections between the VPIW 30 and the function cells 10, etc. are not shown in FIG. 24.

The VPIW 30 shown in FIG. 24 at least includes a short vertical programmable interconnect channel 31 and a long vertical programmable interconnect channel 32, and each vertical programmable interconnect channel (31, 32) includes one or more lanes.

Each lane is composed of a sequence of ILS's which are connected in series by programmable switches. Incidentally, the long vertical programmable interconnect channel 32 can also be implemented by global lines which extend from the top to the bottom of the reconfigurable device with no programmable switches. In the following explanation, the "vertical programmable interconnect channel" will be abbreviated as "VPIC", and each ILS in the VPIC will be expressed as "VPILS".

In the first example of the VPIW 30 shown in FIG. 24, the short VPIC 31 includes two lanes. Each lane of the short VPIC 31 includes short VPILS's 121 (segment length: 1 ALU length) which are connected series in the bit direction (vertical direction) by programmable switches 50-5. The long VPIC 32 includes two lanes. Each lane of the long VPIC 32 includes long VPILS's 122 whose segment length is longer enough than that of the short VPILS 121.

The dotted box 110 shown in FIG. 24 denotes a signal processing unit for the aforementioned multiple-bit data processing (that is, an example of an ALU). The first example of the VPIW 30 has the sector structure (in which the short VPIC 31 has connections at the boundaries of the ALUs 110). Such block-like interconnect line structure corresponding to the ALUs 110 is suitable for the signal processing in units of ALUs 110.

Each short VPILS 121 is connected to a long VPILS 122 through an inter-VPIC programmable switch 50-6. Such connection will hereafter be called "inter-VPIC connection". Each VPILS (121, 122) is provided with a constant logic level supply switch 80. The connection between the VPIW 30 and the function cells 10 will be explained later.

[VPIW 30: Example #2]

In the following, the second example of the VPIW 30 which can be employed in the reconfigurable device of the embodiment will be explained referring to FIG. 25. FIG. 25 is a circuit diagram showing the second example of the VPIW 30. The VPIW 30 shown in FIG. 25 has the shift structure. Concretely, one of the two lanes of the short VPIC 31 of the VPIW 30 of the example #1 shown in FIG. 24 is shifted upward for half the ALU length. According to the shift, the inter-VPIC connection (inter-VPIC programmable switch 50-6) and the constant logic level supply switch 80 for each of the shifted short VPILS's 121 are also shifted upward, however, the provision of an inter-VPIC connection and a constant logic level supply switch 80 to each short VPILS 121 has not changed from the example #1 shown in FIG. 24.

Due to the shift structure of the VPIW 30 of the second example, a seamless short VPILS 121 is provided to each ALU boundary, therefore, high-speed inter-ALU signal transfer in the bit direction (vertical direction) is also made possible. Further, a seamless short VPILS 121 extending from the uppermost tile to the lowermost tile of an ALU is provided to each ALU, therefore, the VPIW 30 of the second example can also suitably cope with signal processing in each ALU.

It is generally preferable that the segment length of the short VPILS 121 is set to an integral multiple of the ALU length in the bit direction, and the segment length of the long VPILS 122 should be set longer enough than that of the short VPILS 121. Similarly to the case of the HPIW 20, the long VPILS 122 can be made access to through a short VPILS 121 only, and thus it is preferable that the segment length of the long VPILS 122 is set to four short VPILS segment lengths or more.

The usage frequency of the lines in the vertical direction is generally lower than that of lines in the horizontal direction as mentioned before, therefore, the number of lanes (K) of the short VPIC 31 should be set smaller than the number of lanes (M) of the short HPIC 21. Further, the usage frequency of long lines is generally lower than that of short lines as mentioned before, therefore, the number of lanes of the long VPIC 32 should be set to K or less.

Each short VPILS 121 is connected to a long VPILS 122 through an inter-VPIC connection in the example of FIG. 25, however, when the number of lanes of the long VPIC 32 is set smaller than that of the short VPIC 31, two or more lanes of the short VPIC 31 can also be connected to a lane of the long VPIC 32 by two or more inter-VPIC connections.

It is preferable the short VPIC 31 has at least one lane in which each short VPILS 121 extends from the uppermost tile to the lowermost tile of an ALU, that is, the programmable switches 50-5 in the lane of the short VPIC 31 should be placed at the boundaries of the ALUs 110.

Two-dimensional Array including HPIWs 20 and VPIWs 30

FIG. 26 is a circuit diagram showing a two-dimensional array including a plurality of HPIWs 20 and VPIWs 30 in accordance with the embodiment of the present invention. In FIG. 26, six HPIWs 20-1~20-6 and five VPIWs 30-1~30-5, function cells 10, and connections between them are shown. The constant logic level supply switch 80 are not shown in FIG. 26 for the sake of simplicity.

In the two-dimensional array shown in FIG. 26, the HPIW 20 of the fifth example which has been shown in FIG. 19 and the VPIW 30 of the first example which has been shown in FIG. 24 are employed. At the bottom of FIG. 26, examples of tiles 40 (40-1~40-5 surrounded by dotted boxes) are shown.

In the composition shown in FIG. 26, each short VPILS 121 of the short VPIC 31 is connected to one short HPILS (selected from the short HPILS's intersecting the short VPILS 121) through an intersection programmable switch 55 in each row of the two-dimensional array. Such connection will hereafter be called "intersection connection". For example, a short VPILS 121-1 of a short VPIC 31 shown in FIG. 26 has an intersection connection with a short HPILS of a short HPIC 21A in each row of the two-dimensional array, and another short VPILS 121-2 of the short VPIC 31 shown in FIG. 26 has another intersection connection with a short HPILS of a short HPIC 21B in each row of the two-dimensional array.

Figure 27:
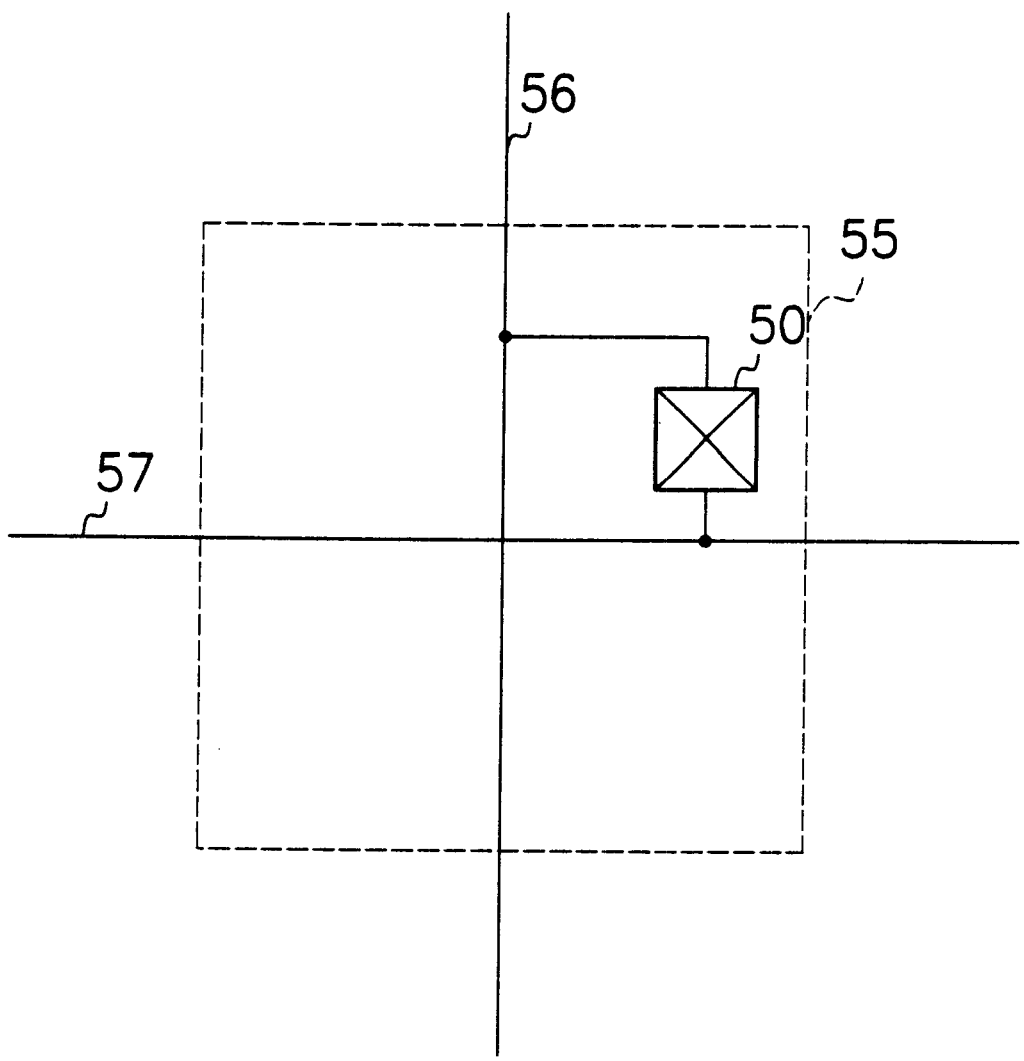
FIG. 27 is a circuit diagram showing an example of the internal composition of an intersection programmable switch which is shown in FIG. 26.

FIG. 27 is a circuit diagram showing an example of the internal composition of the intersection programmable switch 55 which is shown in FIG. 26. The intersection programmable switch 55, which is placed at the intersection of a line 57 in the horizontal direction and a line 56 in the vertical direction, connects/disconnects the connection between the lines 56 and 57 by use of a programmable switch 50. Therefore, each function cell 10 shown in FIG. 26 is allowed to make access to a short VPIC 31 through a short HPILS and an intersection connection which is implemented by the intersection programmable switch 55.

In conventional FPGAs, direct connection were provided between function cells and VPICs in addition to the intersection connections between HPICs and VPICs. However, the segment length of the short VPILS 121 in the embodiment of the present invention is the ALU length (8 tile lengths, for example) or more, therefore, load capacitance on the short VPILS 121 is necessitated to be very large if direct connection is provided between the short VPILS 121 and every function cell 10 of the tiles 40 intersecting the short VPILS 121 as in the prior art. Further, if the direct connection with the function cells 10 is provided to both the short HPIC 21 and the short VPIC 31, the input/output selection switches of the function cell 10 are necessitated to be large, and thus such composition involves penalties both in size and delay.

As explained above, the provision of many direct connections with the function cells 10 widely increases the circuit area, whereas signal transfer speed is not improved much against expectations. On the other hand, in an interconnect line structure in which a function cell 10 is allowed to make access to a short VPIC 31 through a short HPIC 21 only (such as the two-dimensional array of the embodiment shown in FIG. 26), enough connectability can be secured by use of a small number of programmable switches and compact input/output selection switches. Further, the short VPIC 31 of the embodiment has lighter load capacitance, therefore, signal transfer of higher speed in comparison with the prior art is realized and thereby the delay penalty due to the indirect access through the short HPIC 21 can be compensated for.

The interconnect line structure of the embodiment (in which a short VPIC 31 makes access to a function cell 10 through a short HPIC 21) has another strongpoint, that is, each short VPILS 121 can make access (not only to function cells 10 of the column it passes through, but also) to function cells 10 of adjacent columns with equivalent delay.

For example, the short VPILS 121-1 shown in FIG. 26 can of course make access to the function cell 10 of the tile 40-3 (through which it passes) through a short HPILS. However, function cells 10 of adjacent tiles 40-2 and 40-4 can also make access to the same short HPILS in the minimum connection, therefore, the function cells 10 of the adjacent tiles 40-2 and 40-4 can make access to the short VPILS 121-1 with the same delay as that of the function cell 10 of the tile 40-3. Meanwhile, each function cell 10 can make access to short VPILS's 121 of its own column and adjacent columns with the same delay, through its nearest short HPILS.

The connection between a function cell 10 and a short VPILS 121 through a nearest short HPILS and an intersection connection only will hereafter be referred to as "minimum connection in a VPIW 30". Short VPILS's 121 to which a function cell 10 can make access by use of the minimum connection will be referred to as "nearest short VPILS's of the function cell 10".

In the example shown in FIG. 26, each short VPIC 31 in each column includes only two lanes, however, each function cell 10 has six nearest short VPILS's 121 (including short VPILS's 121 of adjacent short VPICs 31).

In the reconfigurable device of the embodiment of the present invention, the long VPIC 32 is connected to short VPICs 31 only (through the inter-VPIC connection), therefore, a function cell 10 that makes access to a long VPIC 32 has to use a short HPIC 21 and a short VPIC 31. However, only one inter-VPIC connection is provided to each short VPILS 121, and thus load capacitance on the long VPIC 32 is reduced considerably in comparison with the prior art (in which each long VPIC has direct connections with function cells 10 and the HPIW 20 of each row) and thereby signal transfer speed is increased much.

Therefore, even in the inter-function-cell signal transfer through the long VPIC 32, the reconfigurable device of the embodiment attains higher signal transfer speed than the prior art when the signal transfer distance is long enough.

Further, each function cell 10 in the embodiment is allowed to make access to all the interconnect line resources of the reconfigurable device by use of a small number of programmable switches and compact input/output selection switches. Furthermore, access is possible between any two PICs (programmable interconnect channels) of the reconfigurable device.

As set forth hereinabove, by the reconfigurable device in accordance with the present invention, the following effects can be obtained:

First, high-performance data paths can be implemented on the reconfigurable device efficiently. The programmable interconnect ways having high homogeneity (HPIWs 20) are used for the horizontal direction in which multiple-bit data are mainly transferred. Further, for the vertical direction in which each ALU (Arithmetic and Logic Unit) 110 extends, the programmable interconnect ways suitable for the processing in units of ALUs (VPIWs 30) are used and the number of lines in the vertical direction is set smaller than that in the horizontal direction, thereby the above effect is obtained.

Second, enough connectability can be attained by use of a small number of switches. Each function cell 10 of the reconfigurable device is directly connected to short HPICs (Horizontal Programmable Interconnect Channels) 21 only, and the short VPIC (Vertical Programmable Interconnect Channel) 31 and the long HPIC 22 are designed to make access to a function cell 10 through a small number of programmable switches and a short HPIC 21. The long VPIC 32 is connected to short VPICs 31 through a small number of programmable switches. By such composition, enough connectability is realized with a small number of switches.

Third, high-speed signal transfer is made possible. Only a small number of programmable switches are connected to the long HPIC 22 and the long VPIC 32, therefore, the load on the programmable interconnect channels can be set small and thereby high-speed signal transfer is made possible.

Fourth, the number of long lines of low usage frequency can be reduced. Both the input terminal and the output terminal of each function cell 10 are designed to make access to a long line through a short line, thereby the number of long lines is reduced without deteriorating accessibility and signal transfer speed.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A reconfigurable integrated circuit device comprising a plurality of function cells and a programmable interconnect network which programmably connects said plurality of function cells, wherein:

a plurality of tiles are disposed in a two-dimensional array which extends in a horizontal direction and a vertical direction, and each of said plurality of tiles includes one of said plurality of function cells and part of said programmable interconnect network in the vicinity of the function cell, and each said plurality of function cells includes:

a function block having first input terminals, one or more first output terminals, and functions from which a function is programmably selected and set thereto, for generating an output signal from signals supplied to the first input terminals according to the function which has been set thereto and outputting the generated output signal from the one or more first output terminals;

input selection each of which has second input terminals and a second output terminal, for programmably setting one of the second input terminals to be connected to the second output terminal;

an output selection switch having a third input terminal and third output terminals, for programmably setting each of the third output terminals to be connected to the third input terminal or to be in high impedance status; and input/output lines which are connected to the second input terminals of the input selection switches and the third output terminals of the output selection switch, and said second output terminal is connected to said first input terminal, and said third input terminal is connected to said first output terminal, and the programmable interconnect network includes horizontal programmable interconnect ways each of which runs in the horizontal direction in each row of the two-dimensional array respectively, and the horizontal programmable interconnect way includes a short horizontal programmable interconnect channel and a long horizontal programmable interconnect channel, and the short horizontal programmable interconnect channel includes M short horizontal lanes (M: natural number) each of which includes short horizontal programmable switches which are provided to every M tiles aligned in the horizontal direction and short horizontal interconnect line segments as seamless lines connecting adjacent short horizontal programmable switches, and the horizontal positions of tiles containing the short horizontal programmable switches of each short horizontal lane of the short horizontal programmable interconnect channel are successively shifted between adjacent short horizontal lanes by 1 tile width, and the long horizontal programmable interconnect channel includes M long horizontal lanes each of which includes long horizontal programmable switches which are provided to every N tiles (N: natural number) aligned in the horizontal direction and long horizontal interconnect line segments as seamless lines connecting adjacent long horizontal programmable switches, and the horizontal positions of tiles containing the long horizontal programmable switches of each long horizontal lane of the long horizontal programmable interconnect channel are successively shifted between adjacent long horizontal lanes by P tile widths (P: natural number$\geq$4, P=N/M), and each short horizontal interconnect line segment is connected to one of the long horizontal interconnect line segments through an inter-horizontal-channel programmable switch which is provided to each tile, and long horizontal interconnect line segments to which the inter-horizontal-channel programmable switches of arbitrary M contiguous tiles aligned in the horizontal direction are connected belong to different long horizontal lanes, and each input/output line of the function cell is directly connected to corresponding one of the short horizontal interconnect line segments running in the tile containing the function cell, and each of the programmable switches programmably connects/disconnects the connection between the line segments that are connected thereto.

2. The reconfigurable device as claimed in claim 1, wherein:

each column of the two-dimensional array is divided into ALUs (Arithmetic and Logic Units) each of which is composed of U contiguous tiles (U: natural number) of the column, and the function cells contained in the ALU share at least one of input signals on said first input terminals, signals on said second input terminals and configuration data determining the functions of said function blocks and said input selection switches, and the programmable interconnect network further includes vertical programmable interconnect ways each of which runs in the vertical direction in each column of the two-dimensional array respectively, and the vertical programmable interconnect way includes a short vertical programmable interconnect channel and a long vertical programmable interconnect channel, and the short vertical programmable interconnect channel includes W short vertical lanes (W: natural number<M) each of which includes short vertical programmable switches which are provided to every V tiles (V: integral multiple of U) aligned in the vertical direction and short vertical interconnect line segments as seamless lines connecting adjacent short vertical programmable switches, and at least one of the W short horizontal lanes of the short vertical programmable interconnect channel is composed of short vertical interconnect line segments each of which seamlessly stretches from the uppermost tile to the lowermost tile of an ALU, and the long vertical programmable interconnect channel includes L long vertical lanes (L: natural number$\leq$W) each of which is composed of long vertical interconnect line segments whose lengths are at least 4 times as long as the short vertical interconnect line segment, and each short vertical interconnect line segment is connected to one of the long vertical interconnect line segment through an inter-vertical-channel programmable switch, and each short vertical interconnect line segment is connected to one of the short horizontal interconnect line segments intersecting the short vertical interconnect line segment in each row of the two-dimensional array through an intersection programmable switch.

3. The reconfigurable device as claimed in claim 1, wherein the natural numbers M and P are relatively prime.

4. The reconfigurable device as claimed in claim 2, wherein the natural numbers M and P are relatively prime.

5. A reconfigurable integrated circuit device comprising a plurality of function cells and a programmable interconnect network which programmably connects said plurality of function cells, wherein:

a plurality of tiles are disposed in a two-dimensional array which extends in a horizontal direction and a vertical direction, and each of said plurality of tiles includes one of said plurality of function cells and part of said programmable interconnect network in the vicinity of the function cell, and each said plurality of function cells includes:

a function block having first input terminals, one or more first output terminals, and functions from which a function is programmably selected and set thereto, for generating an output signal from signals supplied to the first input terminals according to the function which has been set thereto and outputting the generated output signal from the one or more first output terminals;

input selection switches each of which has second input terminals and a second output terminal, for programmably setting one of the second input terminals to be connected to the second output terminal;

an output selection switch having a third input terminal and third output terminals, for programmably setting each of the third output terminals to be connected to the third input terminal or to be in high impedance status; and input/output lines which are connected to the second input terminals of the input selection switches and the third output terminals of the output selection switch, and said second output terminal is connected to said first input terminal, and said third input terminal is connected to said first output terminal, and the programmable interconnect network has two or more parallelly running horizontal programmable interconnect ways in each row of the two-dimensional array, and each of the horizontal programmable interconnect ways includes a short horizontal programmable interconnect channel and a long horizontal programmable interconnect channel, and the short horizontal programmable interconnect channel includes M short horizontal lanes (M: natural number) each of which includes short horizontal programmable switches which are provided to every M tiles aligned in the horizontal direction and short horizontal interconnect line segments as seamless lines connecting adjacent short horizontal programmable switches, and the horizontal positions of tiles containing the short horizontal programmable switches of each short horizontal lane of the short horizontal programmable interconnect channel are successively shifted between adjacent short horizontal lanes by 1 tile width, and the long horizontal programmable interconnect channel includes M long horizontal lanes each of which includes long horizontal programmable switches which are provided to every N tiles (N: natural number) aligned in the horizontal direction and long horizontal interconnect line segments as seamless lines connecting adjacent long horizontal programmable switches, and the horizontal positions of tiles containing the long horizontal programmable switches of each long horizontal lane of the long horizontal programmable interconnect channel are successively shifted between adjacent long horizontal lanes by P tile widths (P: natural number≧4, P=N/M), and in each horizontal programmable interconnect way, each short horizontal interconnect line segment is connected to one of the long horizontal interconnect line segments of the horizontal programmable interconnect way through an inter-horizontal-channel programmable switch which is provided to each tile, and long horizontal interconnect line segments to which the inter-horizontal-channel programmable switches of arbitrary M contiguous tiles aligned in the horizontal direction are connected belong to different long horizontal lanes, and each input/output line of the function cell is directly connected to corresponding one of the short horizontal interconnect line segments running in the tile containing the function cell, and each of the programmable switches programmably connects/disconnects the connection between the line segments that are connected thereto.

6. The reconfigurable device as claimed in claim 5, wherein:

each column of the two-dimensional array is divided into ALUs (Arithmetic and Logic Units) each of which is composed of U contiguous tiles (U: natural number) of the column, and the function cells contained in the ALU share at least one of input signals on said first input terminals, signals on said second input terminals and configuration data determining the functions of said function blocks and said input selection switches, and the programmable interconnect network further includes vertical programmable interconnect ways each of which runs in the vertical direction in each column of the two-dimensional array respectively, and the vertical programmable interconnect way includes a short vertical programmable interconnect channel and a long vertical programmable interconnect channel, and the short vertical programmable interconnect channel includes W short vertical lanes (W: natural number<M) each of which includes short vertical programmable switches which are provided to every V tiles (V: integral multiple of U) aligned in the vertical direction and short vertical interconnect line segments as seamless lines connecting adjacent short vertical programmable switches, and at least one of the W short horizontal lanes of the short vertical programmable interconnect channel is composed of short vertical interconnect line segments each of which seamlessly stretches from the uppermost tile to the lowermost tile of an ALU, and the long vertical programmable interconnect channel includes L long vertical lanes (L: natural number≦W) each of which is composed of long vertical interconnect line segments whose lengths are at least 4 times as long as the short vertical interconnect line segment, and each short vertical interconnect line segment is connected to one of the long vertical interconnect line segment through an inter-vertical-channel programmable switch, and each short vertical interconnect line segment is connected to one of the short horizontal interconnect line segments intersecting the short vertical interconnect line segment in each row of the two-dimensional array through an intersection programmable switch, and intersection programmable switches that are contained in the same tile is connected to different short horizontal interconnect line segments.

7. The reconfigurable device as claimed in claim 5, wherein the natural numbers M and P are relatively prime.

8. The reconfigurable device as claimed in claim 6, wherein the natural numbers M and P are relatively prime.

9. The reconfigurable device as claimed in claim 5, wherein the horizontal positions of the long horizontal programmable switches in each horizontal programmable interconnect way are shifted between at least two of the two or more horizontal programmable interconnect ways parallelly running in each row of the two-dimensional array by a tile width or more.

10. The reconfigurable device as claimed in claim 6, wherein the horizontal positions of the long horizontal programmable switches in each horizontal programmable interconnect way are shifted between at least two of the two or more horizontal programmable interconnect ways parallelly running in each row of the two-dimensional array by a tile width or more.

11. The reconfigurable device as claimed in claim 9, wherein the natural numbers M and P are relatively prime.

12. The reconfigurable device as claimed in claim 10, wherein the natural numbers M and P are relatively prime.

13. The reconfigurable device as claimed in claim 5, wherein the horizontal positions of the long horizontal programmable switches in each horizontal programmable interconnect way are successively shifted between adjacent ones of the two or more horizontal programmable interconnect ways parallelly running in each row of the two-dimensional array by a tile width or more.

14. The reconfigurable device as claimed in claim 6, wherein the horizontal positions of the long horizontal programmable switches in each horizontal programmable interconnect way are successively shifted between adjacent ones of the two or more horizontal programmable interconnect ways parallelly running in each row of the two-dimensional array by a tile width or more.

15. The reconfigurable device as claimed in claim 13, wherein the natural numbers M and P are relatively prime.

16. The reconfigurable device as claimed in claim 14, wherein the natural numbers M and P are relatively prime.

17. A reconfigurable integrated circuit device comprising a plurality of function cells and a programmable interconnect network which programmably connects said plurality of function cells, wherein:

a plurality of tiles are disposed in a two-dimensional array which extends in a horizontal direction and a vertical direction, and each of said plurality of tiles includes one of said plurality of function cells and part of said programmable interconnect network in the vicinity of the function cell, and each said plurality of function cells includes:
a function block having first input terminals, one or more first output terminals, and functions from which a function is programmably selected and set thereto, for generating an output signal from signals supplied to the first input terminals according to the function which has been set thereto and outputting the generated output signal from the one or more first output terminals;

input selection switches each of which has second input terminals and a second output terminal, for programmably setting one of the second input terminals to be connected to the second output terminal;

an output selection switch having a third input terminal and third output terminals, for programmably setting each of the third output terminals to be connected to the third input terminal or to be in high impedance status; and input/output lines which are connected to the second input terminals of the input selection switches and the third output terminals of the output selection switch, and said second output terminal is connected to said first input terminal, and said third input terminal is connected to said first output terminal, and the programmable interconnect network has two or more parallelly running horizontal programmable interconnect ways in each row of the two-dimensional array, and each of the horizontal programmable interconnect ways includes a short horizontal programmable interconnect channel, and each of part of the horizontal programmable interconnect ways further includes a long horizontal programmable interconnect channel, and the short horizontal programmable interconnect channel includes M short horizontal lanes (M: natural number) each of which includes short horizontal programmable switches which are provided to every M tiles aligned in the horizontal direction and short horizontal interconnect line segments as seamless lines connecting adjacent short horizontal programmable switches, and the horizontal positions of tiles containing the short horizontal programmable switches of each short horizontal lane of the short horizontal programmable interconnect channel are successively shifted between adjacent short horizontal lanes by 1 tile width, and the long horizontal programmable interconnect channel includes M long horizontal lanes each of which includes long horizontal programmable switches which are provided to every N tiles (N: natural number) aligned in the horizontal direction and long horizontal interconnect line segments as seamless lines connecting adjacent long horizontal programmable switches, and the horizontal positions of tiles containing the long horizontal programmable switches of each long horizontal lane of the long horizontal programmable interconnect channel are successively shifted between adjacent long horizontal lanes by P tile widths (P: natural number$\geq$4, P=N/M), and in each horizontal programmable interconnect way that includes a long horizontal programmable interconnect channel, each short horizontal interconnect line segment is connected to one of the long horizontal interconnect line segments of the horizontal programmable interconnect way through an inter-horizontal-channel programmable switch which is provided to each tile, and long horizontal interconnect line segments to which the inter-horizontal-channel programmable switches of arbitrary M contiguous tiles aligned in the horizontal direction are connected belong to different long horizontal lanes, and each input/output line of the function cell is directly connected to corresponding one of the short horizontal interconnect line segments running in the tile containing the function cell, and each of the programmable switches programmably connects/disconnects the connection between the line segments that are connected thereto.

18. The reconfigurable device as claimed in claim 17, wherein:

each column of the two-dimensional array is divided into ALUs (Arithmetic and Logic Units) each of which is composed of U contiguous tiles (U: natural number) of the column, and the function cells contained in the ALU share at least one of input signals on said first input terminals, signals on said second input terminals and configuration data determining the functions of said function blocks and said input selection switches, and the programmable interconnect network further includes vertical programmable interconnect ways each of which runs in the vertical direction in each column of the two-dimensional array respectively, and the vertical programmable interconnect way includes a short vertical programmable interconnect channel and a long vertical programmable interconnect channel, and the short vertical programmable interconnect channel includes W short vertical lanes (W: natural number<M) each of which includes short vertical programmable switches which are provided to every V tiles (V: integral multiple of U) aligned in the vertical direction and short vertical interconnect line segments as seamless lines connecting adjacent short vertical programmable switches, and at least one of the W short horizontal lanes of the short vertical programmable interconnect channel is composed of short vertical interconnect line segments each of which seamlessly stretches from the uppermost tile to the lowermost tile of an ALU, and the long vertical programmable interconnect channel includes L long vertical lanes (L: natural number≦W) each of which is composed of long vertical interconnect line segments whose lengths are at least 4 times as long as the short vertical interconnect line segment, and each short vertical interconnect line segment is connected to one of the long vertical interconnect line segment through an inter-vertical-channel programmable switch, and each short vertical interconnect line segment is connected to one of the short horizontal interconnect line segments intersecting the short vertical interconnect line segment in each row of the two-dimensional array through an intersection programmable switch, and intersection programmable switches that are contained in the same tile is connected to different short horizontal interconnect line segments.

19. The reconfigurable device as claimed in claim 17, wherein the natural numbers M and P are relatively prime.

20. The reconfigurable device as claimed in claim 18, wherein the natural numbers M and P are relatively prime.

21. The reconfigurable device as claimed in claim 17, wherein in at least one horizontal programmable interconnect way that includes no long horizontal programmable interconnect channel, each short horizontal interconnect line segment is connected to a long horizontal interconnect line segment of a horizontal programmable interconnect way that includes a long horizontal programmable interconnect channel through an inter-horizontal-channel programmable switch which is provided to each tile, and long horizontal interconnect line segments to which the inter-horizontal-channel programmable switches of arbitrary M contiguous tiles aligned in the horizontal direction are connected belong to different long horizontal lanes.

22. The reconfigurable device as claimed in claim 18, wherein in at least one horizontal programmable interconnect way that includes no long horizontal programmable interconnect channel, each short horizontal interconnect line segment is connected to a long horizontal interconnect line segment of a horizontal programmable interconnect way that includes a long horizontal programmable interconnect channel through an inter-horizontal-channel programmable switch which is provided to each tile, and long horizontal interconnect line segments to which the inter-horizontal-channel programmable switches of arbitrary M contiguous tiles aligned in the horizontal direction are connected belong to different long horizontal lanes.

23. The reconfigurable device as claimed in claim 21, wherein the natural numbers M and P are relatively prime.

24. The reconfigurable device as claimed in claim 22, wherein the natural numbers M and P are relatively prime.

25. A reconfigurable integrated circuit device comprising a plurality of function cells and a programmable interconnect network which programmably connects said plurality of function cells, wherein:

a plurality of tiles are disposed in a two-dimensional array which extends in a horizontal direction and a vertical direction, and each of said plurality of tiles includes one of said plurality of function cells and part of said programmable interconnect network in the vicinity of the function cell, and each said plurality of function cells includes:

a function block having first input terminals, one or more first output terminals, and functions from which a function is programmably selected and set thereto, for generating an output signal from signals supplied to the first input terminals according to the function which has been set thereto and outputting the generated output signal from the one or more first output terminals;

input selection switches each of which has second input terminals and a second output terminal, for programmably setting one of the second input terminals to be connected to the second output terminal;

an output selection switch having a third input terminal and third output terminals, for programmably setting each of the third output terminals to be connected to the third input terminal or to be in high impedance status; and input/output lines which are connected to the second input terminals of the input selection switches and the third output terminals of the output selection switch, and said second output terminal is connected to said first input terminal, and said third input terminal is connected to said first output terminal, and the programmable interconnect network has J parallelly running horizontal programmable interconnect ways (J: natural number) in each row of the two-dimensional array, and each of the J horizontal programmable interconnect ways includes a short horizontal programmable interconnect channel, and each of K horizontal programmable interconnect ways (K: natural number≦J) selected out of the J horizontal programmable interconnect ways further includes a long horizontal programmable interconnect channel, and in each j-th horizontal programmable interconnect way (j: natural number≦J) included in the J horizontal programmable interconnect ways, the short horizontal programmable interconnect channel includes Mj short horizontal lanes (Mj: natural number) each of which includes short horizontal programmable switches which are provided to every Mj tiles aligned in the horizontal direction and short horizontal interconnect line segments as seamless lines connecting adjacent short horizontal programmable switches, and the horizontal positions of tiles containing the short horizontal programmable switches of each short horizontal lane are successively shifted between adjacent short horizontal lanes by 1 tile width, and in each k-th horizontal programmable interconnect way (k: natural number≦K) included in the K horizontal programmable interconnect ways, the long horizontal programmable interconnect channel includes Mk long horizontal lanes (Mk: natural number) each of which includes long horizontal programmable switches which are provided to every Nk tiles (Nk: natural number) aligned in the horizontal direction and long horizontal interconnect line segments as seamless lines connecting adjacent long horizontal programmable switches, and the horizontal positions of tiles containing the long horizontal programmable switches of each long horizontal lane of the long horizontal programmable interconnect channel are successively shifted between adjacent long horizontal lanes by Pk tile widths (Pk: natural number≧4, Pk=Nk/Mk), and at least two selected from the natural numbers Pk (k≦K) are set to be different from each other, or at least two selected from the natural numbers Mk (k≦K) are set to be different from each other, and in each k-th horizontal programmable interconnect way (k≦K) included in the K horizontal programmable interconnect ways, each short horizontal interconnect line segment is connected to one of the long horizontal interconnect line segments of the k-th horizontal programmable interconnect way through an inter-horizontal-channel programmable switch which is provided to each tile, and long horizontal interconnect line segments to which the inter-horizontal-channel programmable switches of arbitrary Mk contiguous tiles aligned in the horizontal direction are connected belong to different long horizontal lanes, and each input/output line of the function cell is directly connected to corresponding one of the short horizontal interconnect line segments running in the tile containing the function cell, and each of the programmable switches programmably connects/disconnects the connection between the line segments that are connected thereto.

26. The reconfigurable device as claimed in claim 25, wherein:

each column of the two-dimensional array is divided into ALUs (Arithmetic and Logic Units) each of which is composed of U contiguous tiles (U: natural number) of the column, and the function cells contained in the ALU share at least one of input signals on said first input terminals, signals on said second input terminals and configuration data determining the functions of said function blocks and said input selection switches, and the programmable interconnect network further includes vertical programmable interconnect ways each of which runs in the vertical direction in each column of the two-dimensional array respectively, and the vertical programmable interconnect way includes a short vertical programmable interconnect channel and a long vertical programmable interconnect channel, and the short vertical programmable interconnect channel includes W short vertical lanes (W: natural number<Min (Mk)) each of which includes short vertical programmable switches which are provided to every V tiles (V: integral multiple of U) aligned in the vertical direction and short vertical interconnect line segments as seamless lines connecting adjacent short vertical programmable switches, and at least one of the W short horizontal lanes of the short vertical programmable interconnect channel is composed of short vertical interconnect line segments each of which seamlessly stretches from the uppermost tile to the lowermost tile of an ALU, and the long vertical programmable interconnect channel includes L long vertical lanes (L: natural number≦W) each of which is composed of long vertical interconnect line segments whose lengths are at least 4 times as long as the short vertical interconnect line segment, and each short vertical interconnect line segment is connected to one of the long vertical interconnect line segments through an inter-vertical-channel programmable switch, and each short vertical interconnect line segment is connected to one of the short horizontal interconnect line segments intersecting the short vertical interconnect line segment in each row of the two-dimensional array through an intersection programmable switch, and intersection programmable switches that are contained in the same tile is connected to different short horizontal interconnect line segments.

27. The reconfigurable device as claimed in claim 25, wherein the natural numbers Mk and Pk are relatively prime in at least one horizontal programmable interconnect way included in the K horizontal programmable interconnect ways.

28. The reconfigurable device as claimed in claim 26, wherein the natural numbers Mk and Pk are relatively prime in at least one horizontal programmable interconnect way included in the K horizontal programmable interconnect ways.

29. The reconfigurable device as claimed in claim 25, wherein in at least one horizontal programmable interconnect way that is not included in the K horizontal programmable interconnect ways, each short horizontal interconnect line segment is connected to a long horizontal interconnect line segment of a k-th horizontal programmable interconnect way that is included in the K horizontal programmable interconnect ways through an inter-horizontal-channel programmable switch, and long horizontal interconnect line segments to which the inter-horizontal-channel programmable switches of arbitrary Mk contiguous tiles aligned in the horizontal direction are connected belong to different long horizontal lanes.

30. The reconfigurable device as claimed in claim 26, wherein in at least one horizontal programmable interconnect way that is not included in the K horizontal programmable interconnect ways, each short horizontal interconnect line segment is connected to a long horizontal interconnect line segment of a k-th horizontal programmable interconnect way that is included in the K horizontal programmable interconnect ways through an inter-horizontal-channel programmable switch, and long horizontal interconnect line segments to which the inter-horizontal-channel programmable switches of arbitrary Mk contiguous tiles aligned in the horizontal direction are connected belong to different long horizontal lanes.

31. The reconfigurable device as claimed in claim 29, wherein the natural numbers Mk and Pk are relatively prime in at least one horizontal programmable interconnect way included in the K horizontal programmable interconnect ways.

32. The reconfigurable device as claimed in claim 30, wherein the natural numbers Mk and Pk are relatively prime in at least one horizontal programmable interconnect way included in the K horizontal programmable interconnect ways.

* * * * *